(12) United States Patent
Fujita

(10) Patent No.: US 9,355,687 B2
(45) Date of Patent: May 31, 2016

(54) STORAGE CIRCUIT

(71) Applicant: Semiconductor Energy Laboratory Co., Ltd., Atsugi-shi, Kanagawa-ken (JP)

(72) Inventor: Masashi Fujita, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/306,310

(22) Filed: Jun. 17, 2014

(65) Prior Publication Data

US 2014/0362631 A1 Dec. 11, 2014

Related U.S. Application Data

(63) Continuation of application No. 13/412,250, filed on Mar. 5, 2012, now Pat. No. 8,760,903.

(30) Foreign Application Priority Data

Mar. 11, 2011 (JP) .................................. 2011-053654
May 14, 2011 (JP) .................................. 2011-108906

(51) Int. Cl.
*G11C 11/42* (2006.01)
*G11C 5/14* (2006.01)
(Continued)

(52) U.S. Cl.
CPC .. *G11C 5/14* (2013.01); *G11C 5/06* (2013.01); *G11C 14/00* (2013.01); *G11C 14/0054* (2013.01); *G11C 29/50004* (2013.01)

(58) Field of Classification Search
USPC .......................................................... 365/65
See application file for complete search history.

(56) References Cited

U.S. PATENT DOCUMENTS 5,218,607 A * 6/1993 Saito ........................ G06F 1/30
365/228
5,731,856 A 3/1998 Kim et al.
(Continued)

FOREIGN PATENT DOCUMENTS

EP 0404061 A 12/1990
EP 0818891 A 1/1998
(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.
(Continued)

*Primary Examiner* — Anthan Tran
(74) *Attorney, Agent, or Firm* — Fish & Richardson P.C.

(57) ABSTRACT

A storage circuit includes a volatile storage portion in which storage of a data signal is controlled by a clock signal and an inverted clock signal, and a nonvolatile storage portion in which a data signal supplied to the volatile storage portion can be held even after supply of power supply voltage is stopped. A wiring which supplies a power supply voltage and is connected to a protective circuit provided for a wiring for supplying the clock signal is provided separately from a wiring which supplies a power supply voltage and which is connected to the storage circuit. The timing of stop and restart of supply of the power supply voltage supplied to the wiring which is connected to the protective circuit is different from that of stop and restart of supply of the power supply voltage supplied to the wiring which is connected to the storage circuit.

9 Claims, 31 Drawing Sheets

(51) Int. Cl.
*G11C 14/00* (2006.01)
*G11C 29/50* (2006.01)
*G11C 5/06* (2006.01)

(56) References Cited

U.S. PATENT DOCUMENTS

| | | | |
|---|---|---|---|
| 5,744,864 A | 4/1998 | Cillessen et al. |
| 5,936,879 A | 8/1999 | Brouwer et al. |
| 6,046,606 A | 4/2000 | Chu et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,389,437 B2 | 6/2008 | Hashidate |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,115,201 B2 | 2/2012 | Yamazaki et al. |
| 8,362,478 B2 | 1/2013 | Yamazaki et al. |
| 8,575,985 B2 | 11/2013 | Ohmaru et al. |
| 8,872,171 B2 | 10/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0158771 A1* | 8/2004 | Garnett .................. G06F 1/263 714/14 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0273820 A1 | 12/2006 | Arnold et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0124094 A1* | 5/2010 | Kimura .................. G11C 11/22 365/145 |
| 2010/0252832 A1 | 10/2010 | Asano et al. |
| 2011/0141098 A1* | 6/2011 | Yaguma ............... G09G 3/3688 345/212 |
| 2012/0132910 A1 | 5/2012 | Yamazaki et al. |
| 2015/0048363 A1 | 2/2015 | Yamazaki et al. |

FOREIGN PATENT DOCUMENTS

| | | |
|---|---|---|
| EP | 0936546 A | 8/1999 |
| EP | 1737044 A | 12/2006 |
| EP | 2226847 A | 9/2010 |
| EP | 2256814 A | 12/2010 |
| JP | 58-205226 A | 11/1983 |
| JP | 60-198861 A | 10/1985 |
| JP | 62-177794 A | 8/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-027419 A | 2/1991 |
| JP | 05-110392 A | 4/1993 |
| JP | 05-251705 A | 9/1993 |
| JP | 08-264794 A | 10/1996 |
| JP | 10-078836 A | 3/1998 |
| JP | 10-093423 A | 4/1998 |
| JP | 11-505377 | 5/1999 |
| JP | 11-261406 A | 9/1999 |
| JP | 2000-044236 A | 2/2000 |
| JP | 2000-077982 A | 3/2000 |
| JP | 2000077982 A | 3/2000 |
| JP | 2000-150900 A | 5/2000 |
| JP | 2001-044295 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| JP | 2006-050208 A | 2/2006 |
|---|---|---|
| JP | 2006-074644 A | 3/2006 |
| JP | 2007-194594 A | 8/2007 |
| JP | 2010-011226 A | 1/2010 |
| JP | 2010-062229 A | 3/2010 |
| JP | 2010-062546 A | 3/2010 |
| JP | 2010-124290 A | 6/2010 |
| JP | 2010-258434 A | 11/2010 |
| JP | 2010-267955 A | 11/2010 |
| JP | 2011-009719 A | 1/2011 |
| WO | WO-2004/114391 | 12/2004 |

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using Castep", Zeitschrift fur Kristallographie, 2005, vol. 220, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In—Ga—Zn-13 Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000 ° C", Journal of solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06: Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09: SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physiacl Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 16A    FIG. 16B
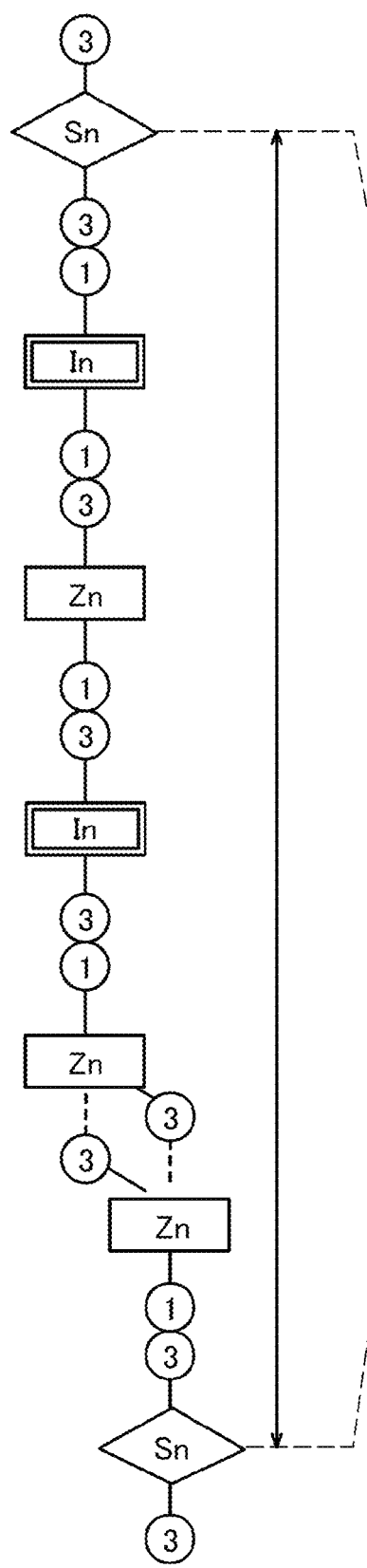
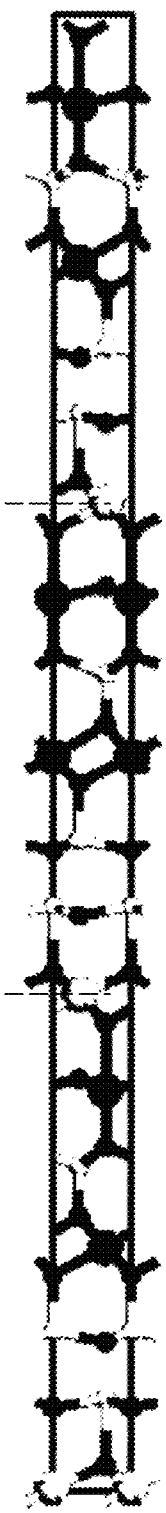
FIG. 16C
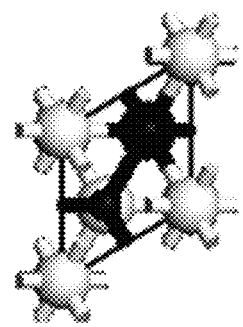
- ● In
- ☾ Sn
- ⌣ Zn
- ● O FIG. 17A
FIG. 17B
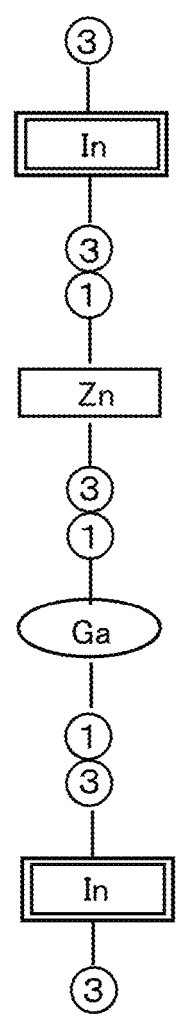
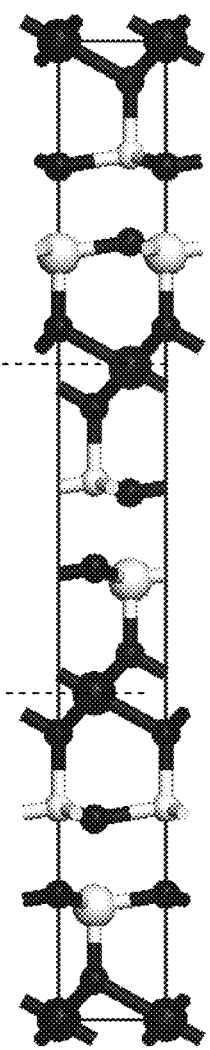
FIG. 17C
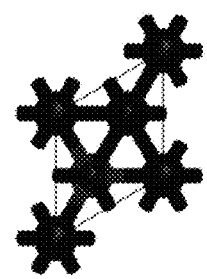
- ● In
- ● Ga
- ● Zn
- ● O

STORAGE CIRCUIT

CROSS-REFERENCE TO RELATED APPLICATIONS

This application is a continuation of U.S. application Ser. No. 13/412,250, filed on Mar. 5, 2012, now allowed, which claims the benefit of a foreign priority applications filed in Japan as Serial No. 2011-053654 on Mar. 11, 2011 and Serial No. 2011-108906 on May 14, 2011, all of which are incorporated by reference.

BACKGROUND OF THE INVENTION

1. Field of the Invention

The present invention relates to a storage circuit of a signal processing unit which can keep a stored logic state even when power is off.

2. Description of the Related Art

A signal processing unit such as a central processing unit (CPU) has a variety of configurations depending on its application. A signal processing unit generally has some kinds of storage circuits such as a register and a cache memory as well as a main memory for storing data or a program. A register has a function of temporarily holding a data signal for carrying out arithmetic processing, holding a program execution state, or the like. In addition, a cache memory is located between an arithmetic unit and a main memory in order to reduce low-speed access to the main memory and speed up the arithmetic processing.

In a storage circuit, such as a register or a cache memory, of a signal processing unit, writing of a data signal needs to be performed at higher speed than in a main memory. In general, a flip-flop, a static random access memory (SRAM), or the like is used as a register or a cache memory. That is, a volatile storage circuit in which a data signal is erased when supply of power supply voltage is stopped is used for such a register, a cache memory, or the like.

In order to reduce power consumption, a method for temporarily stopping supply of a power supply voltage to a signal processing unit in a period during which a data signal is not input and output has been suggested (for example, see Patent Document 1). In the method disclosed in Patent Document 1, a nonvolatile storage circuit is located in the periphery of a volatile storage circuit, so that the data signal is temporarily stored in the nonvolatile storage circuit.

REFERENCE

Patent Document

[Patent Document 1] Japanese Published Patent Application No. 2010-124290

SUMMARY OF THE INVENTION

In the structure described in Patent Document 1, a data signal of a volatile storage circuit is stored in a nonvolatile storage circuit located in the periphery of the volatile storage circuit while supply of power supply voltage is stopped in a signal processing unit. In the nonvolatile storage circuit, a storage element including a ferroelectric is used.

In general, a protective circuit is provided on an input terminal side in a storage circuit in many cases. The protective circuit is provided in order to prevent high voltage due to static electricity from causing electrostatic discharge (ESD) of an element such as a transistor inside the storage circuit. The protective circuit is formed using, for example, a protective diode of a diode-connected transistor. Only when high voltage due to static electricity or the like or low voltage is applied to a wiring for supplying a clock signal and/or a wiring for supplying a data signal, the protective circuit allows discharge of static electricity into a wiring for supplying a high power supply potential and a wiring for supplying a low power supply potential (wiring for supplying power supply voltage). In a normal state where power supply voltage is supplied to the wiring for supplying the power supply voltage, since current does not flow from the wiring for supplying the clock signal and/or the wiring for supplying the data signal to the wiring for supplying the power supply voltage through the protective circuit, normal operation is performed.

In order to reduce power consumption of the storage circuit, in the storage circuit in which supply of the power supply voltage is stopped, at the time of stopping the supply of the power supply voltage, supply of the power supply voltage to the wiring for supplying the power supply voltage is stopped before supply of the clock signal to the wiring for supplying the clock signal is stopped. Further, in order to reduce power consumption of the storage circuit, in the storage circuit in which supply of the power supply voltage is stopped, at the time of restarting the supply of the power supply voltage, supply of the power supply voltage to the wiring for supplying the power supply voltage is restarted after supply of the clock signal to the wiring for supplying the clock signal is restarted.

The above operation is performed in this order in order to prevent malfunction of the storage circuit due to the clock signal. For example, at the time of restarting the supply of the power supply voltage, in the case where the supply of the power supply voltage is restarted before the supply of the clock signal is restarted, a circuit such as an analog switch in the storage circuit, which operates with the clock signal, determines an output signal with the supply of the power supply voltage. Therefore, malfunction occurs, for example, a data signal to be held in the storage circuit is rewritten, which is not preferable. Accordingly, as in the above order, it is preferable that supply of the power supply voltage be restarted after supply of the clock signal is restarted, whereby the conductive state of the analog switch is determined before the supply of the power supply voltage is performed.

However, in the structure of the storage circuit in which the supply of the power supply voltage is stopped and restarted in the above order, a period arises during which the power supply voltage is not supplied to the wiring that supplies the power supply voltage for discharge and that is connected to the protective circuit. Therefore, in the structure of the storage circuit, current flows from the wiring for supplying the clock signal to the wiring for supplying the power supply voltage, leading to an increase in power consumption of an external device supplying a signal to the signal processing unit.

In view of the foregoing problems, an object of one embodiment of the present invention is to provide a storage circuit of a signal processing unit, with which power consumption of an external device supplying a signal to the signal processing unit can be reduced. In the storage circuit, stop and restart of supply of power supply voltage are performed, and a protective circuit is provided.

One embodiment of the present invention includes a volatile storage portion in which storage of a data signal is controlled by a clock signal and an inverted clock signal, and a nonvolatile storage portion in which a data signal supplied to the volatile storage portion can be held even after supply of power supply voltage is stopped. A wiring which supplies a power supply voltage and is connected to a protective circuit provided for a wiring for supplying the clock signal is provided separately from a wiring which supplies a power supply voltage and which is connected to a storage circuit. The timing of stop and restart of supply of the power supply voltage to the wiring which is connected to the protective circuit is different from that of stop and restart of supply of the power supply voltage to the wiring which is connected to the storage circuit. An inverter circuit inverting the phase of the clock signal and generating the inverted clock signal thereof uses, as a power supply voltage for driving the inverter circuit, a power supply voltage equivalent to the power supply voltage supplied to the wiring which is connected to the protective circuit. This power supply voltage is different from the power supply voltage supplied to the wiring which is connected to the storage circuit.

One embodiment of the present invention is a storage circuit of a signal processing unit, the storage circuit including a volatile storage portion which is electrically connected to a wiring for supplying a first power supply voltage, a wiring for supplying a clock signal, and a wiring for supplying a data signal, and in which holding of the data signal is controlled by the clock signal and an inverted clock signal generated from the clock signal in an inverter circuit; and a nonvolatile storage portion which is electrically connected to the wiring for supplying the first power supply voltage, and in which the data signal held in the volatile storage portion is held in response to stop of supply of the first power supply voltage. A protective circuit is provided for each of the wiring for supplying the clock signal and the wiring for supplying the data signal. The protective circuit and the inverter circuit are electrically connected to a wiring for supplying a second power supply voltage.

Another embodiment of the present invention is a storage circuit of a signal processing unit, the storage circuit including a volatile storage portion which is electrically connected to a wiring for supplying a first power supply voltage, a wiring for supplying a clock signal, and a wiring for supplying a data signal, and in which holding of the data signal is controlled by the clock signal and an inverted clock signal generated from the clock signal in an inverter circuit; and a nonvolatile storage portion which is electrically connected to the wiring for supplying the first power supply voltage, a wiring for supplying a first control signal, and a wiring for supplying a second control signal, and in which the data signal held in the volatile storage portion is saved by the first control signal in response to stop of supply of the first power supply voltage, and the held data signal is returned to the volatile storage portion by the second control signal. As circuits for controlling holding of the data signal, an analog switch, an inverter circuit, and a clocked inverter circuit are provided in the volatile storage portion. A protective circuit is provided for each of the wiring for supplying the clock signal, the wiring for supplying the data signal, the wiring for supplying the first control signal, and the wiring for supplying the second control signal. The protective circuit and the inverter circuit are electrically connected to a wiring for supplying a second power supply voltage.

In the storage circuit of the signal processing unit, according to one embodiment of the present invention, the protective circuit is preferably a diode-connected transistor.

In the storage circuit of the signal processing unit, according to one embodiment of the present invention, the data signal is preferably a first data signal supplied from the wiring for supplying the data signal or a second data signal supplied from the nonvolatile storage portion.

In the storage circuit of the signal processing unit, according to one embodiment of the present invention, the volatile storage portion preferably includes a selector circuit for selecting the first data signal or the second data signal to be held as a data signal of the volatile storage portion.

In the storage circuit of the signal processing unit, according to one embodiment of the present invention, the nonvolatile storage portion is preferably a ferroelectric random access memory, a magnetoresistive random access memory, or a phase change random access memory.

In the storage circuit of the signal processing unit, according to one embodiment of the present invention, the nonvolatile storage portion preferably includes a first transistor in which a channel is formed in an oxide semiconductor layer and a second transistor whose gate is electrically connected to one of a source and a drain of the first transistor, and the data signal is preferably held between the one of the source and the drain of the first transistor and the gate of the second transistor.

According to one embodiment of the present invention, a storage circuit of a signal processing unit can be provided, with which power consumption of an external device supplying a signal to the signal processing unit can be reduced. In the storage circuit, stop and restart of supply of power supply voltage are performed, and a protective circuit is provided.

BRIEF DESCRIPTION OF THE DRAWINGS

FIGS. 16A to 16C illustrate a structure of an oxide material.
FIGS. 17A to 17C illustrate a structure of an oxide material.

DETAILED DESCRIPTION OF THE INVENTION

Figure 1:
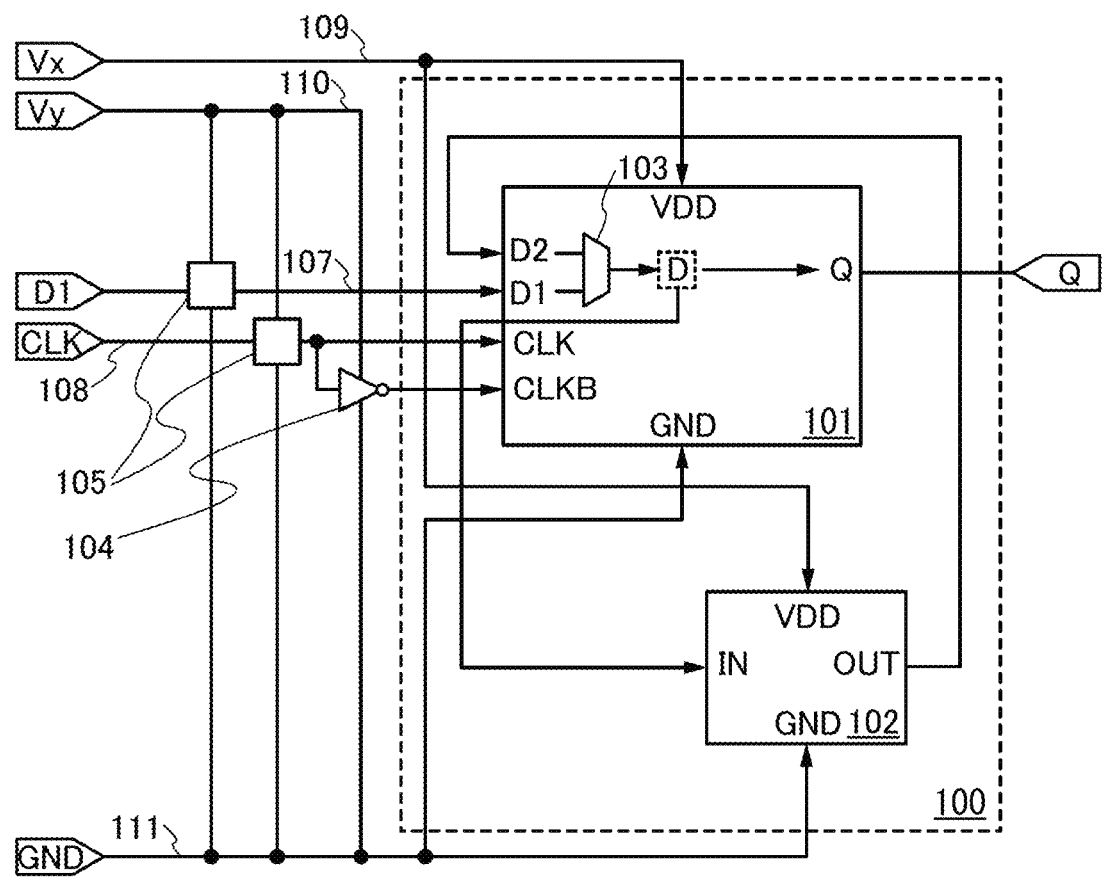
FIG. 1 is a block diagram of a storage circuit.

Hereinafter, embodiments and an example of the present invention will be described with reference to the accompanying drawings. Note that the present invention can be carried out in many different modes, and it is easily understood by those skilled in the art that various changes and modifications can be made without departing from the spirit and scope of the present invention. Therefore, the present invention should not be interpreted as being limited to the description in the following embodiments and example. Note that in structures of the present invention described below, reference numerals denoting the same portions are used in common in different drawings.

Note that the size, the thickness of a layer, signal waveform, and a region in structures illustrated in the drawings and the like in the embodiments are exaggerated for simplicity in some cases. Therefore, the scale is not necessarily limited to that illustrated in the drawings and the like.

Note that when it is explicitly described that "A and B are connected," the case where A and B are electrically connected, the case where A and B are functionally connected, and the case where A and B are directly connected are included therein.

Note that in this specification, the terms "first", "second", "third", and "N-th" (N is a natural number) are used in order to avoid confusion between components and thus do not limit the number of the components.

Embodiment 1

A signal processing unit includes a storage circuit. With one or more storage circuits, a one-bit or multi-bit data signal can be stored. In this embodiment, a configuration of a storage circuit in a signal processing unit will be described.

Note that the signal processing unit includes, in its category, a CPU, a large scale integrated circuit (LSI) such as a microprocessor, an image processing circuit, a digital signal processor (DSP), or a field programmable gate array (FPGA), and the like.

FIG. 1 is an example of a block diagram of a storage circuit. A storage circuit 100 illustrated in FIG. 1 is broadly divided into two portions: a volatile storage portion 101 and a nonvolatile storage portion 102. The volatile storage portion 101 includes a selector circuit 103 which selects a first data signal D1 or a second data signal D2 to be input to the volatile storage portion 101.

The volatile storage portion 101 includes, for example, a clock synchronization flip-flop circuit. Note that the flip-flop circuit in the volatile storage portion 101 may be another type of flip-flop circuit. The volatile storage portion 101 holds a data signal D only in a period during which power supply voltage is supplied from a first power supply voltage terminal Vx.

In FIG. 1, signals input to the volatile storage portion 101 are illustrated. FIG. 1 illustrates the first power supply voltage terminal Vx for mainly supplying a high power supply potential VDD, a ground line GND for supplying a low power supply potential VSS, and terminals into which the first data signal D1, the second data signal D2, a clock signal CLK, and an inverted clock signal CLKB which is a signal whose phase is inverted from that of the clock signal CLK are input. Note that the volatile storage portion 101 may also be supplied with a control signal such as a reset signal.

The selector circuit 103 included in the volatile storage portion 101 selects the first data signal D1 or the second data signal D2 so that the volatile storage portion 101 holds the data signal D. Specifically, the selector circuit 103 may select the first data signal D1 when the volatile storage portion 101 performs operation (normal operation) by supply of the power supply voltage from the first power supply voltage terminal Vx, and may select the second data signal D2 when supply of the power supply voltage from the first power supply voltage terminal Vx restarts after the supply of the power supply voltage from the first power supply voltage terminal Vx is stopped; in such a manner, the volatile storage portion 101 holds the data signal D.

Note that in this specification, stop of supply of a signal or a power supply voltage means that supply of the signal or the power supply voltage to a wiring for supplying the signal or the power supply voltage is not performed. Note also that in this specification, restart of supply of a signal or a power supply voltage means that supply of the signal or the power supply voltage to a wiring for supplying the signal or the power supply voltage is restarted from a state where the supply of the signal or the power supply voltage has been stopped. Note also that in this specification, fixing of a signal means that, for example, an AC signal oscillated with a predetermined frequency is converted into a DC signal having a fixed potential such as a high power supply potential VDD or a low power supply potential VSS.

In FIG. 1, a signal output from the volatile storage portion 101, specifically an output signal Q, is illustrated. FIG. 1 shows that the data signal D input to the volatile storage portion 101 is to be output to the nonvolatile storage portion 102.

In FIG. 1, signals input to the nonvolatile storage portion 102 are illustrated. FIG. 1 illustrates the first power supply voltage terminal Vx for mainly supplying the high power supply potential VDD, the ground line GND for supplying the low power supply potential VSS, and an input terminal IN to which the data signal D is input from the volatile storage portion 101. Note that the volatile storage portion 101 may also be supplied with a control signal for controlling writing of the data signal D to the nonvolatile storage portion 102 or a control signal for controlling reading of the data signal D.

As a storage element in the nonvolatile storage portion 102, a ferroelectric random access memory (FeRAM), a magnetoresistive random access memory (MRAM), or a phase change random access memory (PRAM) may be used as well as a flash memory. In particular, a storage element holding electric charge with the use of a transistor in which a channel is formed in an oxide semiconductor layer is favorable as the storage element used in the nonvolatile storage portion 102.

With the use of a transistor in which a channel is formed in an oxide semiconductor layer for the nonvolatile storage portion 102, the nonvolatile storage portion 102 can be manufactured through a manufacturing process of the transistor; thus, cost for manufacturing the storage circuit can be reduced.

In FIG. 1, a signal output from the nonvolatile storage portion 102 is illustrated. FIG. 1 shows that a signal output from the output terminal OUT is to be the second data signal D2 supplied to the nonvolatile storage portion 101.

FIG. 1 shows a wiring 107 for supplying the first data signal D1 to the volatile storage portion 101, a wiring 108 for supplying the clock signal CLK to the volatile storage portion 101, and an inverter circuit 104 for inverting the phase of the clock signal CLK and supplying the inverted clock signal CLKB to the volatile storage portion 101. FIG. 1 illustrates a structure in which the wiring 107 for supplying the first data signal D1 and the wiring 108 for supplying the clock signal CLK are each provided with a protective circuit 105.

The inverter circuit 104 is supplied with the power supply voltage through a wiring 110 which is different from a wiring 109. To the inverter circuit 104, a second power supply voltage terminal Vy for mainly supplying the high power supply potential VDD and the ground line GND for supplying the low power supply potential VSS are connected. The second power supply voltage terminal Vy and the first power supply voltage terminal Vx may be connected to different power sources, or in the case where the second power supply voltage terminal Vy and the first power supply voltage terminal Vx are connected to the same power source, a switch circuit which can individually control supply of the power supply voltage to the second power supply voltage terminal Vy and supply of the power supply voltage to the first power supply voltage terminal Vx may be provided. Note that the inverter circuit 104 may have a circuit configuration in which, for example, a p-channel transistor and an n-channel transistor are used in combination. Alternatively, the inverter circuit 104 may have a circuit configuration in which transistors having the same conductivity type are used.

To the protective circuit 105, the power supply voltage is supplied through the wiring 110, which is different from the wiring 109. To the protective circuit 105, the second power supply voltage terminal Vy for mainly supplying the high power supply potential VDD and the ground line GND (a wiring 111) for supplying the low power supply potential VSS are connected. Note that the protective circuit 105 may have a circuit configuration in which a protective diode is provided on the high power supply potential side and the low power supply potential side. Note that the protective diode may be a diode-connected transistor.

Figure 2:
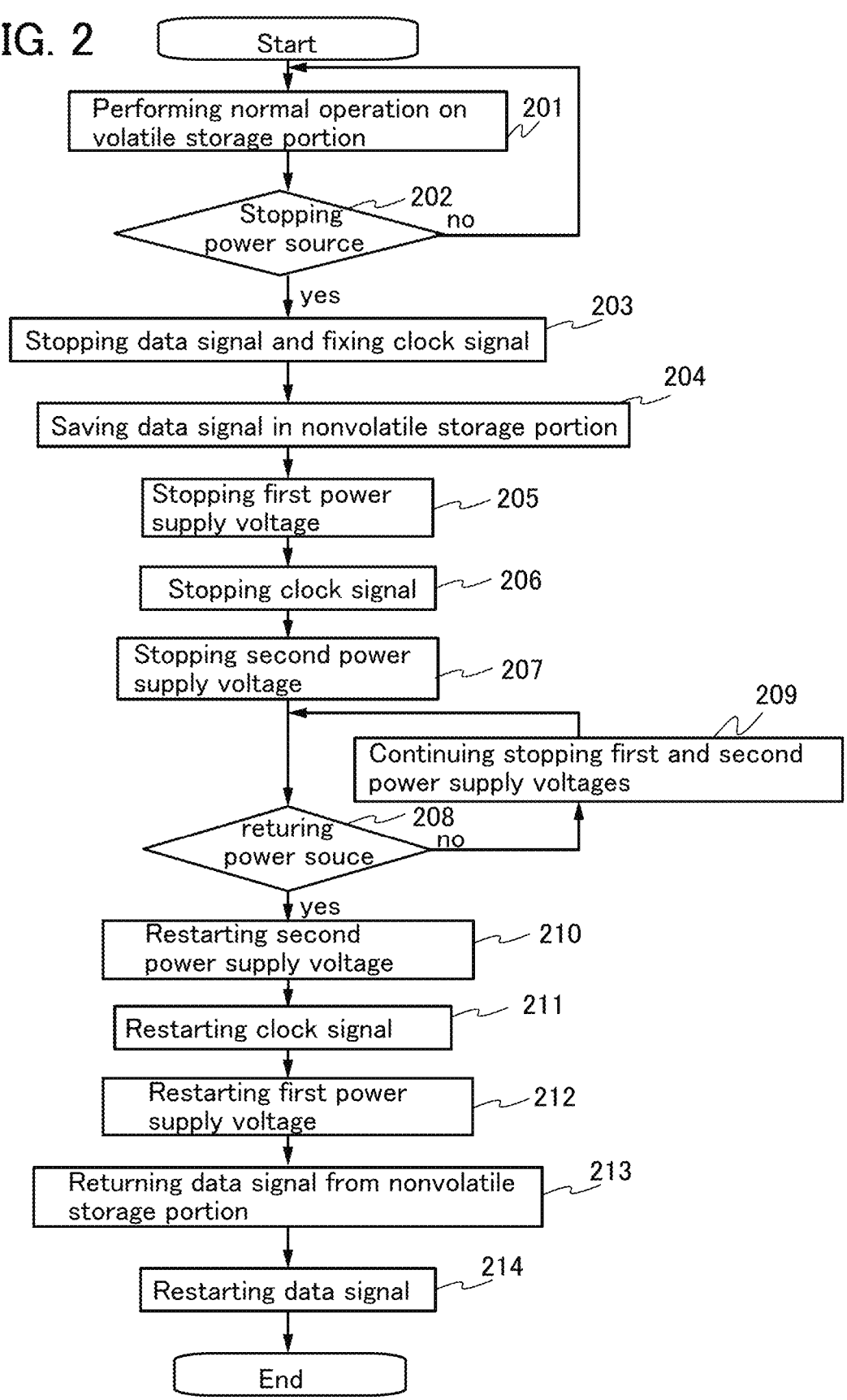
FIG. 2 is a flowchart of a storage circuit.

FIG. 2 is a flowchart showing stop and restart of supply of each signal in the storage circuit of the signal processing unit in which the supply of the power supply voltage is stopped and restarted.

In the flowchart shown in FIG. 2, first, the first data signal D1 is selected by the selector circuit 103 as the data signal D to be supplied to the volatile storage portion 101, and the clock signal CLK and the inverted clock signal CLKB are supplied and the high power supply potential VDD is supplied by the first power supply voltage terminal Vx; in such a manner, normal operation is performed (Step 201). To the inverter circuit 104 and the protective circuit 105, the high power supply potential VDD is supplied by the second power supply voltage terminal Vy.

Next, whether the supply of the power supply voltage is stopped is determined (Step 202). That is, whether supply of the power supply voltage from the first power supply voltage terminal Vx and supply of the power supply voltage from the second power supply voltage terminal Vy are stopped and whether supply of the clock signal CLK and supply of the data signal D are stopped are determined. By the intermittent stop of the supply of the power supply voltage, a significant reduction in power consumption is possible. In the case where supply of the power supply voltage is not stopped, Step 201 is repeated so that the normal operation is performed again.

In the case where the supply of the power supply voltage is stopped in Step 202, sequence for stopping power supply is performed. Specifically, first, supply of the data signal D is stopped, that is, supply of the first data signal D1 from the outside is stopped. Further, in addition to the stop of the supply of the first data signal D1, the clock signal CLK is fixed to the high power supply potential VDD (Step 203). Since the clock signal CLK is fixed, the inverted clock signal CLKB is fixed to the low power supply potential VSS. Stop of the supply of the clock signal CLK and stop of the supply of the inverted clock signal CLKB are performed after an AC signal oscillated with a predetermined frequency is converted into a DC signal having a fixed potential such as the high power supply potential VDD or the low power supply potential VSS; thus, malfunction can be reduced.

After the supply of the data signal D1 is stopped, the data signal D which has been held in the volatile storage portion 101 is stored and saved in the nonvolatile storage portion 102, which makes it possible to hold the data signal D even after supply of the power supply voltage is stopped (Step 204). After the supply of the power supply voltage is stopped, the data signal D which has been held in the volatile storage portion 101 is erased; for that reason, the data signal D is saved in the nonvolatile storage portion 102 that can hold the data signal D even after supply of the power supply voltage is stopped. Note that the data signal D which has been saved in the nonvolatile storage portion 102 is supplied to the volatile storage portion 101 as the second data signal D2 after supply of the power supply voltage is restarted.

Following the stop of the supply of the data signal D, stop of the supply of the power supply voltage from the first power supply voltage terminal Vx is performed (Step 205). Stop of the supply of the power supply voltage from the first power supply voltage terminal Vx may be performed in such a manner that the potential to be supplied from the first power supply voltage terminal Vx is switched from the high power supply potential VDD to the low power supply potential VSS so that a voltage difference between the potential of the first power supply voltage terminal Vx and the low power supply potential VSS of the ground line GND is 0.

Following the stop of the supply of the power supply voltage from the first power supply voltage terminal Vx, stop of the supply of the clock signal CLK is performed (Step 206). Stop of the supply of the inverted clock signal CLKB is performed together with the stop of the supply of the clock signal CLK.

Following the stop of the supply of the clock signal CLK, stop of the supply of the power supply voltage from the second power supply voltage terminal Vy is performed (Step 207). Stop of the supply of the power supply voltage from the second power supply voltage terminal Vy may be performed in such a manner that the potential to be supplied from the second power supply voltage terminal Vy is switched from the high power supply potential VDD to the low power supply potential VSS so that a voltage difference between the potential of the second power supply voltage terminal Vy and the low power supply potential VSS of the ground line GND is 0.

In the above manner, the sequence at the time of stopping the supply of the power supply voltage is completed through Step 203 to Step 207 which are performed sequentially.

In this sequence at the time of stopping the supply of the power supply voltage, when the supply from the second power supply voltage terminal Vy is stopped at the same time as the supply from the first power supply voltage Vx, malfunction occurs. Specifically, current flows from the wiring for supplying the clock signal CLK to the wiring for supplying the power supply voltage which has been stopped. In order to prevent such malfunction, supply of the power supply voltage is stopped after supply of the clock signal CLK is stopped in some cases. However, in the storage circuit including the volatile storage portion 101 of a clock signal synchronization type, if the supply of the clock signal CLK is stopped earlier, the operation in the volatile storage portion 101, which is determined by the clock signal CLK and the inverted clock signal CLKB, becomes indeterminate. Therefore, supply of the power supply voltage in this state leads to malfunction in which the held data is corrupted. In the structure of this embodiment where the data signal D is saved from the volatile storage portion of a clock synchronization type to the nonvolatile storage portion, the above malfunction does not occur and current does not flow through the protective circuit at the time of stopping the supply of the power supply voltage; thus, power consumption of an external device supplying a signal to the signal processing unit can be reduced due to these effects.

Next, whether the supply of the power supply voltage is restarted is determined (Step 208). That is, whether supply of the power supply voltage from the first power supply voltage terminal Vx and supply of the power supply voltage from the second power supply voltage terminal Vy are restarted and whether the clock signal CLK and the first data signal D1 are restarted, which are stopped through sequence at the time of stopping the supply of the power supply voltage, are determined. In the case where the supply of the power supply voltage is not restarted, supply of the power supply voltage from the first power supply voltage terminal Vx and supply of the power supply voltage from the second power supply voltage terminal Vy are kept stopped (Step 209).

In the case where the supply of the power supply voltage is restarted in Step 208, sequence for restarting power supply is performed. Specifically, restart of the supply from the second power supply voltage terminal Vy is performed first (Step 210). The restart of the supply from the second power supply voltage terminal Vy is performed in such a manner that the potential of the second power supply voltage terminal Vy is switched to the high power supply potential VDD and the potential of the ground line GND is switched to the low power supply potential VSS so that the power supply voltage is supplied to the circuits connected to the second power supply voltage terminal Vy.

Following the restart of the supply of the power supply voltage from the second power supply voltage terminal Vy, restart of supply of the clock signal CLK is performed (Step 211). Restart of the supply of the inverted clock signal CLKB is performed together with the restart of supply of the clock signal CLK. The restart of the supply of the clock signal CLK and the inverted clock signal CLKB is performed in such a manner that the clock signal CLK and the inverted clock signal CLKB are each converted into a DC signal having a fixed potential such as the high power supply potential VDD or the low power supply potential VSS and then it is converted into an AC signal oscillated with a predetermined frequency to be output.

Following the restart of the supply of the clock signal CLK, restart of the supply of the power supply from the first power supply voltage terminal Vx is performed (Step 212). The restart of the supply of the power supply voltage from the first power supply voltage terminal Vx is performed in such a manner that the potential of the first power supply voltage terminal Vx is switched to the high power supply potential VDD and the potential of the ground line GND is switched to the low power supply potential VSS so that the power supply voltage is supplied to the circuits connected to the first power supply voltage terminal Vx.

After the restart of the supply of the power supply voltage from the first power supply voltage, the data signal D that has been held in the nonvolatile storage portion 102 is returned to the volatile storage portion 101 so that holding of the first data signal D1 which is interrupted by the stop of the supply of the power supply voltage can be restarted (Step 213). Note that, as described above, the data signal D which has been saved in the nonvolatile storage portion 102 is supplied to the volatile storage portion 101 as the second data signal D2 after supply of the power supply voltage is restarted.

After the second data signal D2 that has been held in the nonvolatile storage portion 102 is returned as the data signal D to the volatile storage portion 101 in Step 213, switching of selection by the selector circuit 103 in the volatile storage portion 101 is performed so that supply of the data signal D1 from the outside is restarted through the wiring for supplying the first data signal D1 (Step 214).

In the above manner, the sequence at the time of restarting the supply of the power supply voltage is completed through Step 210 to Step 214 which are performed sequentially.

In this sequence at the time of the restart of the supply of the power supply voltage, when the restart of the supply of the power supply voltage from the second power supply voltage terminal Vy is performed at the same time as the restart of the supply of the power supply voltage from the first power supply voltage terminal Vx, malfunction occurs. Specifically, current flows from the wiring for supplying the clock signal CLK to the wiring to which the supply of the power supply voltage has not been performed. In order to prevent such malfunction, supply of the clock signal CLK is restarted after supply of the power supply voltage is restarted in some cases. However, in the storage circuit including the volatile storage portion 101 of a clock signal synchronization type, if supply of the power supply voltage to the storage circuit is restarted earlier, the power supply voltage is supplied in the state where the operation in the volatile storage portion 101, which is determined by the clock signal CLK and the inverted clock signal CLKB, is indeterminate. Therefore, supply of the power supply voltage in the state where the operation with the clock signal is indeterminate leads to malfunction in which the held data is corrupted. In the structure of this embodiment where the data signal D is returned from the nonvolatile storage portion to the volatile storage portion of a clock synchronization type, the above malfunction does not occur and current does not flow through the protective circuit at the time of restart of the supply of the power supply voltage; thus, power consumption of an external device supplying a signal to the signal processing unit can be reduced due to these effects.

That is, in the structure described in this embodiment, a rise in the power supply potential which is supplied to the wiring connected to the protective circuit can be performed before restart of the supply of the clock signal CLK. Therefore, malfunction can be reduced, so that power consumption can be reduced.

Figure 3:
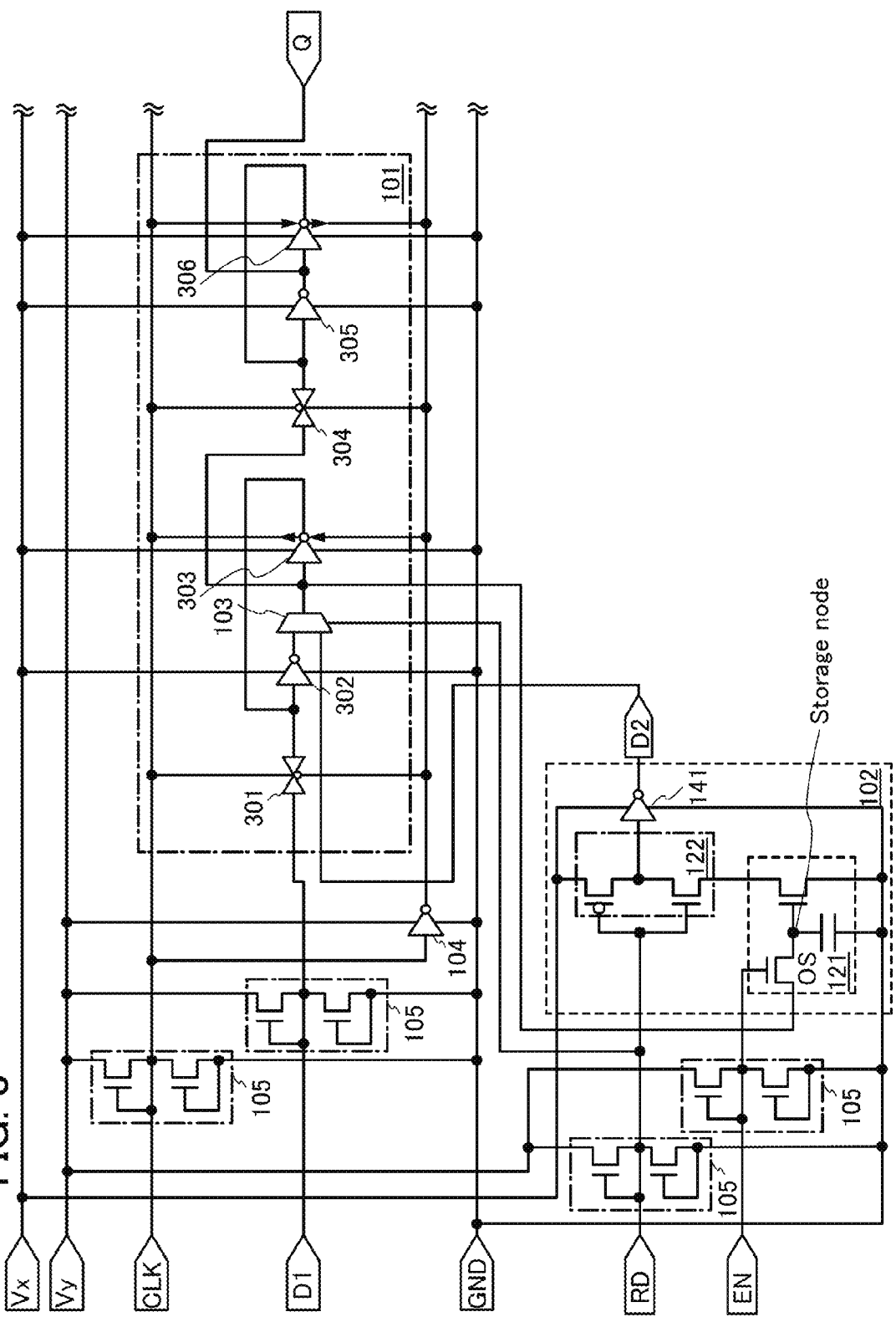
FIG. 3 is a circuit diagram of a storage circuit.

A specific circuit configuration of the storage circuit of the signal processing unit in FIG. 1 is illustrated in FIG. 3. FIG. 3 illustrates a configuration of a storage element including, as a storage element in a nonvolatile storage portion, a transistor in which an oxide semiconductor is used for a semiconductor layer. A specific circuit example including a structure of the volatile storage portion 101, a structure of the nonvolatile storage portion 102, and a structure of the protective circuit in FIG. 1 is shown in FIG. 3.

As an example of the circuit configuration, the volatile storage portion 101 in the storage circuit includes, as illustrated in FIG. 3, a first analog switch 301, a first inverter circuit 302, a first clocked inverter 303, a second analog switch 304, a second inverter circuit 305, and a second clocked inverter 306 in addition to the selector circuit 103.

The volatile storage portion 101 is briefly described. In the volatile storage portion 101, the on/off state of each of the first analog switch 301, the first clocked inverter 303, the second analog switch 304, and the second clocked inverter 306 is controlled by the clock signal CLK and the inverted clock signal CLKB.

The first analog switch 301 is turned on when the clock signal CLK is an H signal. In other words, the first analog switch 301 is turned on by a rise in the clock signal CLK, that is, it is turned on when the potential supplied thereto is switched from the low power supply potential VSS to the high power supply potential VDD. Then, the first analog switch 301 transmits a data signal D to the volatile storage portion 101. The transmitted data signal D is held with a feedback loop of the first inverter circuit 302 and the first clocked inverter 303. The second analog switch 304 is turned on when the clock signal CLK is an L signal. In other words, the second analog switch 304 is turned on by a fall in the clock signal CLK, that is, it is turned on when the potential supplied thereto is switched from the high power potential VDD to the low power supply potential VSS. The data signal D transmitted at the time of the rise in the clock signal CLK since the second analog switch 304 is turned on is held with a feedback loop of the second inverter circuit 305 and the second clocked inverter 306. Note that the power supply voltage supplied to the circuits in the volatile storage portion 101 is based on the first power supply voltage terminal Vx.

As described above, a circuit configuration of the nonvolatile storage portion 102 in the storage circuit may include a ferroelectric random access memory (FeRAM), a magnetoresistive random access memory (MRAM), or a phase change random access memory (PRAM) as well as a flash memory; here, as one example, a transistor in which a channel is formed in an oxide semiconductor layer is described as a storage element holding electric charge. As an example of the circuit configuration, the nonvolatile storage portion 102 illustrated in FIG. 3 includes a nonvolatile storage element 121, an inversion output circuit portion 122, and an inverter circuit 141.

Next, the operation of the nonvolatile storage portion 102 in FIG. 3 is described with reference to FIGS. 4A to 4C. As in FIG. 3, the nonvolatile storage portion 102 in FIGS. 4A to 4C includes the nonvolatile storage element 121, the inversion output circuit portion 122, and the inverter circuit 141. As a signal for controlling input of the data signal D in the nonvolatile storage element 121, a first control signal EN is illustrated. Further, as a signal for controlling output of the data signal D in the inversion output circuit portion 122, a second control signal RD is illustrated.

When the second control signal RD is supplied to the selector circuit 103 in the volatile storage portion 101, the first data signal D1 or the second data signal D2 is selected to be supplied to the volatile storage portion 101 in the case where the power supply voltage is supplied from the first power supply voltage terminal Vx. For example, in the case where the second control signal RD is a signal having the low power supply potential VSS, the first data signal D1 may be selected; in the case where the second control signal RD is a signal having the high power supply potential VDD, the second data signal D2 may be selected.

Figure 4A:
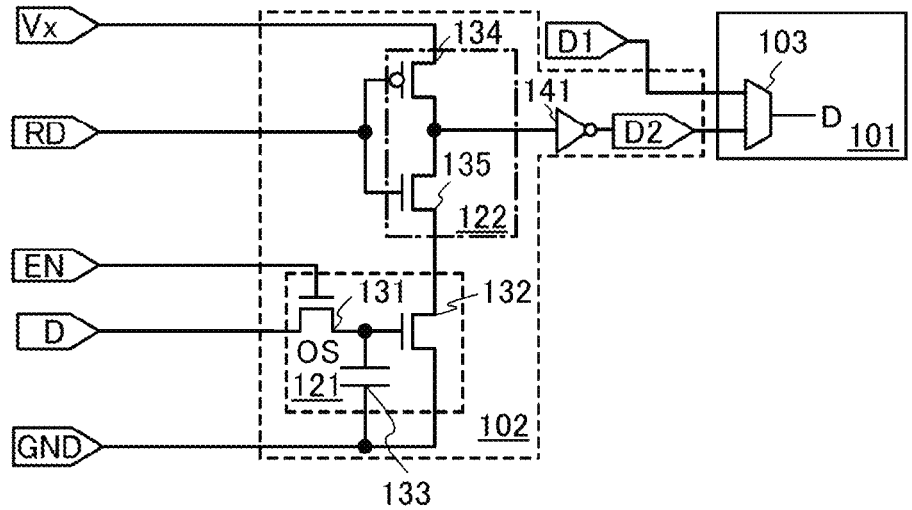
FIGS. 4A to 4C are circuit diagrams of a nonvolatile storage portion.

The nonvolatile storage element 121 in FIG. 4A includes a first transistor 131, a second transistor 132, and a capacitor 133. One of a source and a drain of the first transistor 131 is connected to a gate of the second transistor 132. The one of the source and the drain of the first transistor 131 is connected to one electrode of the capacitor 133. A gate of the first transistor 131 is connected to a wiring for inputting the first control signal EN. The other of the source and the drain of the first transistor 131 is connected to a wiring to which the data signal D is input. A node where the first transistor 131, the second transistor 132, and the capacitor 133 are connected to each other is referred to as "storage node" in the following description.

The first transistor 131 is a transistor in which a channel is formed in an oxide semiconductor layer. In drawings, "OS" is written in order to indicate that the first transistor 131 is a transistor in which a channel is formed in an oxide semiconductor layer.

The second transistor 132 in FIG. 4A is an element functioning as a switch. FIG. 4A illustrates an example in which the second transistor 132 is a transistor having one conductivity type (e.g., an n-channel transistor). As for a switch described here, one terminal of the switch corresponds to one of a source and a drain of a transistor, and the other terminal of the switch corresponds to the other of the source and the drain of the transistor. Further, the on/off state of the switch is selected by a potential based on the data signal D applied to a gate of the transistor. In the case where the second transistor 132 which is an n-channel transistor functions as a switch, the on state and the off state are selected by a signal having the high power supply potential VDD (H signal) and a signal having the low power supply potential VSS (L signal), respectively.

It is possible to omit the capacitor 133 as long as the capacitance between the gate of the second transistor 132 and the one of the source and the drain of the first transistor 131 or the like is actively utilized.

The inversion output circuit portion 122 in FIG. 4A includes a third transistor 134 and a fourth transistor 135. One of a source and a drain of the third transistor 134 is connected to the first power supply voltage terminal Vx. A gate of the third transistor 134 is connected to a wiring for inputting the second control signal RD. The other of the source and the drain of the third transistor 134 is connected to one of a source and a drain of the fourth transistor 135. A gate of the fourth transistor 135 is connected to the wiring for inputting the second control signal RD. The other of the source and the drain of the fourth transistor 135 is connected to one of a source and a drain of the second transistor 132. The other of the source and the drain of the second transistor 132 is connected to the ground line GND. A node where the third transistor 134 and the fourth transistor 135 are connected to each other is connected to the selector circuit 103 in the volatile storage portion 101 through the inverter circuit 141.

The third transistor 134 in FIG. 4A is an element functioning as a switch. The third transistor 134 is, for example, a transistor having one conductivity type (e.g., a p-channel transistor). The fourth transistor 135 in FIG. 4A is an element functioning as a switch. The fourth transistor 135 is, for example, a transistor having one conductivity type (e.g., an n-channel transistor). Note that the third transistor 134 and the fourth transistor 135 are of different conductivity types so that they are alternately turned on and off. That is, the inversion output circuit portion 122 is a circuit for inverting the logic state of the storage node in response to the logic state of the second control signal RD, i.e., an H signal or an L signal and outputting the inverted signal to the inverter circuit 141. The signal output from the inversion output circuit portion 122 is inverted in the inverter circuit 141 to be in the same logic state as the storage node, and the resulting signal is output to the selector circuit 103 in the volatile storage portion 101.

In the nonvolatile storage portion 102, a potential based on a data signal that can be held by the capacitor 133 is applied to the gate of the second transistor 132. Therefore, after supply of the power supply voltage to the storage circuit 100 is restarted, the data signal that can be held by the capacitor 133 can put the second transistor 132 in an on state and the logic state of the storage node can be read from the nonvolatile storage portion 102. Consequently, an original signal can be accurately read even when a potential based on a data signal that can be held by the capacitor 133 fluctuates to some degree.

In FIG. 4A, a transistor in which a channel is formed in a layer or a substrate including a semiconductor other than an oxide semiconductor can be used for any of the transistors other than the first transistor 131 among the transistors used for the nonvolatile storage portion 102. For example, a transistor in which a channel is formed in a silicon layer or a silicon substrate can be used. Further alternatively, in the nonvolatile storage portion 102, a transistor in which a channel is formed in an oxide semiconductor layer can be included besides the first transistor 131, and a transistor in which a channel is formed in a layer or a substrate including a semiconductor other than an oxide semiconductor can be used for the rest of the transistors.

The oxide semiconductor contains at least one element selected from indium (In), gallium (Ga), tin (Sn), and zinc (Zn). The oxide semiconductor preferably contains at least In or Zn among the above elements. In particular, the oxide semiconductor preferably contains In and Zn. As a stabilizer for reducing a variation in electrical characteristics among transistors including the oxide semiconductor, Ga is preferably contained in addition to In and Zn. Sn is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For the oxide semiconductor layer, it is possible to use any of the following oxides: a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide; a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; indium oxide; tin oxide; and zinc oxide. Further, any of the above oxides may contain an element other than In, Ga, Sn, and Zn, for example, $SiO_2$.

Note that here, for example, an In—Ga—Zn-based oxide means an oxide containing indium (In), gallium (Ga), and zinc (Zn) as its main components, and there is no limitation on the ratio of In:Ga:Zn. Further, the In—Ga—Zn-based oxide may contain a metal element other than In, Ga, and Zn.

Alternatively, a material represented by the chemical formula, $InMO_3(ZnO)_m$ (m>0, m is not an integer) may be used as the oxide semiconductor. Note that M represents one or more metal elements selected from Ga, Fe, Mn, and Co. Alternatively, as the oxide semiconductor, a material represented by $In_3SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used depending on necessary semiconductor characteristics (such as mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to appropriate values.

For example, it is relatively easy to obtain high mobility with an In—Sn—Z-based oxide. However, it is possible to obtain high mobility even with an In—Ga—Zn-based oxide by reducing the defect density in a bulk.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor with an amorphous structure, interface scattering can be reduced, and relatively high mobility can be obtained with relative ease.

In an oxide semiconductor having crystallinity, defects in a bulk can be further reduced and when a surface flatness is improved, and mobility higher than that of an oxide semiconductor in an amorphous state can be obtained. In order to improve the surface flatness, the oxide semiconductor is preferably formed on a flat surface. Specifically, the oxide semiconductor may be formed on a surface with an average surface roughness ($R_a$) of 1 nm or less, preferably 0.3 nm or less, more preferably 0.1 nm or less.

Note that the average surface roughness ($R_a$) is obtained by expanding, into three dimensions, center line average roughness that is defined by JIS B 0601 so as to be applied to a surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents the average height of the plane to be measured. $R_a$ can be measured using an atomic force microscope (AFM).

In the case where an In—Zn-based oxide is to be used as an oxide, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=3:4 to 15:2 in a molar ratio). For example, in the case where an In—Zn-based oxide is to be used, in a target therefor having an atomic ratio of In:Zn:O=X:Y:Z, the relation of Z>1.5X+Y is satisfied.

In the case where an In—Sn—Zn-based oxide is to be used as an oxide, a target therefor has a composition ratio of In:Sn:Zn=1:2:2, 2:1:3, 1:1:1, or 20:45:35 in an atomic ratio, for example.

The off-state current density of a transistor in which a channel is formed in an oxide semiconductor layer that is highly purified by thorough removal of hydrogen contained in the oxide semiconductor layer can be less than or equal to 100 zA/μm, preferably less than or equal to 10 zA/μm, more preferably less than or equal to 1 zA/μm. Thus, the off-state current of the transistor is extremely lower than that of the transistor including silicon with crystallinity. As a result, when the first transistor 131 is off, the potential of the storage node, i.e., the potential of the gate of the second transistor 132 can be held for a long time.

Note that in this specification, off-state current is current which flows between a source and a drain when a transistor is in an off state (also called a non-conductive state). In the case of an n-channel transistor (for example, with a threshold voltage of about 0 V to 2 V), the off-state current means a current which flows between a source and a drain when a negative voltage is applied between a gate and the source.

A material which can realize off-state current characteristics equivalent to those of the oxide semiconductor material may be used instead of the oxide semiconductor material. For example, a wide gap material like silicon carbide (more specifically, a semiconductor material whose energy gap Eg is larger than 3 eV) can be used. Further, a MEMS switch or the like may be used instead of a transistor to break connection between wirings, whereby charge in the storage node can be held for a long time.

Figure 4B:
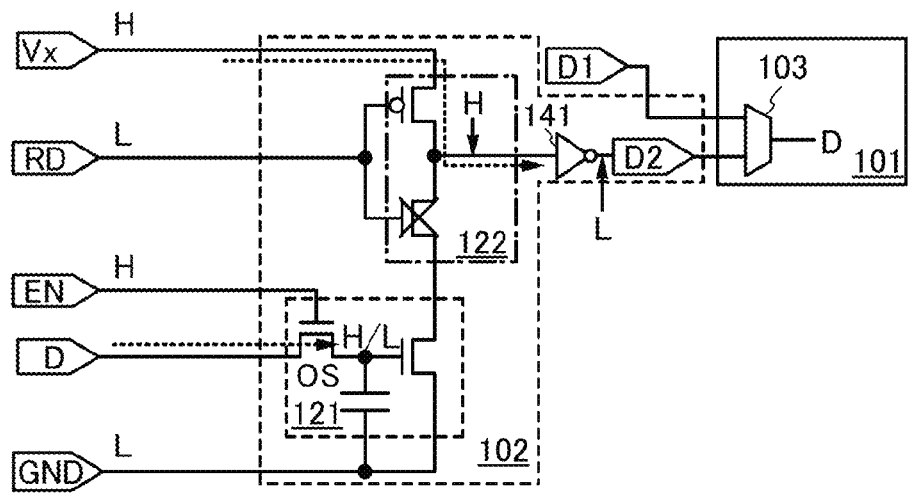

FIG. 4B illustrates the operation of the nonvolatile storage portion 102 at the time of saving the data signal D. When the data signal D is saved, the first control signal EN is an H signal and the second control signal RD is an L signal. Further, when the data signal D is saved, the high power supply potential VDD is supplied from the first power supply voltage terminal Vx. Since the first control signal EN is an H signal, the first transistor 131 is turned on; thus, the data signal D is held in the storage node. At this time, when the second control signal RD is an L signal and the third transistor 134 is turned on, the inversion output circuit portion 122 outputs an H signal through the inverter circuit 141 to keep outputting an L signal to the selector circuit 103 in the volatile storage portion 101.

Figure 4C:
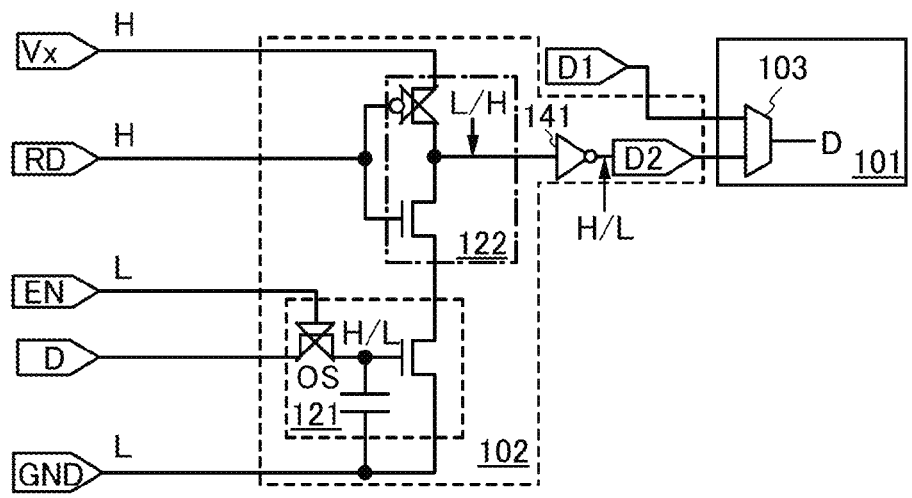

FIG. 4C illustrates the operation of the nonvolatile storage portion 102 at the time of returning the data signal D. When the data signal D is returned, the first control signal EN is an L signal and the second control signal RD is an H signal. Further, when the data signal D is returned, the high power supply potential VDD is supplied from the first power supply voltage terminal Vx. Note that the data signal D held in the storage node is an H signal or an L signal; a description is given of each of the cases.

In the case where the storage node holds an H signal, the second transistor 132 is on. At this time, the fourth transistor 135 is also on, and the inversion output circuit portion 122 outputs an L signal. When the storage node holds an H signal, an L signal output from the inversion output circuit portion 122 is transmitted through the inverter circuit 141 and the inverted signal is output as an H signal to the selector circuit 103 in the volatile storage portion 101.

In the case where the storage node holds an L signal, the second transistor 132 is off. At this time, although the fourth transistor 135 is on, the inversion output circuit portion 122 outputs an H signal because the previous state is held. When the storage node holds an L signal, an H signal output from the inversion output circuit portion 122 is input to the inverter circuit 141 and the inverter circuit 141 outputs an L signal to the selector circuit 103 in the volatile storage portion 101.

The above description is given of the operation of the nonvolatile storage portion 102.

In this embodiment, as illustrated in FIG. 3, the protective circuit 105 is provided for the wirings for supplying signals, other than the wiring for supplying the first power supply voltage Vx and the wiring for supplying the second power supply voltage Vy. In the circuit diagram of FIG. 3, the protective circuit 105 is provided for the wirings for supplying the clock signal CLK, the data signal D, the first control signal EN, and the second control signal RD. In FIG. 3, as the protective circuit 105, a diode-connected transistor is provided between the wiring for supplying the high power supply potential VDD from the second power supply voltage terminal Vy and the wiring for supplying the low power supply potential VSS from the ground line GND, whereby a protective diode is formed.

Figure 5A:
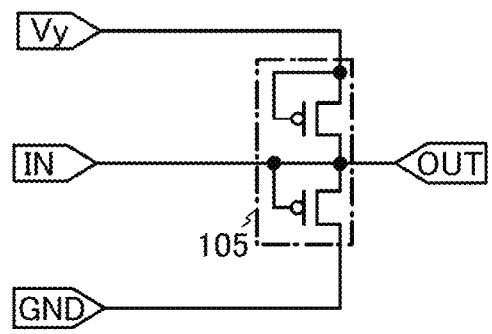
FIGS. 5A to 5C are each a circuit diagram of a protective circuit.
Figure 5B:
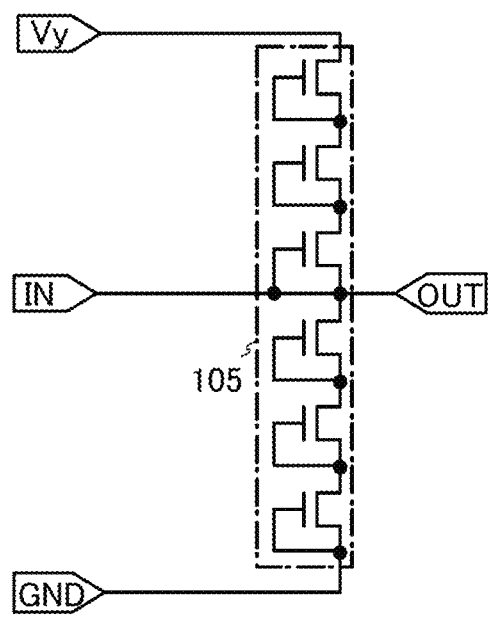
Figure 5C:
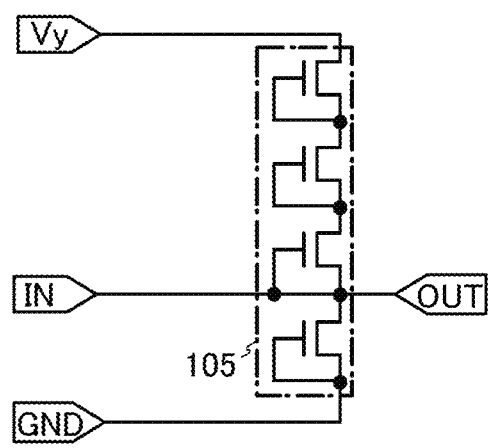

Examples of a configuration of the protective circuit in FIG. 3 are illustrated in FIGS. 5A to 5C. In each of FIGS. 5A to 5C, a wiring between an input terminal IN and an output terminal OUT corresponds to the above wirings for supplying the clock signal CLK, the first data signal D1, the first control signal EN, and the second control signal RD. The protective circuit 105 is formed in such a manner that a diode-connected transistor is provided between the wiring for supplying the high power supply potential VDD from the second power supply voltage terminal Vy and the wiring for supplying the low power supply potential VSS from the ground line GND. The protective diode included in the protective circuit 105 is not limited to an n-channel transistor unlike in FIG. 3, and may be a p-channel transistor as illustrated in FIG. 5A. As illustrated in FIG. 5B, a plurality of diode-connected n-channel transistors may be provided between the wiring for supplying the high power supply potential VDD from the second power supply voltage terminal Vy and the wiring for supplying the low power supply potential VSS from the ground line GND so that the protective diode is formed. In the case of the structure illustrated in FIG. 5B, the number of diode-connected n-channel transistors on the second power supply voltage terminal Vy side and that on the ground line GND side may be different from each other as illustrated in FIG. 5C.

The inverter circuit 104 is supplied with the clock signal CLK and generates the inverted clock signal CLKB whose phase is inverted from that of the clock signal CLK, which is supplied with power supply voltage by the second power supply voltage terminal Vy and the ground line GND, and supplies the inverted clock signal CLKB to the volatile storage portion 101 according to the power supply voltage.

Figure 6:
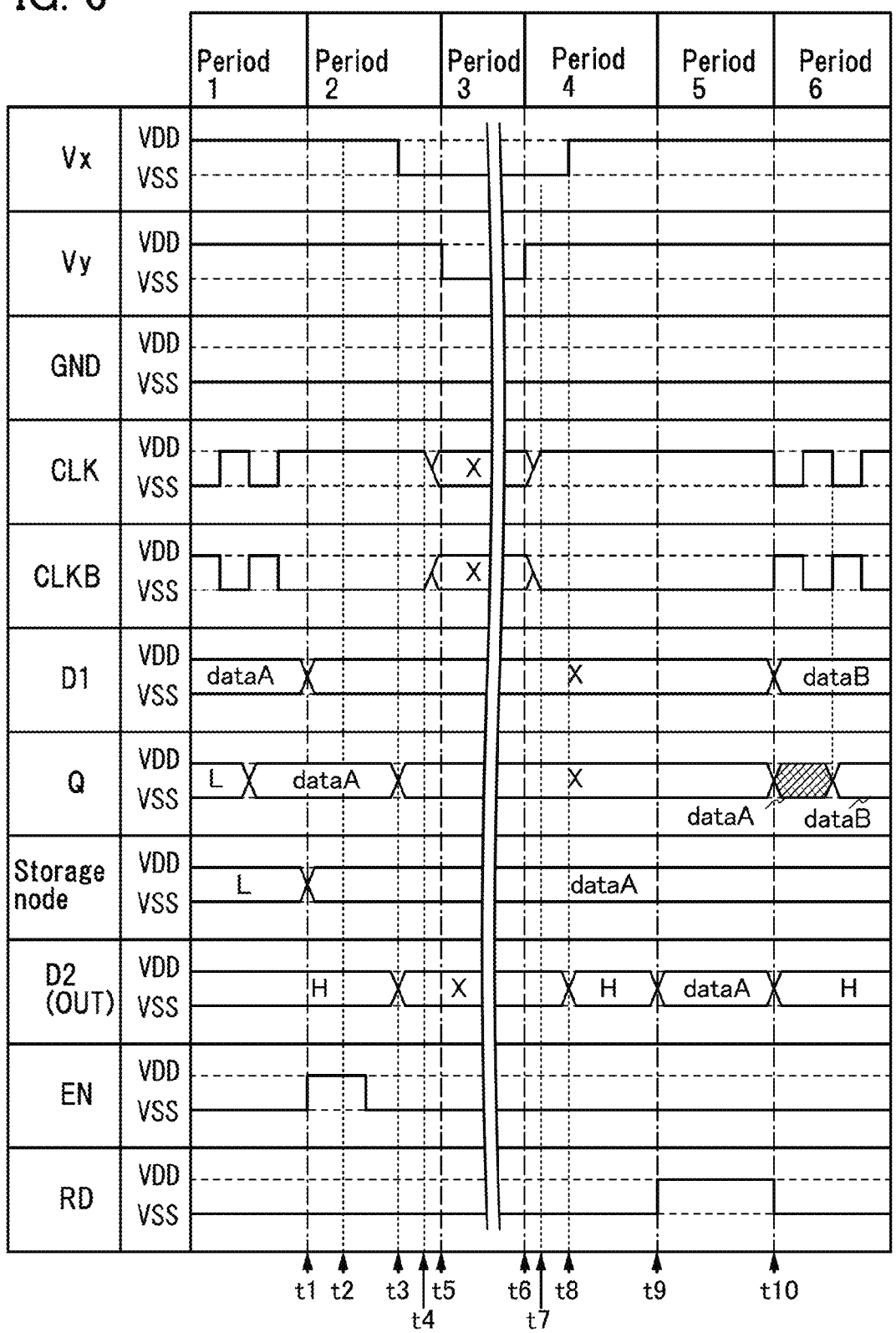
FIG. 6 is a timing chart of a storage circuit.

Next, a description will be given of the operation of the storage circuit 100 of this embodiment in the case where supply of the power supply voltage is stopped at the time of holding the data signal D in the nonvolatile storage portion 102 and then is restarted. FIG. 6 is a timing chart of the storage circuit in FIG. 3, and a description will be given with reference to the timing chart. In the timing chart of FIG. 6, Vx, Vy, GND, CLK, CLKB, D1, Q, Storage Node, D2(OUT), EN, and RD correspond to the potentials of the input/output signals and nodes illustrated in FIG. 3. Further, in the timing chart of FIG. 6, a plurality of periods, Period 1 to Period 6, are separately illustrated in order to explain a plurality of possible states of the storage circuit 100.

In the description of the operation in FIG. 6 below, transistors have the same conductivity types as the respective transistors illustrated in FIG. 3. Note that in the following description, the transistors do not necessarily have such conductivity types, and the conductivity type of each of the transistors and the potential of each control signal can be determined as appropriate as long as the transistors perform the same operation in their conductive states. In the description of the operation in FIG. 6, the case where each signal is an L signal and is held in the initial state is assumed. For example, although the potential of a storage node is determined depending on the state in the previous period, a description is given here assuming that an L signal is held.

Each input/output signal can be represented by the high power supply potential (VDD or H signal) and the low power supply potential (Vss or L signal).

First, the operation in Period 1 in FIG. 6 will be described. In Period 1, the volatile storage portion 101 in the storage circuit 100 holds the data signal D, and the nonvolatile storage portion 102 performs normal operation which is not involved in storage of the data signal D in the storage circuit 100. In Period 1, Vx corresponds to an H signal, and power supply voltage is supplied to the volatile storage portion 101 and the nonvolatile storage portion 102 by the H signal of Vx. Further, in Period 1, Vy corresponds to an H signal, and power supply voltage is supplied to the inverter circuit 104 and the protective circuit 105 by the H signal of Vy. In Period 1, the first control signal EN and the second control signal RD corresponds to L signals. In the storage circuit 100, the second control signal RD corresponds to an L signal, so that the volatile storage portion 101 holds the first data signal D1. In Period 1 of FIG. 6, an L signal is held as the data signal, and the dataA is transmitted in synchronization with a rise in the clock signal CLK, and then the held data A is output in synchronization with a fall in the clock signal CLK.

The operation in Period 2 in FIG. 6 will be described. In Period 2, the data signal D of the volatile storage portion 101 in the storage circuit 100 is saved in the storage node of the nonvolatile storage portion 102, and then, supply of each signal is stopped. The operation in Period 2 is referred to as operation for stopping power supply voltage. In Period 2, first, Vx and Vy correspond to H signals. In order to stop the supply of the power supply voltage from the first power supply voltage terminal Vx and the supply of the power supply voltage from the second power supply voltage terminal Vy from the state where the power supply voltage is supplied to the volatile storage portion 101 and the nonvolatile storage portion 102, other signals are sequentially stopped.

In Period 2, first, in the case where operation for stopping the power supply voltage is performed, supply of the first data signal D1 is stopped (t1 in FIG. 6). After the stop of supply of the first data signal D1, a floating state (shown with "X" in FIG. 6) is formed in which a signal based on the power supply potential of an H signal or an L signal is not supplied. As a result, power consumption can be reduced. At the time of stopping the supply of the first data signal D1, the wiring supplied with the clock signal CLK and the wiring supplied with the inverted clock signal CLKB have a fixed potential of an H signal and a fixed potential of an L signal respectively, and the volatile storage portion 101 holds dataA corresponding to the first data signal D1 until the supply of the power supply voltage from the first power supply voltage terminal Vx is stopped.

The following structure may be employed: in a period of the floating state shown with "X" in FIG. 6, the wiring supplied with the first data signal D1 is fixed at an L signal whose potential is the low power supply potential VSS in a period during which the high power supply potential VDD is supplied from the second power supply voltage terminal Vy, and supply of an L signal to the wiring supplied with the first data signal D1 is stopped in a period during which the high power supply potential VDD is not supplied from the second power supply voltage terminal Vy.

In Period 2, the supply of the first data signal D1 is stopped, and in addition, switching of the first control signal EN to an H signal is performed and the first transistor 131 of the nonvolatile storage element 121 is turned on (t2 in FIG. 6). Then, dataA corresponding to the data signal D that has been held in the volatile storage portion 101 is saved in the storage node of the nonvolatile storage portion 102. After dataA corresponding to the data signal D that has been held in the volatile storage portion 101 is saved in the storage node of the nonvolatile storage portion 102, switching of the first control signal EN to an L signal is performed.

Next, in Period 2, switching of the signal to be supplied to the first power supply voltage terminal Vx to an L signal is performed, so that supply of power supply voltage between the first power supply voltage terminal Vx and the ground line GND to the volatile storage portion 101 and the nonvolatile storage portion 102 is stopped (t3 in FIG. 6). At the time of stopping the supply of the power supply voltage from the first power supply voltage terminal Vx, the output signal Q of the volatile storage portion 101 is brought into a floating state. Further, at the time of stopping the supply of power supply voltage from the first power supply voltage terminal Vx, the output signal OUT of the nonvolatile storage portion 102 is brought into a floating state. The dataA is kept held in the storage node. At this time, the second power supply voltage terminal Vy which is provided separately from the first power supply voltage terminal Vx transmits an H signal. The inverter circuit 104 for generating the inverted clock signal CLKB from the clock signal CLK operates with the power supply voltage from the second power supply voltage terminal Vy, and can generate the inverted clock signal CLKB whose phase is inverted from that of the clock signal CLK even when the first power supply voltage Vx corresponds to an L signal.

Although not illustrated in drawings in this embodiment, stop of supply of the power supply voltage to the selector circuit 103 in the volatile storage portion 101 is also performed in addition to switching of the signals to the first power supply voltage terminal Vx.

When the supply of the power supply voltage from the second power supply voltage terminal Vy is stopped at the same time as the supply of the power supply voltage from the first power supply voltage terminal Vx, malfunction occurs. Specifically, current flows from the wiring for supplying the clock signal CLK to the wiring for supplying the power supply voltage which has been stopped. In order to prevent such malfunction, supply of the power supply voltage is stopped after supply of the clock signal CLK is stopped in some cases. However, in the storage circuit including the volatile storage portion 101 of a clock signal synchronization type, if the supply of the clock signal CLK is stopped earlier, operation of turning on/off the analog switch, the clocked inverter, or the like, which is determined by the clock signal CLK and the inverted clock signal CLKB, becomes indeterminate. Therefore, supply of the power supply voltage in this state leads to malfunction in which the held data is corrupted. In the structure of this embodiment where the data signal D is saved from the volatile storage portion of a clock synchronization type to the nonvolatile storage portion, the above malfunction does not occur and current does not flow through the protective circuit at the time of stopping the supply of the power supply voltage; thus, power consumption can be reduced due to these effects.

When the supply of the power supply voltage from the second power supply voltage terminal Vy is stopped at the same time as the supply of the power supply voltage from the first power supply voltage terminal Vx, the inverter circuit 104 cannot generate the inverted clock signal CLKB from the clock signal CLK. Therefore, in this embodiment, at the time of generating the inverted clock signal CLKB with the use of the inverter circuit 104, the inverter circuit 104 can generate the inverted clock signal CLKB even in the case where the supply of the power supply voltage from the first power supply voltage terminal Vx is stopped earlier; thus, malfunction of the volatile storage portion caused by no supply of the inverted clock signal CLKB can be prevented.

In Period 2, next, supply of the clock signal CLK is stopped (t4 in FIG. 6). After stop of the supply of the clock signal CLK, a floating state (shown with "X" in FIG. 6) is formed in which a signal based on the power supply potential of an H signal or an L signal is not supplied. As a result, power consumption can be reduced. The stop of the supply of the clock signal CLK is performed after the stop of the supply of the power supply voltage from the first power supply voltage terminal Vx; thus, unstable operation of turning on/off, in particular, the analog switch in the volatile storage portion 101 can be prevented.

In Period 2, next, switching of the signal to be supplied to the second power supply voltage terminal Vy to an L signal is performed, so that supply of power supply voltage between the second power supply voltage terminal Vy and the ground line GND to the inverter circuit 104 and the protective circuit 105 is stopped (t5 in FIG. 6). On the other hand, dataA is kept held in the storage node.

The operation in Period 3 in FIG. 6 will be described. The supply of each signal is stopped in Period 3 until the supply of the power supply voltage is restarted and normal operation starts. Note that dataA corresponding to the data signal D saved in the storage node of the nonvolatile storage portion 102 can be kept held also in Period 3.

The operation in Period 4 in FIG. 6 will be described. In Period 4, supply of each signal is restarted from the state of being stopped. The operation in Period 4 is referred to as operation for restarting power supply voltage. In Period 4, signals in a floating state are sequentially restarted.

In Period 4, first, switching of the signal to be supplied to the second power supply voltage terminal Vy to an H signal is performed, so that supply of power supply voltage between the second power supply voltage terminal Vy and the ground line GND to the inverter circuit 104 and the protective circuit 105 is restarted (t6 in FIG. 6).

In Period 4, next, supply of the clock signal CLK is restarted (t7 in FIG. 6). Restart of the supply of the clock signal CLK is performed in such a manner that a signal based on the power supply potential of an H signal is supplied from the floating state. The restart of supply of the inverted clock signal CLKB accompanies the restart of supply of the clock signal CLK. Since the restart of the supply of the clock signal CLK and the inverted clock signal CLKB is performed before restart of the supply of the power supply voltage from the first power supply voltage terminal Vx is performed, indeterminate operation of turning on/off the analog switch, the clocked inverter, or the like in the volatile storage portion 101 can be prevented. Further, since return of the second power supply voltage Vy to an H signal is performed in the previous step, current flowing through the protective circuit due to the restart of the supply of the clock signal can be reduced.

In Period 4, switching of the signal to be supplied to the first power supply voltage terminal Vx to an H signal is performed, so that supply of power supply voltage between the first power supply voltage terminal Vx and the ground line GND to the volatile storage portion 101 and the nonvolatile storage portion 102 is restarted (t8 in FIG. 6). At the time of restart of the supply of the power supply voltage from the first power supply voltage terminal Vx, the output signal OUT of the nonvolatile storage portion 102 becomes an H signal. Since the first data signal D1 is in a floating state, the output signal Q of the volatile storage portion 101 is in a floating state. The dataA is kept held in the storage node.

Although not illustrated in drawings in this embodiment, restart of the supply of the power supply voltage to the selector circuit 103 is also performed in addition to switching of the signals to be supplied to the first power supply voltage Vx.

When the supply of the power supply voltage from the second power supply voltage terminal Vy is restarted at the same time as the supply of the power supply voltage from the first power supply voltage terminal Vx, malfunction occurs. Specifically, current flows from the wiring for supplying the clock signal CLK to the wiring for supplying the power supply voltage which has been stopped. In order to prevent such malfunction, supply of the clock signal CLK is restarted after supply of the power supply voltage is restarted in some cases. However, in the storage circuit including the volatile storage portion 101 of a clock signal synchronization type, if supply of the power supply voltage to the storage circuit is restarted earlier, the power supply voltage is supplied in the state where the operation of turning on/off the analog switch, the clocked inverter, or the like, which is determined by the clock signal CLK and the inverted clock signal CLKB, is indeterminate. Therefore, supply of the power supply voltage in the state where the operation with the clock signal is indeterminate leads to malfunction in which the held data is corrupted. In the structure of this embodiment where the data signal D is returned from the nonvolatile storage portion to the volatile storage portion of a clock synchronization type, the above malfunction does not occur and current does not flow through the protective circuit at the time of restarting the power supply voltage; thus, power consumption can be reduced due to these effects.

When the supply of the power supply voltage from the second power supply voltage terminal Vy is restarted at the same time as the supply of the power supply voltage from the first power supply voltage terminal Vx, a signal output from the inverter circuit 104 before the supply of the clock signal CLK is obtained by the supply of the power supply voltage. Therefore, in this embodiment, malfunction of the volatile storage portion can be prevented in such a manner that the power supply voltage from the second power supply voltage terminal Vy is supplied before the clock signal CLK is supplied to the inverter circuit.

The operation in Period 5 in FIG. 6 will be described. In Period 5, supply of dataA corresponding to the data signal D that has been saved in the nonvolatile storage portion 102 is returned to the volatile storage portion 101. The operation in Period 5 is referred to as operation for returning data signal.

In Period 5, switching of the second control signal RD to an H signal is performed, so that the third transistor 134 and the fourth transistor 135 in the inversion output circuit portion 122 are turned off and turned on respectively (t9 in FIG. 6). Then, dataA corresponding to the data signal D that has been held in the storage node of the nonvolatile storage portion 102 is returned to the volatile storage portion through the selector circuit 103. Note that the selector circuit may be designed so that the second data signal D2 is selected when the second control signal RD is an H signal.

The operation in Period 6 in FIG. 6 will be described. In Period 6, supply of the first data signal D1 is returned so that the normal operation in Period 1 starts again.

The operation in Period 6 in FIG. 6 will be described. In Period 6, the clock signal CLK and the inverted clock signal CLKB are converted into AC signals oscillated with a predetermined frequency, and then dataA restarted in synchronization with the fall in the clock signal CLK in Period 5 is output as the output signal Q. Next, dataB which is the next first data signal D1 is transmitted as the data signal D into the volatile storage portion 101, and then dataB is output as the output signal Q in synchronization with the fall in the clock signal CLK.

The above description is given of the driving method of the storage circuit.

In one example of the circuit diagram of the storage circuit in FIG. 3, the volatile storage portion 101 and the nonvolatile storage portion 102 are located to be adjacent to each other, and the data signal D is read from the volatile storage portion 101 to be saved in the nonvolatile storage portion 102; however, another structure may be employed. For example, as illustrated in FIG. 14, the nonvolatile storage portion 102 may be provided inside the volatile storage portion 101.

Figure 14:
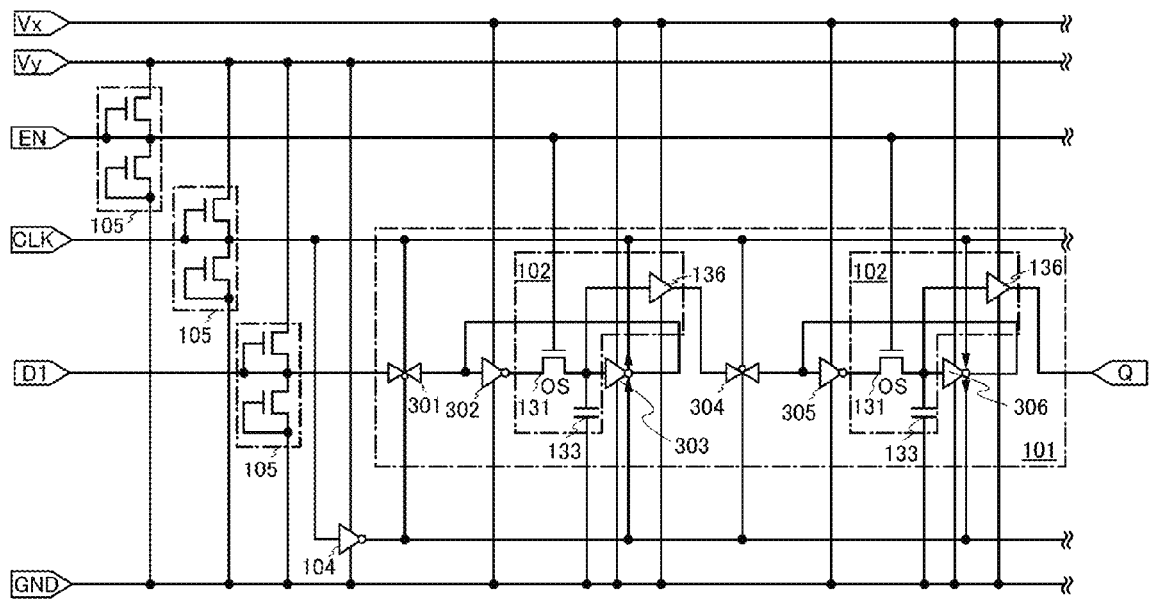
FIG. 14 is a circuit diagram of a storage circuit.

In a circuit configuration illustrated in FIG. 14, the volatile storage portion 101 and the nonvolatile storage portion 102 are connected in series. Only the first control signal EN is supplied as a signal for controlling the nonvolatile storage portion, unlike in FIG. 3. The nonvolatile storage portion illustrated in FIG. 14 includes a buffer circuit 136 as well as the first transistor 131 and the capacitor 133 illustrated in FIG. 4. Like the second transistor 132 illustrated in FIGS. 4A to 4C, the buffer circuit 136 is a circuit for holding a data signal in the node where one of the source and the drain of the first transistor 131 and one electrode of the capacitor 133 are connected to each other and outputting the held data signal according to supplied power supply voltage.

Specifically, the first control signal EN is set to an H signal in normal operation, and is set to an L signal at the time of saving and returning a data signal and at the time of stopping supply of power supply voltage. That is, in normal operation, the first transistor 131 is on, and feedback loops are formed of the first inverter circuit 302 and the first clocked inverter 303 and of the second inverter circuit 305 and the second clocked inverter 306; in such a manner, a data signal is held. At the time of saving and returning a data signal and at the time of stopping supply of power supply voltage, the first transistor 131 is off, and a data signal is held in the node where one of the source and the drain of the first transistor 131 and one electrode of the capacitor 133 are connected to each other.

In FIG. 14, structures other than the nonvolatile storage portion 102 are similar to those in FIG. 3. Therefore, the first power supply voltage terminal Vx for supplying the power supply voltage to the volatile storage portion 101 and the nonvolatile storage portion 102 and the second power supply voltage terminal Vy for supplying the power supply voltage to the protective circuit 105 are provided separately from each other, whereby malfunction can be prevented as in the case of the circuit configuration illustrated in FIG. 3 and current flowing through the protective circuit due to the stop and restart of the supply of the power supply voltage can be prevented. As a result, power consumption can be reduced.

In the structure according to one embodiment the present invention where the data signal D is saved from the volatile storage portion to the nonvolatile storage portion and returned from the nonvolatile storage portion to the volatile storage portion, malfunction does not occur and current does not flow through the protective circuit at the time of stopping and restarting the supply of the power supply voltage; thus, power consumption can be reduced due to these effects.

This embodiment can be implemented in combination with any of the other embodiments.

Embodiment 2

In this embodiment, a structure including a plurality of storage circuits described in Embodiment 1 will be described.

Figure 7A:
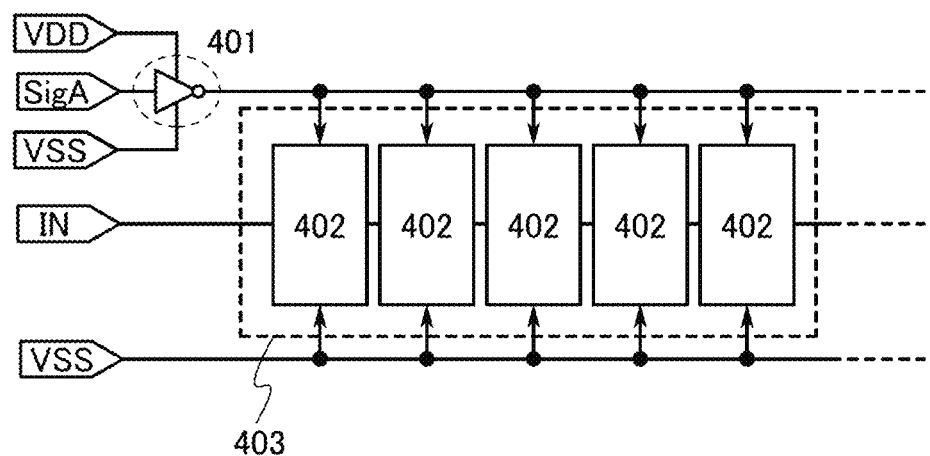
FIGS. 7A and 7B each illustrate a configuration of a storage circuit.

FIG. 7A illustrates a structural example of a storage circuit of this embodiment. The storage circuit illustrated in FIG. 7A includes an inverter circuit 401 to which a high power supply potential VDD and a low power supply potential VSS are supplied, and a storage circuit group 403 including a plurality of storage circuits 402. Specifically, as each of the storage circuits 402, the storage circuit 100 whose structure is described in Embodiment 1 can be used. The high power supply potential VDD or the low power supply potential VSS for applying a first power supply voltage Vx is input through the inverter circuit 401 to each of the storage circuits 402 in the storage circuit group 403. Further, each of the storage circuits 402 included in the storage circuit group 403 is supplied with a potential of a signal IN and the low power supply potential VSS.

In the inverter circuit 401 in FIG. 7A, switching of output between the high power supply potential VDD and the low power supply potential VSS is controlled by a control signal SigA. In the above embodiment, first power supply voltage terminal Vx and the second power supply voltage terminal Vy are supplied with the power supply voltages by using different wirings so that switching of output between the high power supply potential VDD and the low power supply potential VSS in the first power supply voltage terminal Vx and switching of output between the high power supply potential VDD and the low power supply potential VSS in the second power supply potential terminal Vy are performed at different timings.

Figure 7B:
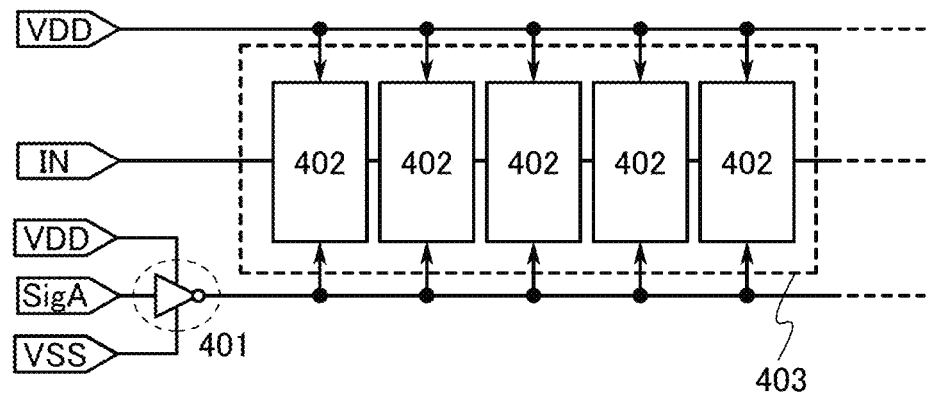

In FIG. 7A, one power supply terminal of each of the storage circuits 402 in the storage circuit group 403 is fixed to the low power supply voltage VSS, and the high power supply potential VDD or the low power supply potential VSS which is selected by the control signal SigA is input to the other power supply terminal of each of the storage circuits 402 in the storage circuit group 403. On the other hand, in FIG. 7B, one power supply terminal of each of the storage circuits 402 in the storage circuit group 403 is fixed to the high power supply voltage VDD, and the high power supply potential VDD or the low power supply potential VSS which is selected by the control signal SigA is input to the other power supply terminal of each of the storage circuits 402 in the storage circuit group 403.

This embodiment can be implemented in appropriate combination with the above embodiment.

Embodiment 3

In this embodiment, a structure of a signal processing unit including the storage circuit described in Embodiment 1 will be described.

Figure 8:
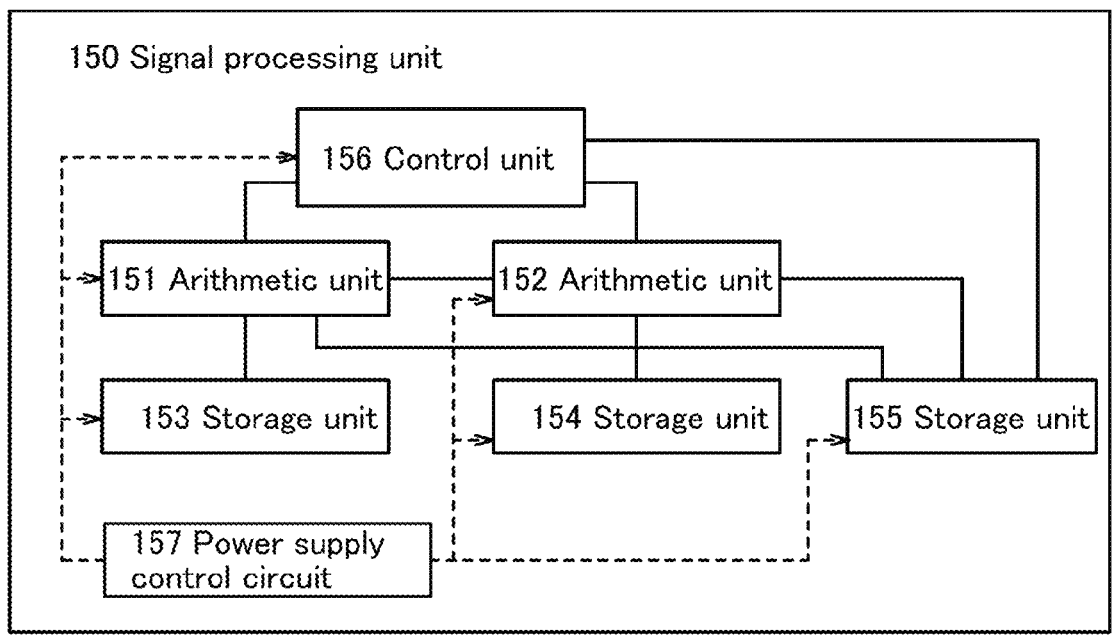
FIG. 8 is a block diagram of a signal processing unit.

FIG. 8 illustrates an example of a signal processing unit according to one embodiment of the present invention. The signal processing unit includes at least one or a plurality of arithmetic units and one or a plurality of storage circuits. Specifically, a signal processing unit 150 illustrated in FIG. 8 includes an arithmetic unit 151, an arithmetic unit 152, a storage circuit 153, a storage circuit 154, a storage circuit 155, a control unit 156, and a power supply control circuit 157.

The arithmetic units 151 and 152 each include, as well as a logic circuit which carries out simple logic arithmetic processing, an adder, a multiplier, and various arithmetic units. The storage circuit 153 functions as a register for temporarily holding a data signal when the arithmetic processing is carried out in the arithmetic unit 151. The storage circuit 154 functions as a register for temporarily holding a data signal when the arithmetic processing is carried out in the arithmetic unit 152.

In addition, the storage circuit 155 can be used as a main memory and can store a program executed by the control unit 156 as a data signal or can store a data signal from the arithmetic unit 151 and the arithmetic unit 152.

The control unit 156 is a circuit which collectively controls operations of the arithmetic unit 151, the arithmetic unit 152, the storage circuit 153, the storage circuit 154, and the storage circuit 155 included in the signal processing unit 150. Note that in FIG. 8, a structure in which the control unit 156 is provided in the signal processing unit 150 as a part thereof is illustrated, but the control unit 156 may be provided outside the signal processing unit 150.

By using the storage circuit described in Embodiment 1 for the storage circuit 153, the storage circuit 154, and the storage circuit 155, a data signal can be held even when the supply of the power supply voltage to the storage circuit 153, the storage circuit 154, and the storage circuit 155 is stopped. In the above manner, the supply of the power supply voltage to the entire signal processing unit 150 can be stopped, whereby power consumption can be suppressed. Alternatively, the supply of the power supply voltage to one or more of the storage circuit 153, the storage circuit 154, and the storage circuit 155 can be stopped, whereby power consumption of the signal processing unit 150 can be suppressed. After the supply of the power supply voltage is resumed, the storage circuit can return to the state same as that before the supply of the power supply voltage is stopped in a short time.

In addition, as well as the supply of the power supply voltage to the storage circuit, the supply of the power supply voltage to the control circuit or the arithmetic unit which transmits/receives a data signal to/from the storage circuit may be stopped. For example, when the arithmetic unit 151 and the storage circuit 153 are not operated, the supply of the power supply voltage to the arithmetic unit 151 and the storage circuit 153 may be stopped.

In addition, the power supply control circuit 157 controls the level of the power supply voltage which is supplied to the arithmetic unit 151, the arithmetic unit 152, the storage circuit 153, the storage circuit 154, the storage circuit 155, and the control unit 156 included in the signal processing unit 150. Further, in the case where the supply of the power supply voltage is stopped, it may be stopped in the power supply control circuit 157, or in each of the arithmetic unit 151, the arithmetic unit 152, the storage circuit 153, the storage circuit 154, the storage circuit 155, and the control unit 156.

A storage circuit which functions as a cache memory may be provided between the storage circuit 155 that is a main memory and each of the arithmetic unit 151, the arithmetic unit 152, and the control unit 156. By providing the cache memory, low-speed access to the main memory can be reduced and the speed of the signal processing such as arithmetic processing can be higher. By applying the above-described storage circuit also to the storage circuit functioning as a cache memory, power consumption of the signal processing unit 150 can be suppressed. After the supply of the power supply voltage is resumed, the storage circuit can return to the state same as that before the supply of the power supply voltage is stopped in a short time.

This embodiment can be implemented in appropriate combination with any of the above embodiments.

Embodiment 4

In this embodiment, a configuration of a CPU, which is one of signal processing units according to one embodiment of the present invention, will be described.

Figure 9:
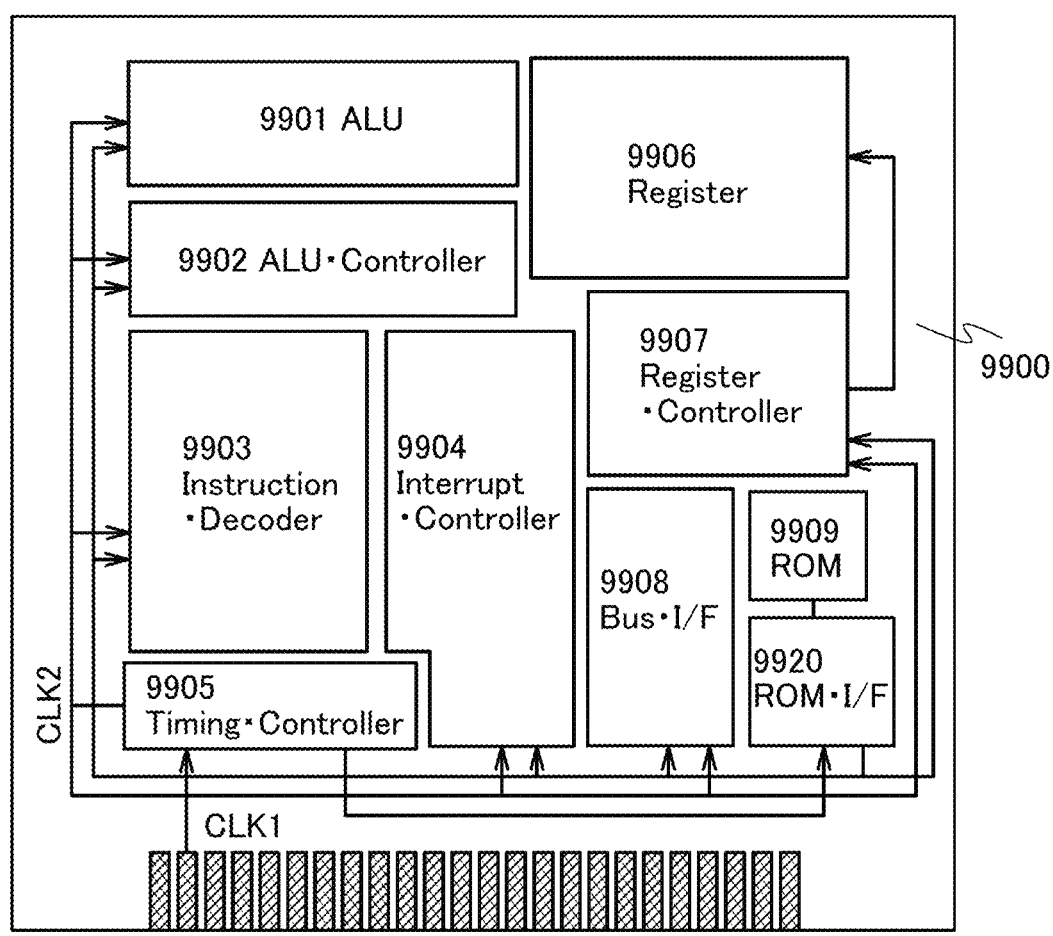
FIG. 9 is a block diagram of a CPU including a storage circuit.

FIG. 9 illustrates a configuration of the CPU in this embodiment. The CPU illustrated in FIG. 9 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 9 is only an example with a simplified configuration, and an actual CPU may employ a variety of configurations depending on the application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and inputs the clock signal CLK2 to the above circuits.

In the CPU of this embodiment, a storage circuit having the structure described in any of the above embodiments is provided in the register 9906. The register controller 9907 determines, in response to an instruction from the ALU 9901, whether a data signal is held by the volatile storage portion 101 or a data signal is held by the nonvolatile storage portion 102 in the storage curcyut in the register 9906. When holding a data signal by the feedback loop of the inverter circuit is selected, a power supply voltage is supplied to the storage circuit in the register 9906. When holding a data signal in the capacitor is selected, the supply of the power supply voltage to the storage circuit in the register 9906 can be stopped.

In such a manner, even in the case where the operation of the CPU is temporarily stopped and the supply of the power supply voltage is stopped, a data signal can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the signal processing unit according to one embodiment of the present invention is not limited to the CPU and can be applied to an LSI such as a microprocessor, an image processing circuit, a digital signal processor (DSP), or a field programmable gate array (FPGA).

This embodiment can be implemented in combination with any of the above embodiments.

Embodiment 5

A manufacturing method of the storage circuit 100 will be described. Manufacturing methods of the second transistor 132 in which a channel is formed in silicon, the first transistor 131 in which a channel is formed in an oxide semiconductor layer, and the capacitor 133 in the nonvolatile storage portion 102 will be described as examples for the explanation of the manufacturing method of the storage circuit 100.

Figure 10A:
FIGS. 10A to 10D illustrate a manufacturing process of a storage circuit.

As illustrated in FIG. 10A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where a glass substrate is used and the temperature at which the heat treatment is to be performed later is high, a glass substrate whose strain point is higher than or equal to 730° C. is preferably used.

In this embodiment, an example in which the semiconductor film 702 is formed using single crystal silicon is given as a manufacturing method of the second transistor 132. Note that a specific example of a forming method of the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 N/cm² to 500 N/cm², preferably 11 N/cm² to 20 N/cm² is applied to part of the bond substrate and part of the substrate 700 so that the substrates are attached to each other. When the pressure is applied, bonding between the bond substrate and the insulating film 701 starts from the portion, which results in bonding of the entire surface where the bond substrate and the insulating film 701 are in close contact with each other. Subsequently, heat treatment is performed, whereby microvoids that exist in the fragile layer are combined, so that the microvoids increase in volume. Accordingly, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which has not been patterned or may be added to the semiconductor film 702 which is formed through the patterning. Alternatively, the impurity element for controlling the threshold voltage may be added to the bond substrate. Further alternatively, the impurity element may be added to the bond substrate in order to roughly control the threshold voltage, and the impurity element may be further added to the semiconductor film which has not been patterned or the semiconductor film 702 which is formed through the patterning in order to finely control the threshold voltage.

Note that although an example in which the single crystal semiconductor film is used is described in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As the known technique of crystallization, a laser crystallization method using a laser beam and a crystallization method using a catalytic element are given. Alternatively, a crystallization method using a catalytic element and a laser crystallization method may be combined. In the case of using a heat-resistant substrate such as a quartz substrate, it is possible to combine any of the following crystallization methods: a thermal crystallization method using an electrically heated oven, a lamp annealing crystallization method using infrared light, a crystallization method using a catalytic element, and a high-temperature annealing method at approximately 950° C.

Figure 10B:
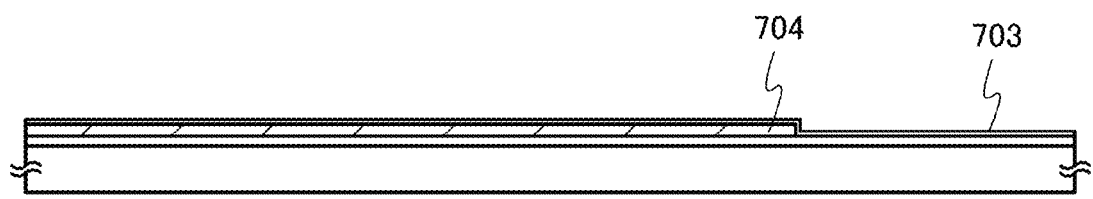

Next, as illustrated FIG. 10B, a semiconductor layer 704 is formed using the semiconductor film 702. Then, a gate insulating film 703 is formed over the semiconductor layer 704.

The gate insulating film 703 can be formed using, for example, a single layer or a stack of layers using silicon oxide, silicon nitride oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate (HfSi$_x$O$_y$, (x>0, y>0)) to which nitrogen is added, hafnium aluminate (HfAl$_x$O$_y$, (x>0, y>0)) to which nitrogen is added, or the like by a plasma CVD method, a sputtering method, or the like.

In this specification, in oxynitride, the amount of oxygen is larger than that of nitrogen, and in nitride oxide, the amount of nitrogen is larger than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 703 by a plasma CVD method.

Figure 10C:
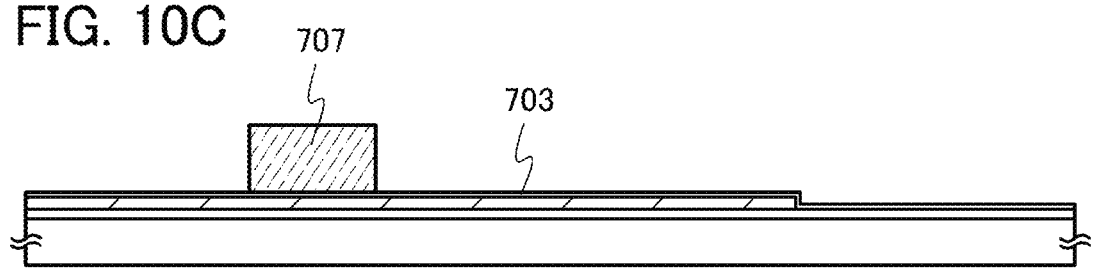

Next, a gate electrode 707 is formed as illustrated in FIG. 10C.

The gate electrode 707 can be formed in such a manner that a conductive film is formed, and then the conductive film is processed (patterned) into a desired shape. The conductive film can be formed by a CVD method, a sputtering method, an evaporation method, a spin coating method, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing any of the aforementioned metals as its main component or a compound containing any of the aforementioned metals may be used. Alternatively, the conductive film may be formed using a semiconductor such as polycrystalline silicon doped with an impurity element such as phosphorus which imparts conductivity to the semiconductor film.

Note that although the gate electrode 707 is formed of a single-layer conductive film in this embodiment, this embodiment is not limited to this structure. The gate electrode 707 may be formed of a plurality of stacked conductive films.

As a combination of two conductive films, tantalum nitride or tantalum can be used for a first conductive film and tungsten can be used for a second conductive film. Moreover, the following combinations are given: tungsten nitride and tungsten, molybdenum nitride and molybdenum, aluminum and tantalum, aluminum and titanium, and the like. Since tungsten and tantalum nitride have high heat resistance, heat treatment for thermal activation can be performed after the two conductive films are formed. Alternatively, as the combination of the two conductive films, for example, nickel silicide and silicon doped with an impurity element imparting n-type conductivity, tungsten silicide and silicon doped with an impurity element imparting n-type conductivity, or the like can be used.

In the case of a three-layer structure in which three conductive films are stacked, a layered structure of a molybdenum film, an aluminum film, and a molybdenum film is preferably used.

Further, a light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707.

Alternatively, the gate electrode 707 may be selectively formed by a droplet discharge method without using a mask. A droplet discharge method is a method for forming a predetermined pattern by discharge or ejection of a droplet containing a predetermined composition from an orifice, and includes an inkjet method in its category.

The gate electrode 707 can be formed in such a manner that the conductive film is etched into a desired tapered shape by an inductively coupled plasma (ICP) etching method in which the etching condition (e.g., the amount of electric power applied to a coil-shaped electrode layer, the amount of electric power applied to an electrode layer on the substrate side, and the electrode temperature on the substrate side) is controlled as appropriate. In addition, angles and the like of the tapered shapes may also be controlled by the shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 10D:
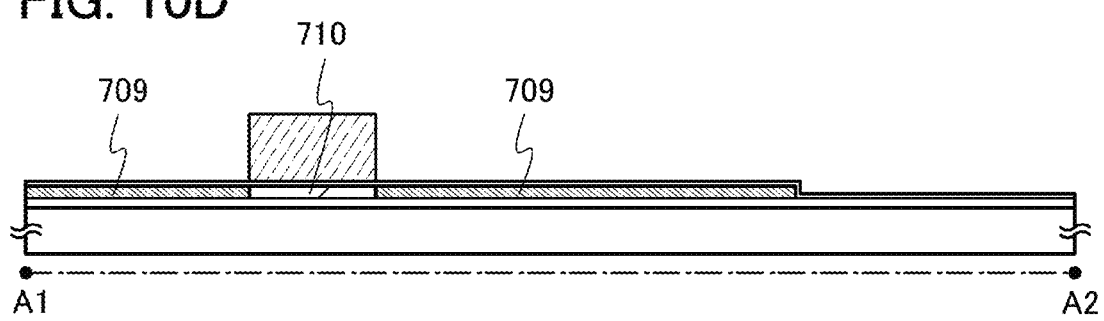

Next, an impurity element imparting one conductivity type is added to the semiconductor layer 704 with the use of the gate electrode 707 as a mask, whereby a channel formation region 710 which overlaps with the gate electrode 707 and a pair of impurity regions 709 with the channel formation region 710 interposed therebetween are formed in the semiconductor layer 704 as illustrated in FIG. 10D.

In this embodiment, the case where an impurity element imparting p-type conductivity (e.g., boron) is added to the semiconductor layer 704 is described as an example.

Figure 11A:
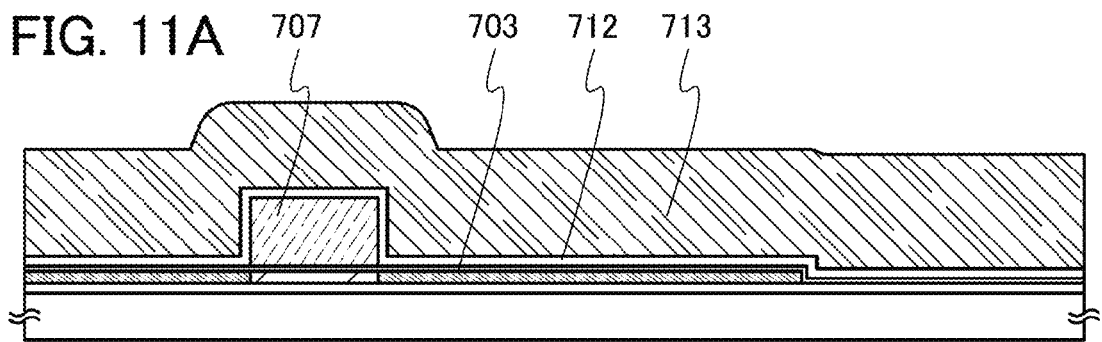
FIGS. 11A to 11C illustrate a manufacturing process of a storage circuit.

Next, as illustrated in FIG. 11A, insulating films 712 and 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, a material with a low dielectric constant (a low-k material) is preferably used for the insulating films 712 and 713, because capacitance due to overlap of electrodes or wirings can be sufficiently reduced. Note that a porous insulating film including such a material may be employed as the insulating films 712 and 713. A porous insulating film has a lower dielectric constant than an insulating film with high density, and thus allows a further reduction in parasitic capacitance generated by electrodes or wirings.

In this embodiment, an example in which silicon oxynitride is used for the insulating film 712 and silicon nitride oxide is used for the insulating film 713 is described. In addition, an example in which the insulating films 712 and 713 are formed over the gate electrode 707 is described in this embodiment; however, in the present invention, only one insulating film may be formed over the gate electrode 707 or a plurality of insulating films of three or more layers may be stacked.

Figure 11B:
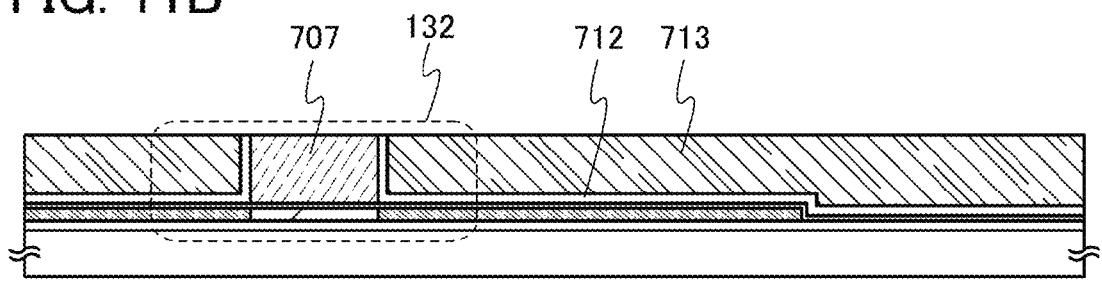

Next, as illustrated in FIG. 11B, the insulating film 713 is subjected to chemical mechanical polishing (CMP) or etching, so that a top surface of the insulating film 713 is planarized. Note that in order to improve the characteristics of the first transistor 131 which is formed later, a surface of the insulating film 713 is preferably planarized as much as possible.

Through the above steps, the second transistor 132 can be formed.

Figure 11C:
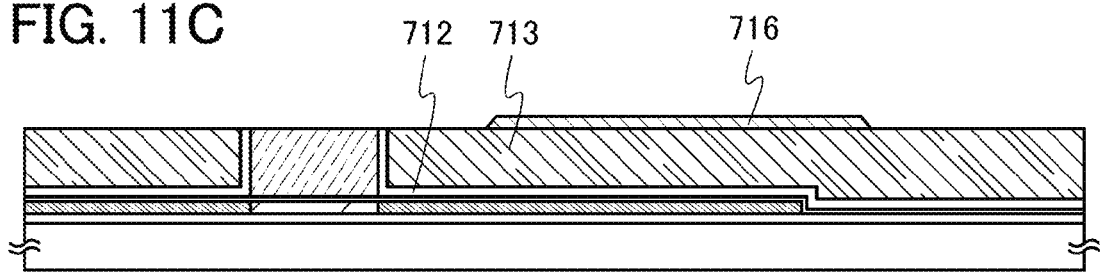

Next, a method for manufacturing the first transistor 131 is described. First, as illustrated in FIG. 11C, an oxide semiconductor layer 716 is formed over the insulating film 713.

The oxide semiconductor layer 716 can be formed by processing an oxide semiconductor film formed over the insulating film 713 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust on a surface of the insulating film 713 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

As described above, for the oxide semiconductor, any of the following can be used: a four-component metal oxide such as an In—Sn—Ga—Zn-based oxide; a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, or a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; indium oxide; tin oxide; zinc oxide; and the like.

In this embodiment, as the oxide semiconductor film, an In—Ga—Zn-based oxide semiconductor thin film with a thickness of 30 nm, which is obtained by a sputtering method using a target containing indium (In), gallium (Ga), and zinc (Zn), is used. As the target, a target having a composition ratio of In:Ga:Zn=1:1:0.5, In:Ga:Zn=1:1:1, or In:Ga:Zn=1:1:2 can be used, for example. The filling rate of the target containing In, Ga, and Zn is greater than or equal to 90% and less than or equal to 100%, preferably greater than or equal to 95% and less than 100%. With the use of the target with high filling rate, a dense oxide semiconductor film is formed.

In this embodiment, the oxide semiconductor film is formed in such a manner that the substrate is held in a treatment chamber kept at reduced pressure, a sputtering gas from which hydrogen and moisture are removed is introduced into the treatment chamber while remaining moisture therein is removed, and the above target is used. The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), (more preferably, also a compound containing a carbon atom), and the like are removed, whereby the impurity concentration in the oxide semiconductor film formed in the treatment chamber can be reduced.

As one example of the film formation condition, the distance between the substrate and the target is 100 mm, the pressure is 0.6 Pa, the electric power of the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

When the leakage rate of the treatment chamber of the sputtering apparatus is set to $1 \times 10^{-10}$ Pa·m$^3$/s or less, entry of impurities such as an alkali metal and hydride into the oxide semiconductor film that is being deposited by sputtering can be reduced. Further, with the use of the above entrapment vacuum pump as an evacuation system, counter flow of impurities such as alkali metal, a hydrogen atom, a hydrogen molecule, water, a hydroxyl group, and hydride from the evacuation system can be reduced.

When the purity of the target is set to 99.99% or higher, alkali metal, a hydrogen atom, a hydrogen molecule, water, a hydroxyl group, hydride, or the like entering the oxide semiconductor film can be reduced. In addition, when the target is used, the concentration of alkali metal such as lithium, sodium, or potassium can be reduced in the oxide semiconductor film.

In order that the oxide semiconductor film contains as little hydrogen, a hydroxyl group, and moisture as possible, it is preferable that impurities adsorbed on the substrate 700, such as moisture and hydrogen, be eliminated and removed by preheating the substrate 700, over which films up to the insulating films 712 and 713 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an evacuation unit provided in the preheating chamber, a cryopump is preferable. Note that this preheating treatment can be omitted. This preheating may be similarly performed on the substrate 700 over which conductive films 719 and 720 are formed before the formation of a gate insulating film 721.

Note that etching for forming the oxide semiconductor layer 716 may be dry etching, wet etching, or both dry etching and wet etching. As an etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coiled electrode, the amount of electric power applied to an electrode on the substrate side, the electrode temperature on the substrate side, or the like) is adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step to remove a resist residue or the like left over surfaces of the oxide semiconductor layer 716 and the insulating films 712 and 713.

Note that, in some cases, the oxide semiconductor film formed by sputtering or the like contains a large amount of moisture or hydrogen (including a hydroxyl group) as impurities. Moisture and hydrogen easily form a donor level and thus serve as impurities in the oxide semiconductor. Therefore, in one embodiment of the present invention, in order to reduce impurities such as moisture and hydrogen in the oxide semiconductor film (dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may include a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas that does not react with the object by heat treatment, for example, nitrogen or a rare gas such as argon is used.

Note that it is preferable that in the heat treatment, moisture, hydrogen, or the like be not contained in nitrogen or a rare gas such as helium, neon, or argon. It is preferable that the purity of nitrogen or a rare gas such as helium, neon, or argon which is introduced into the heat treatment apparatus be set to be 6N (99.9999%) or higher, preferably 7N (99.99999%) or higher (that is, the impurity concentration is 1 ppm or less, preferably 0.1 ppm or less).

It has been pointed out that an oxide semiconductor is insensitive to impurities, there is no problem even when a considerable amount of metal impurities is contained in the film, and therefore, soda-lime glass which contains a large amount of alkali metal such as sodium and is inexpensive can also be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). However, this is not a proper consideration. Alkali metal is not an element included in an oxide semiconductor, and therefore, is an impurity. Also, alkaline-earth metal is an impurity in the case where alkaline-earth metal is not an element included in an oxide semiconductor. Alkali metal, in particular, Na becomes Na$^+$ when an insulating film in contact with the oxide semiconductor layer is an oxide and Na diffuses into the insulating film. Further, in the oxide semiconductor layer, Na cuts or enters a bond between metal and oxygen which are included in the oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor layer is less than or equal to $1\times10^{18}/cm^3$, preferably less than or equal to $1\times10^{17}/cm^3$, the concentration of the above impurity is preferably reduced. Specifically, the Na concentration measured by secondary ion mass spectrometry is preferably less than or equal to $5\times10^{16}/cm^3$, more preferably less than or equal to $1\times10^{16}/cm^3$, still more preferably less than or equal to $1\times10^{15}/cm^3$. In a similar manner, the measurement value of Li concentration is preferably less than or equal to $5\times10^{15}/cm^3$, more preferably less than or equal to $1\times10^{15}/cm^3$. In a similar manner, the measurement value of K concentration is preferably less than or equal to $5\times10^{15}/cm^3$, more preferably less than or equal to $1\times10^{15}/cm^3$.

Through the above steps, the hydrogen concentration in the oxide semiconductor layer 716 can be reduced and the oxide semiconductor layer 716 can be purified. Accordingly, the oxide semiconductor layer can be stable. In addition, heat treatment at a temperature lower than or equal to the glass transition temperature makes it possible to form an oxide semiconductor layer with extremely low carrier density and a wide band gap. Therefore, the transistor can be manufactured using a large-sized substrate, so that the productivity can be increased. In addition, by using the purified oxide semiconductor layer in which the hydrogen concentration is reduced, it is possible to manufacture a transistor with high withstand voltage and an extremely low off-state current. The above heat treatment can be performed at any time as long as it is performed after the oxide semiconductor layer is formed.

Note that the oxide semiconductor layer may be either amorphous or crystalline. As an oxide semiconductor layer having crystallinity, an oxide including a crystal with c-axis alignment (also referred to as CAAC: c axis aligned crystal) is also preferable because the effect of improving the reliability of a transistor can be obtained.

Specifically, CAAC is non-single-crystal, has triangular, hexagonal, equilateral triangular, or regular hexagonal atomic arrangement when seen from the direction perpendicular to the a-b plane, and has a phase in which metal atoms are arranged in a layered manner or a phase in which metal atoms and oxygen atoms are arranged in a layered manner when seen from the direction perpendicular to the c-axis direction.

In CAAC, metal atoms and oxygen atoms are bonded in an orderly manner in comparison with a totally amorphous oxide semiconductor. That is to say, the number of oxygen atoms coordinated to each metal atom may vary when the oxide semiconductor is totally amorphous, but in the case of CAAC, there are few variations in the number of oxygen atoms coordinated to each metal. Accordingly, microscopic oxygen deficiency can be reduced, and instability and charge transfer due to attachment and detachment of hydrogen atoms (including hydrogen ions) or alkali metal atoms can be reduced.

Therefore, a transistor is formed using an oxide semiconductor film including CAAC, whereby the amount of change in threshold voltage of the transistor between before and after light irradiation and a bias-temperature stress (BT) test performed on the transistor can be reduced. Accordingly, a transistor having stable electrical characteristics can be manufactured.

Sputtering may be performed to form an oxide semiconductor including CAAC. In order to obtain CAAC by sputtering, it is important to form hexagonal crystals in an initial stage of deposition of an oxide semiconductor and cause crystal growth from the hexagonal crystals as seeds. In order to achieve this, it is preferable that the distance between the target and the substrate be made longer (e.g., 150 mm to 200 mm) and the substrate heating temperature be 100° C. to 500° C., more preferably 200° C. to 400° C., still preferably 250° C. to 300° C.

The proportion of oxygen gas in an atmosphere is preferably set high when an oxide semiconductor including CAAC is formed by sputtering. For sputtering in a mixed gas atmosphere of argon and oxygen, for example, the proportion of oxygen gas is preferably set 30% or higher, more preferably 40% or higher. This is because supply of oxygen from the atmosphere promotes crystallization of CAAC.

When an oxide semiconductor including CAAC is formed by a sputtering method, a substrate over which an oxide semiconductor film including CAAC is heated preferably to 150° C. or higher, more preferably to 170° C. or higher. This is because a rise in substrate temperature promotes crystallization of CAAC.

After being subjected to heat treatment in a nitrogen atmosphere or in vacuum, the oxide semiconductor including CAAC is preferably subjected to heat treatment in an oxygen atmosphere or a mixed atmosphere of oxygen and another gas. This is because oxygen deficiency due to the former heat treatment can be compensated by supply of oxygen from the atmosphere in the latter heat treatment.

A film surface where the oxide semiconductor including CAAC (deposition surface) is formed is preferably planar. This is because irregularity of the deposition surface provides grain boundaries in the oxide semiconductor including CAAC because the c-axis substantially perpendicular to the deposition surface exists in the oxide semiconductor including CAAC. For this reason, the deposition surface is preferably subjected to planarization treatment such as chemical mechanical polishing (CMP) before the oxide semiconductor including CAAC is formed. The average roughness of the deposition surface is preferably 0.5 nm or less, more preferably 0.3 nm or less.

Figure 12A:
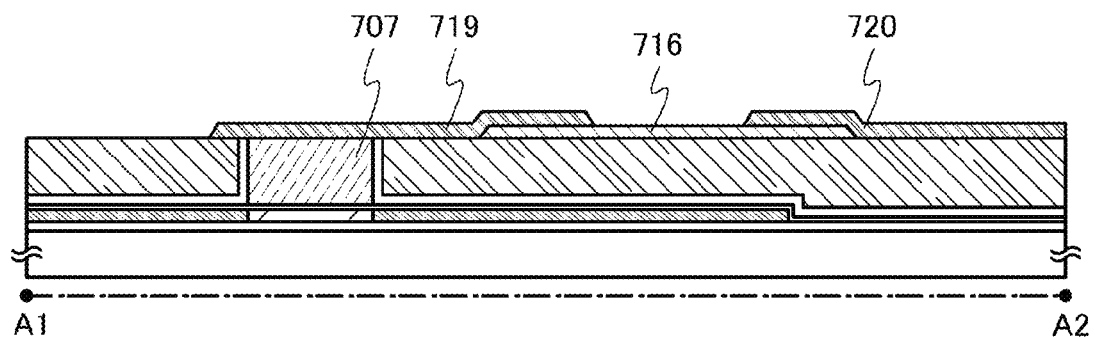
FIGS. 12A to 12C illustrate a manufacturing process of a storage circuit.

Next, as illustrated in FIG. 12A, the conductive film 719 which is in contact with the gate electrode 707 and the oxide semiconductor layer 716, and the conductive film 720 which is in contact with the oxide semiconductor layer 716 are formed. The conductive film 719 and the conductive film 720 function as a source and drain electrodes.

Specifically, the conductive film 719 and the conductive film 720 can be formed in such a manner that a conductive film is formed by a sputtering method or a vacuum evaporation method so as to cover the gate electrode 707 and the insulating film 713, and then the conductive film is processed (patterned) into a predetermined shape.

As the conductive film for forming the conductive films 719 and 720, any of the following materials can be used: an element selected from aluminum, chromium, copper, tantalum, titanium, molybdenum, or tungsten; an alloy containing any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to prevent a heat resistance problem and a corrosive problem. As the refractory metal material, molybdenum, titanium, chromium, tantalum, tungsten, neodymium, scandium, yttrium, or the like can be used.

Further, the conductive film for forming the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in this order, and the like can be given. A Cu—Mg—Al alloy, a Mo—Ti alloy, Ti, and Mo have high adhesiveness with an oxide film. Therefore, for the conductive films 719 and 720, a layered structure is employed in which a conductive film containing a Cu—Mg—Al alloy, a Mo—Ti alloy, Ti, or Mo is used for the lower layer and a conductive film containing Cu is used for the upper layer; thus, the adhesiveness between an insulating film which is an oxide film and the conductive films 719 and 720 can be increased.

For the conductive film for forming the conductive films 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that the material and etching conditions are adjusted as appropriate so that the oxide semiconductor layer 716 is not removed in etching of the conductive film as much as possible. Depending on the etching conditions, there are some cases in which an exposed portion of the oxide semiconductor layer 716 is partially etched and thus a groove (a depression portion) is formed.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of the process can be realized.

Further, an oxide conductive film functioning as a source region and a drain region may be provided between the oxide semiconductor layer 716 and the conductive films 719 and 720 functioning as a source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 719 and 720 may be performed concurrently.

By providing the oxide conductive film functioning as a source region and a drain region, the resistance between the oxide semiconductor layer 716 and the conductive films 719 and 720 can be lowered, so that the transistor can operate at high speed. In addition, by providing the oxide conductive film functioning as a source region and a drain region, the withstand voltage of the transistor can be increased.

Next, plasma treatment may be performed using a gas such as $N_2O$, $N_2$, or Ar. Through this plasma treatment, water or the like adhering to an exposed surface of the oxide semiconductor layer is removed. Plasma treatment may be performed using a mixture gas of oxygen and argon.

Figure 12B:
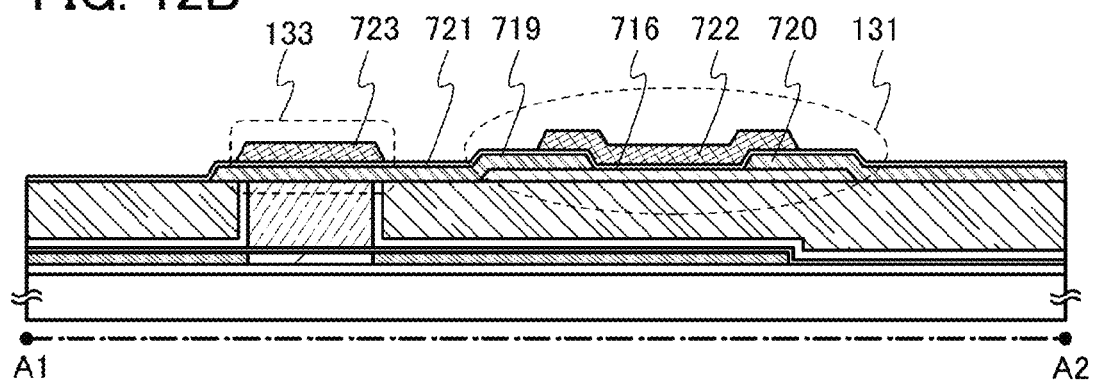

After the plasma treatment, as illustrated in FIG. 12B, the gate insulating film 721 is formed so as to cover the conductive films 719 and 720 and the oxide semiconductor layer 716. Then, a gate electrode 722 is formed over the gate insulating film 721 so as to overlap with the oxide semiconductor layer 716, and a conductive film 723 is formed over the gate insulating film 721 so as to overlap with the conductive film 719.

The gate insulating film 721 can be formed using a material and a layered structure which are similar to those of the gate insulating film 703. Note that the gate insulating film 721 preferably includes impurities such as moisture and hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having a lower proportion of nitrogen such as a silicon oxide film or a silicon oxynitride film is formed on the side closer to the oxide semiconductor layer 716 than the insulating film having a high barrier property. Then, the insulating film having a high barrier property is formed so as to overlap with the conductive films 719 and 720 and the oxide semiconductor layer 716 with the insulating film having a lower proportion of nitrogen sandwiched therebetween. When the insulating film having a high barrier property is used, impurities such as moisture and hydrogen can be prevented from entering the oxide semiconductor layer 716, the gate insulating film 721, or the interface between the oxide semiconductor layer 716 and another insulating film and the vicinity thereof. In addition, the insulating film having a lower proportion of nitrogen such as a silicon oxide film or a silicon oxynitride film formed in contact with the oxide semiconductor layer 716 can prevent the insulating film formed using a material having a high barrier property from being in direct contact with the oxide semiconductor layer 716.

In this embodiment, the gate insulating film 721 with a structure in which a 100-nm-thick silicon nitride film formed by a sputtering method is stacked over a 200-nm-thick silicon oxide film formed by a sputtering method is formed. The substrate temperature in film formation may be higher than or equal to room temperature and lower than or equal to 300° C. and in this embodiment, is 100° C.

After the gate insulating film 721 is formed, heat treatment may be performed. The heat treatment is performed in a nitrogen atmosphere, an atmosphere of ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. The water content in the gas is preferably 20 ppm or less, more preferably 1 ppm or less, further preferably 10 ppb or less. For example, heat treatment is performed at 250° C. for one hour in a nitrogen atmosphere in this embodiment. Alternatively, RTA treatment for a short time at a high temperature may be performed before the formation of the conductive films 719 and 720 in a manner similar to that of the heat treatment performed on the oxide semiconductor layer for reduction of moisture or hydrogen. Even when oxygen deficiency is generated in the oxide semiconductor layer 716 by the previous heat treatment performed on the oxide semiconductor layer 716, oxygen is supplied to the oxide semiconductor layer 716 from the gate insulating film 721 by performing heat treatment after providing the gate insulating film 721 containing oxygen. By supplying oxygen to the oxide semiconductor layer 716, oxygen deficiency that serves as a donor can be reduced in the oxide semiconductor layer 716 and the stoichiometric ratio can be satisfied. It is preferable that the proportion of oxygen in the oxide semiconductor layer 716 be higher than that in the stoichiometric composition. As a result, the oxide semiconductor layer 716 can be made to be substantially i-type and variation in electrical characteristics of the transistor due to oxygen deficiency can be reduced; thus, electrical characteristics can be improved. The timing of this heat treatment is not particularly limited as long as it is after the formation of the gate insulating film 721. When this heat treatment doubles as another step such as heat treatment for formation of a resin film or heat treatment for reduction of the resistance of a transparent conductive film, the oxide semiconductor layer 716 can be made to be substantially i-type without the number of steps increased.

Moreover, the oxygen deficiency that serves as a donor in the oxide semiconductor layer 716 may be reduced by subjecting the oxide semiconductor layer 716 to heat treatment in an oxygen atmosphere so that oxygen is added to the oxide semiconductor. The heat treatment is performed at a temperature higher than or equal to 100° C. and lower than 350° C., preferably higher than or equal to 150° C. and lower than 250° C., for example. It is preferable that an oxygen gas used for the heat treatment in an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like to reduce oxygen deficiency serving as a donor. For example, oxygen which is made into a plasma state with a microwave at 2.45 GHz may be added to the oxide semiconductor layer 716.

The gate electrode 722 and the conductive film 723 can be formed in such a manner that a conductive film is formed over the gate insulating film 721 and then is patterned. The gate electrode 722 and the conductive film 723 can be formed using a material similar to that of the gate electrode 707 or the conductive films 719 and 720.

The thickness of each of the gate electrode 722 and the conductive film 723 is 10 nm to 400 nm, preferably 100 nm to 200 nm. In this embodiment, after a conductive film for the gate electrode is formed to a thickness of 150 nm by a sputtering method using a tungsten target, the conductive film is processed (patterned) into a desired shape by etching, whereby the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the first transistor 131 is formed.

Note that a portion where the conductive film 719 and the conductive film 723 overlap with each other with the gate insulating film 721 provided therebetween corresponds to the capacitor 133.

Although the first transistor 131 is described as a single-gate transistor, a multi-gate transistor including a plurality of channel formation regions can be manufactured when a plurality of gate electrodes electrically connected to each other are included, if needed.

Note that an insulating film in contact with the oxide semiconductor layer 716 (which corresponds to the gate insulating film 721 in this embodiment) may be formed using an insulating material containing a Group 13 element and oxygen. Many of oxide semiconductor materials contain a Group 13 element, and an insulating material containing a Group 13 element works well with oxide semiconductors. By using an insulating material containing a Group 13 element for an insulating film in contact with the oxide semiconductor layer, an interface with the oxide semiconductor layer can keep a favorable state.

An insulating material containing a Group 13 element refers to an insulating material containing one or more Group 13 elements. As the insulating material containing a Group 13 element, gallium oxide, aluminum oxide, aluminum gallium oxide, gallium aluminum oxide, or the like can be given as an example. Here, in aluminum gallium oxide, the amount of aluminum is larger than that of gallium in atomic percent, and in gallium aluminum oxide, the amount of gallium is larger than or equal to that of aluminum in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pileup of hydrogen at the interface between the oxide semiconductor layer and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water into the oxide semiconductor layer.

The insulating material of the insulating film in contact with the oxide semiconductor layer 716 is preferably made to contain oxygen in a proportion higher than that in the stoichiometric composition by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes oxygen plasma doping in which oxygen which is made to be plasma is added to a bulk. The oxygen doping may be performed by an ion implantation method or an ion doping method.

For example, in the case where the insulating film in contact with the oxide semiconductor layer 716 is formed using gallium oxide, the composition of gallium oxide can be set to be $Ga_2O_x$ ($x=3+a$, $0<a<1$) by heat treatment in an oxygen atmosphere or by oxygen doping.

In the case where the insulating film in contact with the oxide semiconductor layer 716 is formed using aluminum oxide, the composition of aluminum oxide can be set to be $Al_2O_x$ ($x=3+a$, $0<a<1$) by heat treatment in an oxygen atmosphere or by oxygen doping.

In the case where the insulating film in contact with the oxide semiconductor layer 716 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

Note that the insulating film which includes a region where the proportion of oxygen is higher than that in the stoichiometric composition may be applied to either the insulating film located on the upper side of the oxide semiconductor layer 716 or the insulating film located on the lower side of the oxide semiconductor layer 716 of the insulating films in contact with the oxide semiconductor layer 716; however, it is preferable to apply such an insulating film to both of the insulating films in contact with the oxide semiconductor layer 716. The above-described effect can be enhanced with a structure where the oxide semiconductor layer 716 is sandwiched between the insulating films each including a region where the proportion of oxygen is higher than that in the stoichiometric composition, which are used as the insulating films in contact with the oxide semiconductor layer 716 and located on the upper side and the lower side of the oxide semiconductor layer 716.

The insulating films on the upper side and the lower side of the oxide semiconductor layer 716 may contain the same constituent elements or different constituent elements. For example, the insulating films on the upper side and the lower side may be both formed using gallium oxide whose composition is $Ga_2O_x$ ($x=3+a$, $0<a<1$). Alternatively, one of the insulating films on the upper side and the lower side may be formed using $Ga_2O_x$ ($x=3+a$, $0<a<1$) and the other may be formed using aluminum oxide whose composition is $Al_2O_x$ ($x=3+a$, $0<a<1$).

The insulating film in contact with the oxide semiconductor layer 716 may be formed by stacking insulating films each including a region where the proportion of oxygen is higher than that in the stoichiometric composition. For example, the insulating film on the upper side of the oxide semiconductor layer 716 may be formed as follows: gallium oxide whose composition is $Ga_2O_x$ ($x=3+a$, $0<a<1$) is formed and gallium aluminum oxide (aluminum gallium oxide) whose composition is $Ga_xAl_{2-x}O_{3+a}$ ($0<x<2$, $0<a<1$) is formed thereover. Note that the insulating film on the lower side of the oxide semiconductor layer 716 may be formed by stacking insulating films each including a region where the proportion of oxygen is higher than that in the stoichiometric composition. Further, both of the insulating films on the upper side and the lower side of the oxide semiconductor layer 716 may be formed by stacking insulating films each including a region where the proportion of oxygen is higher than that in the stoichiometric composition.

Figure 12C:
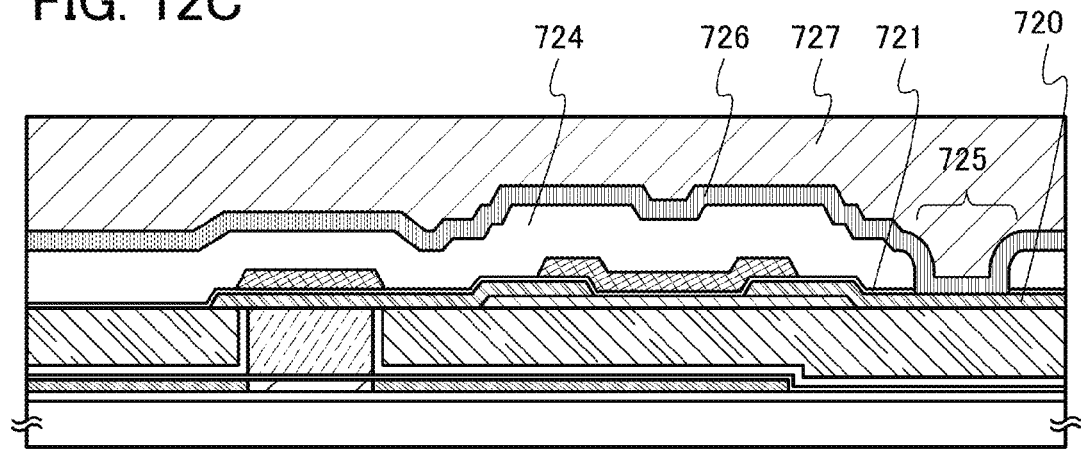

Next, as illustrated in FIG. 12C, an insulating film 724 is formed so as to cover the gate insulating film 721 and the gate electrode 722. The insulating film 724 can be formed by a PVD method, a CVD method, or the like. The insulating film 724 can be formed using a material containing an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, the parasitic capacitance generated between wirings or electrodes can be reduced, which results in higher speed operation. Note that although the insulating film 724 has a single-layer structure in this embodiment, one embodiment of the present invention is not limited to this. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

The wiring 726 is formed in such a manner that a conductive film is formed by a PVD method or a CVD method and then the conductive film is patterned. As a material of the conductive film, an element selected from aluminum, chromium, copper, tantalum, titanium, molybdenum, or tungsten, an alloy containing any of these elements as a component, or the like can be used. Any of manganese, magnesium, zirconium, beryllium, neodymium, and scandium, or a material containing any of these in combination may be used.

Specifically, for example, it is possible to employ a method in which a thin titanium film is formed in a region including the opening of the insulating film 724 by a PVD method and a thin titanium film (with a thickness of about 5 nm) is formed by a PVD method, and then, an aluminum film is formed so as to be embedded in the opening 725. Here, the titanium film formed by a PVD method has a function of reducing an oxide film (e.g., a natural oxide film) formed on a surface where the titanium film is formed, to decrease contact resistance with a lower electrode (here, the conductive film 720). In addition, hillock of the aluminum film can be prevented. A copper film may be formed by a plating method after the formation of the barrier film of titanium, titanium nitride, or the like.

Here, the case where the conductive film 720 and the wiring 726 are connected to each other is described. In this case, after the conductive film 720 is formed, an opening is formed in a region overlapping with an opening in the lower portion in the gate insulating film 721 and the insulating film 724, and then the wiring 726 is formed.

Next, an insulating film 727 is formed so as to cover the wiring 726. Through the series of steps, the storage circuit can be manufactured.

Note that in the manufacturing method, the conductive films 719 and 720 functioning as a source and drain electrodes are formed after the formation of the oxide semiconductor layer 716. Thus, as illustrated in FIG. 12B, in the first transistor 131 obtained by the manufacturing method, the conductive films 719 and 720 are formed over the oxide semiconductor layer 716. However, in the first transistor 131, the conductive films functioning as a source and drain electrodes may be formed below the oxide semiconductor layer 716, that is, between the oxide semiconductor layer 716 and the insulating films 712 and 713.

Figure 13:
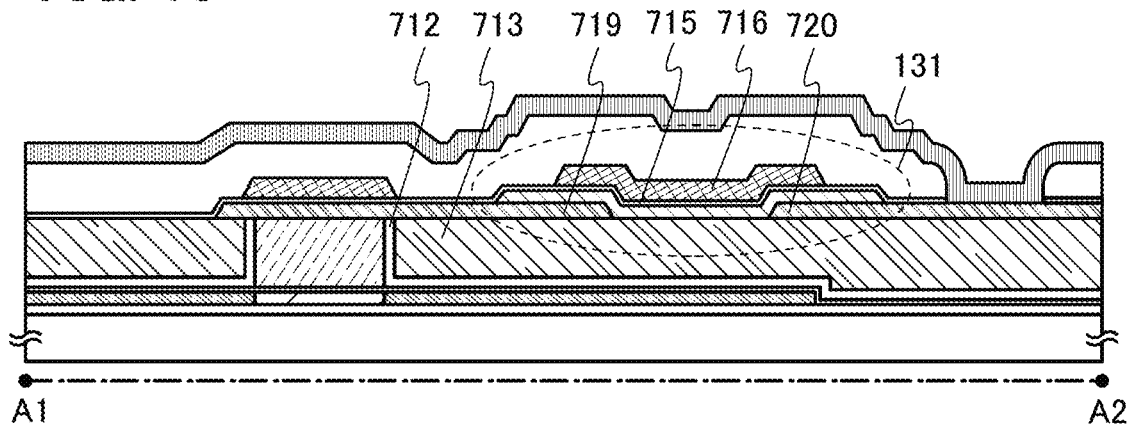
FIG. 13 is a cross-sectional view illustrating a structure of a storage circuit.

FIG. 13 is a cross-sectional view of the first transistor 131 in the case where the conductive films 719 and 720 functioning as a source and drain electrodes are provided between the oxide semiconductor layer 716 and the insulating films 712 and 713. The first transistor 131 illustrated in FIG. 13 can be obtained in such a manner that the conductive films 719 and 720 are formed after the formation of the insulating film 713, and then, the oxide semiconductor layer 716 is formed.

This embodiment can be implemented in combination with any of the above embodiments.

Embodiment 6

In this embodiment, the oxide used for the oxide semiconductor layer in Embodiment 5 will be described. The oxide includes a crystal with c-axis alignment (also referred to as c-axis aligned crystal (CAAC)), which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 15A to 15E, FIGS. 16A to 16C, and FIGS. 17A to 17C. In FIGS. 15A to 15E, FIGS. 16A to 16C, and FIGS. 17A to 17C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 15A to 15E, O surrounded by a circle represents tetracoordinate O and O surrounded by a double circle represents tricoordinate O.

Figure 15A:
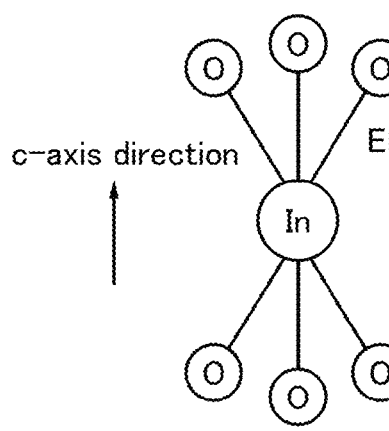
FIGS. 15A to 15E illustrate structures of oxide materials.

FIG. 15A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 15A is actually an octahedral structure, but is illustrated as a planar structure for simplicity. Note that three tetracoordinate O atoms exist in each of an upper half and a lower half in FIG. 15A. In the small group illustrated in FIG. 15A, electric charge is 0.

Figure 15D:
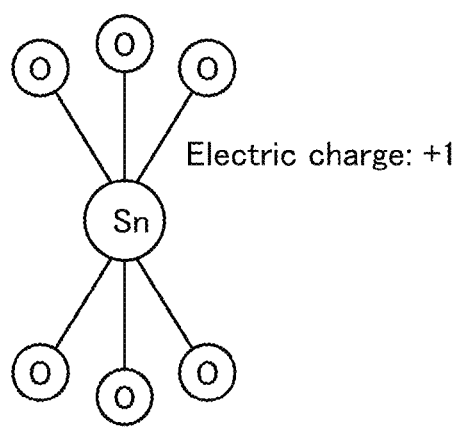
Figure 15B:
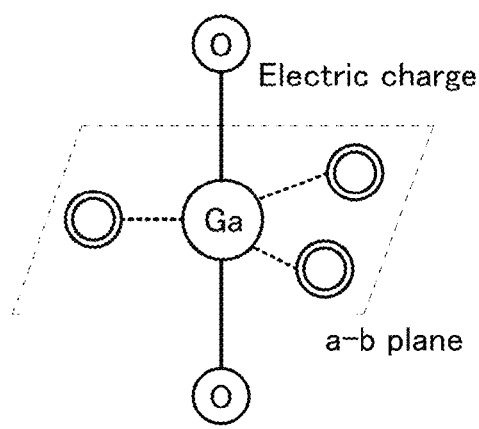

FIG. 15B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate atoms exist on the a-b plane. One tetracoordinate O atom exists in each of an upper half and a lower half in FIG. 15B. An In atom can also have the structure illustrated in FIG. 15B because an In atom can have five ligands. In the small group illustrated in FIG. 15B, electric charge is 0.

Figure 15E:
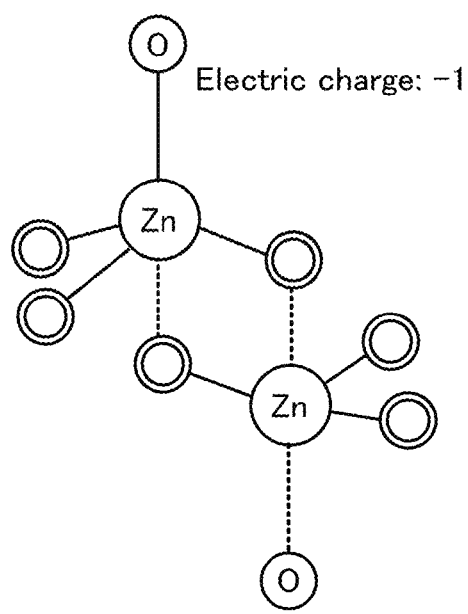
Figure 15C:
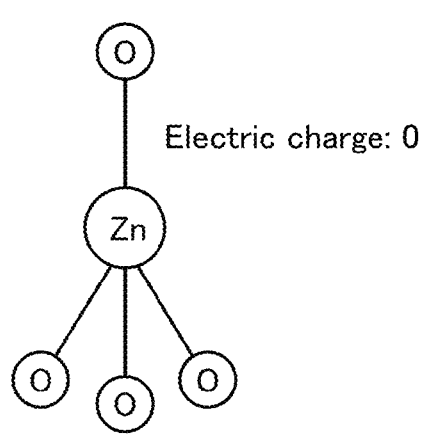

FIG. 15C illustrates a structure including one tetracoordinate Zn atom and four tetracoordinate O atoms proximate to the Zn atom. In FIG. 15C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 15C. In the small group illustrated in FIG. 15C, electric charge is 0.

FIG. 15D illustrates a structure including one hexacoordinate Sn atom and six tetracoordinate O atoms proximate to the Sn atom. In FIG. 15D, three tetracoordinate O atoms exist in each of an upper half and a lower half. In the small group illustrated in FIG. 15D, electric charge is +1.

FIG. 15E illustrates a small group including two Zn atoms. In FIG. 15E, one tetracoordinate O atom exists in each of an upper half and a lower half. In the small group illustrated in FIG. 15E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 15A each have three proximate In atoms in the downward direction, and the three O atoms in the lower half each have three proximate In atoms in the upward direction. The one O atom in the upper half with respect to the pentacoordinate Ga atom in FIG. 15B has one proximate Ga atom in the downward direction, and the one O atom in the lower half has one proximate Ga atom in the upward direction. The one O atom in the upper half with respect to the tetracoordinate Zn atom in FIG. 15C has one proximate Zn atom in the downward direction, and the three O atoms in the lower half each have three proximate Zn atoms in the upward direction.

In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4.

Accordingly, when the sum of the number of tetracoordinate O atoms above a metal atom and the number of tetracoordinate O atoms below another metal atom is 4, the two kinds of small groups including the metal atoms can be bonded. The reason will be described hereinafter.

For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 16A illustrates a model of a medium group included in a layered structure of an In—Sn—Zn—O-based material. FIG. 16B illustrates a large group including three medium groups. Note that FIG. 16C illustrates an atomic arrangement in the case where the layered structure in FIG. 16B is observed from the c-axis direction.

In FIG. 16A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 16A, one tetracoordinate O atom existing in each of an upper half and a lower half with respect to an In atom is denoted by circled 1. FIG. 16A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 16A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 15E can be given. For example, with one small group including two Zn atoms, electric charge of one small group including a Sn atom can be cancelled, so that the total electric charge of the layered structure can be 0.

When the large group illustrated in FIG. 16B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 17A illustrates a model of a medium group included in a layered structure of an In—Ga—Zn—O-based material.

In the medium group included in the layered structure of the In—Ga—Zn—O-based material in FIG. 17A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded, so that a large group is formed.

FIG. 17B illustrates a large group including three medium groups. Note that FIG. 17C illustrates an atomic arrangement in the case where the layered structure in FIG. 17B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 17A but also a medium group in which the arrangement of the In atom, the Ga atom, and the Zn atom is different from that in FIG. 17A.

Embodiment 7

In this embodiment, characteristics of a transistor will be described.

The actually measured field-effect mobility of an insulated gate transistor can be lower than its original mobility because of a variety of reasons; this phenomenon occurs not only in the case of using a transistor whose channel is formed in an oxide semiconductor layer. One of the reasons that reduce the mobility is a defect inside a semiconductor or a defect at the interface between the semiconductor and an insulating film. When a Levinson model is used, the field-effect mobility that is based on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility $\mu$ can be expressed as the following formula.

$$\mu = \mu_0 \exp\left(-\frac{E}{kT}\right) \qquad [\text{Formula 2}]$$

Here, E represents the height of the potential barrier, k represents the Boltzmann constant, and T represents the absolute temperature. When the potential barrier is assumed to be attributed to a defect, the height E of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad [\text{Formula 3}]$$

Here, e represents the elementary charge, N represents the average defect density per unit area in a channel, ∈ represents the permittivity of the semiconductor, n represents the number of carriers per unit area in the channel, $C_{ox}$ represents the capacitance per unit area, $V_g$ represents the gate voltage, and t represents the thickness of the channel. Note that in the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \qquad [\text{Formula 4}]$$

Here, L represents the channel length and W represents the channel width, and L and W are each 10 mm. Further, $V_d$ represents the drain voltage. When dividing both sides of the above equation by $V_g$ and then taking logarithms of both sides, the following formula can be obtained.

$$\ln\left(\frac{I_d}{V_g}\right) = $$  [Formula 5]

$$\ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, $\mu_0$ can be calculated to be 120 cm²/Vs from Formula 2 and Formula 3. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at the interface between a channel and a gate insulating film adversely affects the transport property of the transistor. In other words, the mobility $\mu_1$ at a position that is distance x away from the interface between the channel and the gate insulating film can be expressed as the following formula.

$$\frac{1}{\mu_1} = \frac{1}{\mu_0} + \frac{D}{B}\exp\left(-\frac{x}{G}\right)$$  [Formula 6]

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 18:
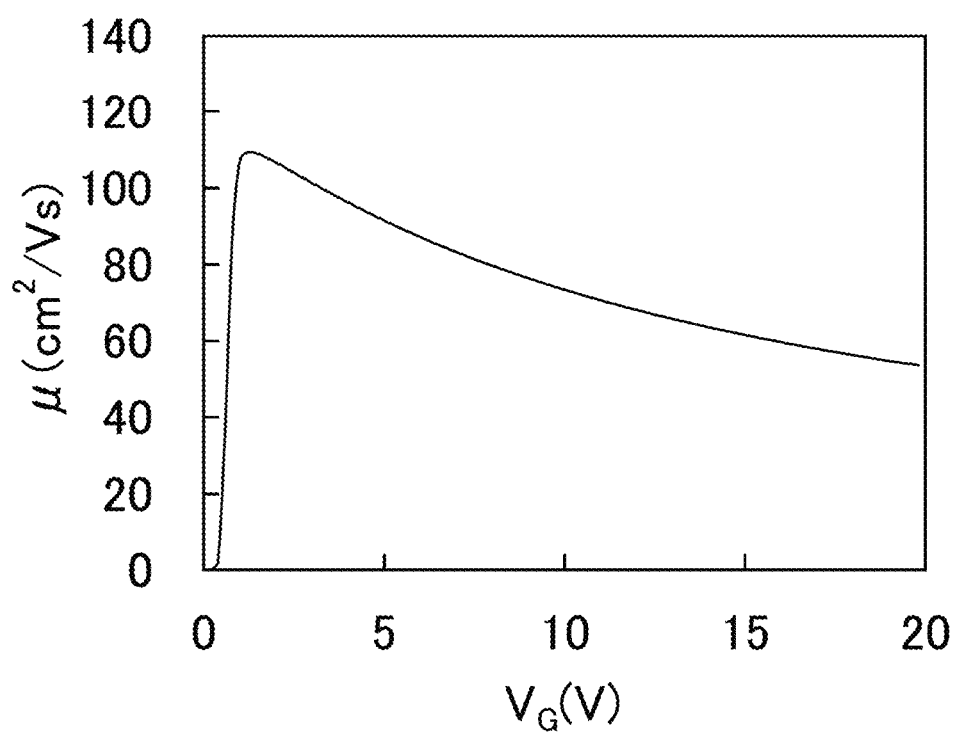
FIG. 18 shows gate voltage dependence of mobility obtained by calculation.

FIG. 18 shows calculation results of the mobility $\mu_2$ of a transistor whose channel is formed using an ideal oxide semiconductor without a defect inside the semiconductor. For the calculation, device simulation software Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 18, the mobility has a peak of 100 cm²/Vs or more at a gate voltage that is a little over 1 V, and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors formed using an oxide semiconductor having such a mobility are shown in FIGS. 19A to 19C, FIGS. 20A to 20C, and FIGS. 21A to 21C. FIGS. 22A and 22B illustrate cross-sectional structures of the transistors used for the calculation.

The transistors illustrated in FIGS. 22A and 22B each include a semiconductor region (also referred to as impurity region) 1103a and a semiconductor region (also referred to as impurity region) 1103c that have n⁺-type conductivity in an oxide semiconductor layer. The resistivity of the semiconductor regions 1103a and 1103c is $2 \times 10^{-3}$ Ωcm.

The transistor in FIG. 22A is formed over a base insulating layer 1101 and an embedded insulator 1102 that is embedded in the base insulating layer 1101 and formed of aluminum oxide. The transistor includes the semiconductor region 1103a, the semiconductor region 1103c, an intrinsic semiconductor region 1103b that is placed between the semiconductor regions 1103a and 1103c and serves as a channel formation region, and a gate electrode 1105. The width of the gate electrode 1105 is 33 nm.

A gate insulating film 1104 is formed between the gate electrode 1105 and the semiconductor region 1103b. A sidewall insulator 1106a and a sidewall insulator 1106b are formed on both side surfaces of the gate electrode 1105, and an insulator 1107 is formed over the gate electrode 1105 so as to prevent a short circuit between the gate electrode 1105 and another wiring. The sidewall insulator has a width of 5 nm. A conductive film 1108a serving as a source electrode and a conductive film 1108b serving as a drain electrode are provided in contact with the semiconductor region 1103a and the semiconductor region 1103c, respectively. Note that the channel width of this transistor is 40 nm.

The transistor in FIG. 22B is the same as the transistor in FIG. 22A in that it is formed over the base insulating layer 1101 and the embedded insulator 1102 formed of aluminum oxide and that it includes the semiconductor region 1103a, the semiconductor region 1103c, the intrinsic semiconductor region 1103b provided therebetween, the gate electrode 1105 having a width of 33 nm, the gate insulating film 1104, the sidewall insulator 1106a, the sidewall insulator 1106b, the insulator 1107, the conductive film 1108a, and the conductive film 1108b.

The difference between the transistor in FIG. 22A and the transistor in FIG. 22B is the conductivity type of semiconductor regions under the sidewall insulators 1106a and 1106b. In the transistor in FIG. 22A, the semiconductor regions under the sidewall insulator 1106a and the sidewall insulator 1106b are part of the semiconductor region 1103a having n⁺-type conductivity and part of the semiconductor region 1103c having n⁺-type conductivity, whereas in the transistor in FIG. 22B, the semiconductor regions under the sidewall insulator 1106a and the sidewall insulator 1106b are part of the intrinsic semiconductor region 1103b. In other words, in the semiconductor layer of FIG. 22B, a region having a width of $L_{off}$ which overlaps with neither the semiconductor region 1103a (the semiconductor region 1103c) nor the gate electrode 1105 is provided. This region is called an offset region, and the width $L_{off}$ is called an offset length. As is seen from the drawing, the offset length is equal to the width of the sidewall insulator 1106a (the sidewall insulator 1106b).

The other parameters used in calculation are as described above. For the calculation, device simulation software Sentaurus Device manufactured by Synopsys, Inc. was used.

Figure 19A:
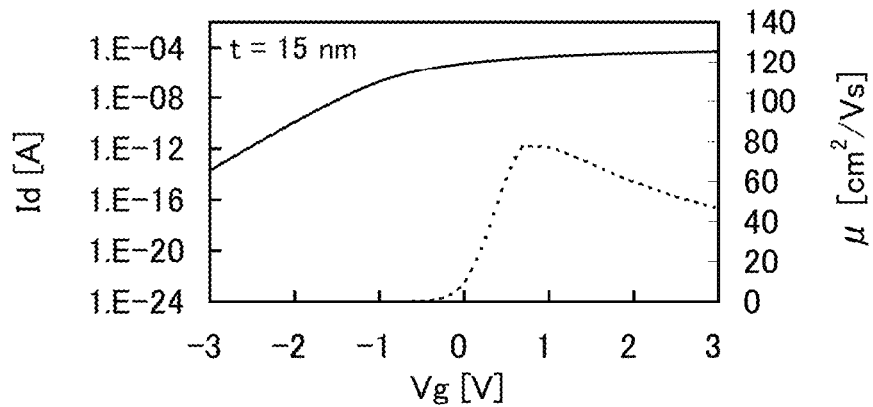
FIGS. 19A to 19C each show gate voltage dependence of drain current and mobility obtained by calculation.
Figure 19B:
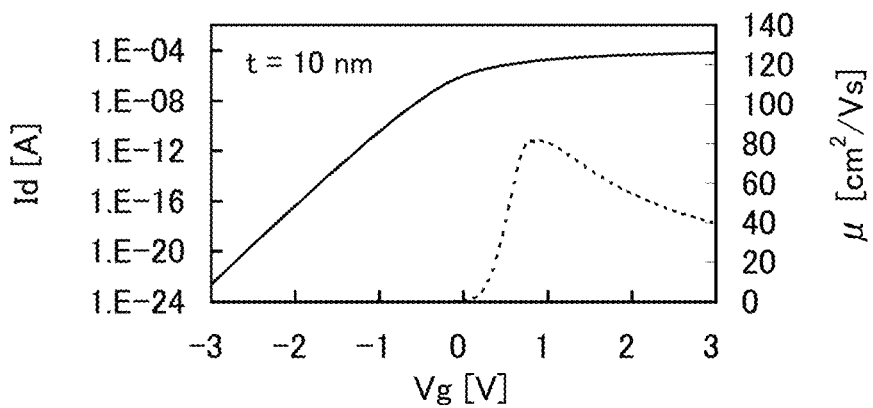
Figure 19C:
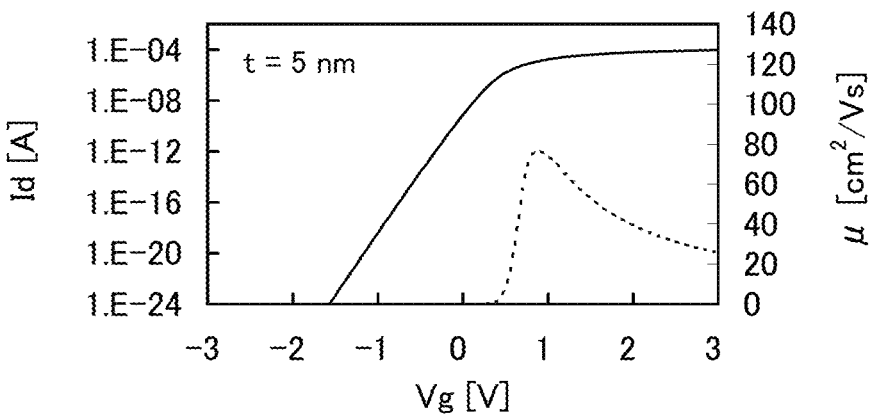

FIGS. 19A to 19C show the gate voltage ($V_g$: a potential difference between the gate and the source) dependence of the drain current ($I_d$, a solid line) and the mobility (μ, a dotted line) of the transistor having the structure illustrated in FIG. 22A. The drain current $I_d$ is obtained by calculation under the assumption that the drain voltage (a potential difference between the drain and the source) is +1 V, and the mobility μ is obtained by calculation under the assumption that the drain voltage is +0.1 V.

FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 nm. As the gate insulating film is thinner, the drain current $I_d$ in an off state (the off-state current) in particular is significantly decreased. In contrast, there is no noticeable change in peak value of the mobility μ and the drain current $I_d$ in an on state (the on-state current). The graphs show that the drain current exceeds 10 μA, which is required in a memory element and the like, at a gate voltage of around 1 V.

Figure 20A:
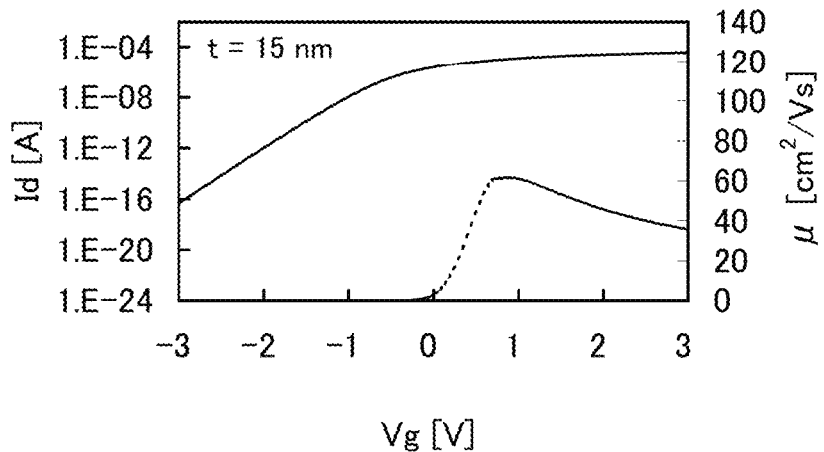
FIGS. 20A to 20C each show gate voltage dependence of drain current and mobility obtained by calculation.
Figure 20B:
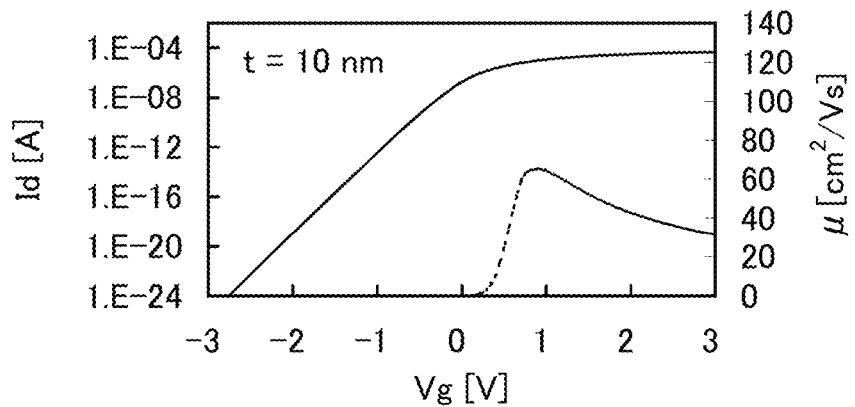
Figure 20C:
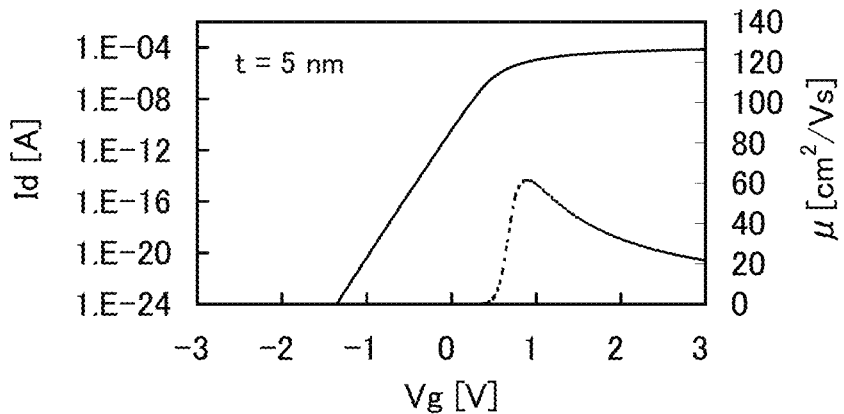

FIGS. 20A to 20C show the gate voltage $V_g$ dependence of the drain current $I_d$ (a solid line) and the mobility (a dotted line) of the transistor having the structure in FIG. 22B and an offset length $L_{off}$ of 5 nm. The drain current $I_d$ is obtained by calculation under the assumption that the drain voltage $V_d$ is +1 V and the mobility μ is obtained by calculation under the assumption that the drain voltage is +0.1 V. FIG. 20A shows the gate voltage dependence of the transistor in the case where the thickness of the gate insulating film is 15 nm, FIG. 20B shows that of the transistor in the case where the thickness of the gate insulating film is 10 nm, and FIG. 20C shows that of the transistor in the case where the thickness of the gate insulating film is 5 nm.

Figure 21A:
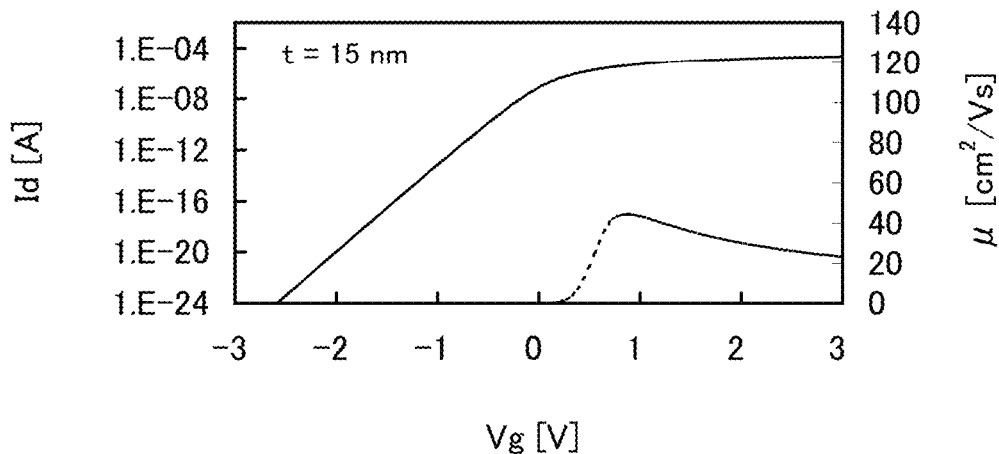
FIGS. 21A to 21C each show gate voltage dependence of drain current and mobility obtained by calculation.
Figure 21B:
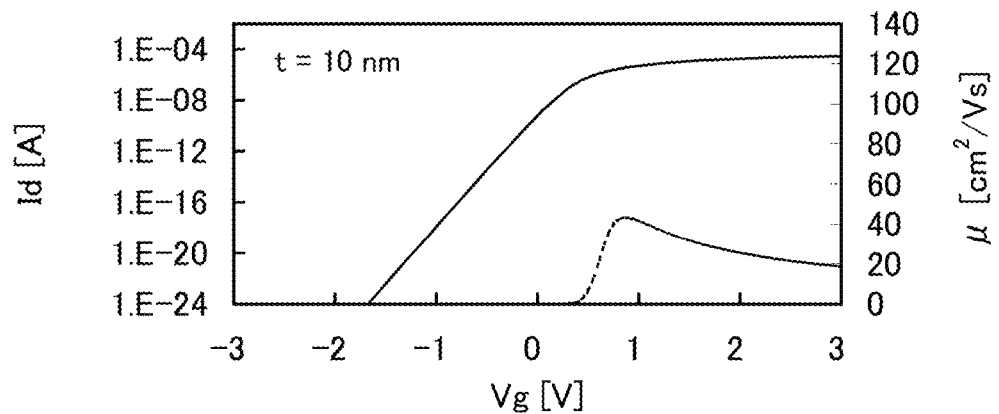
Figure 21C:
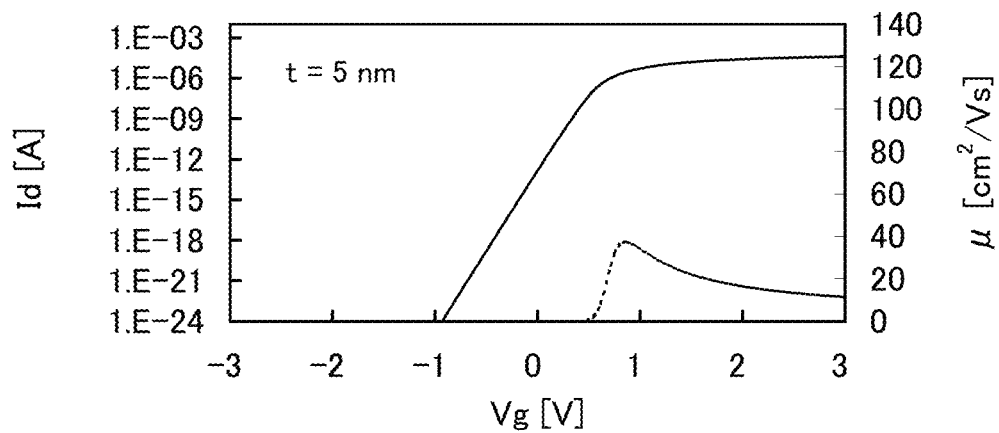
Figure 22A:
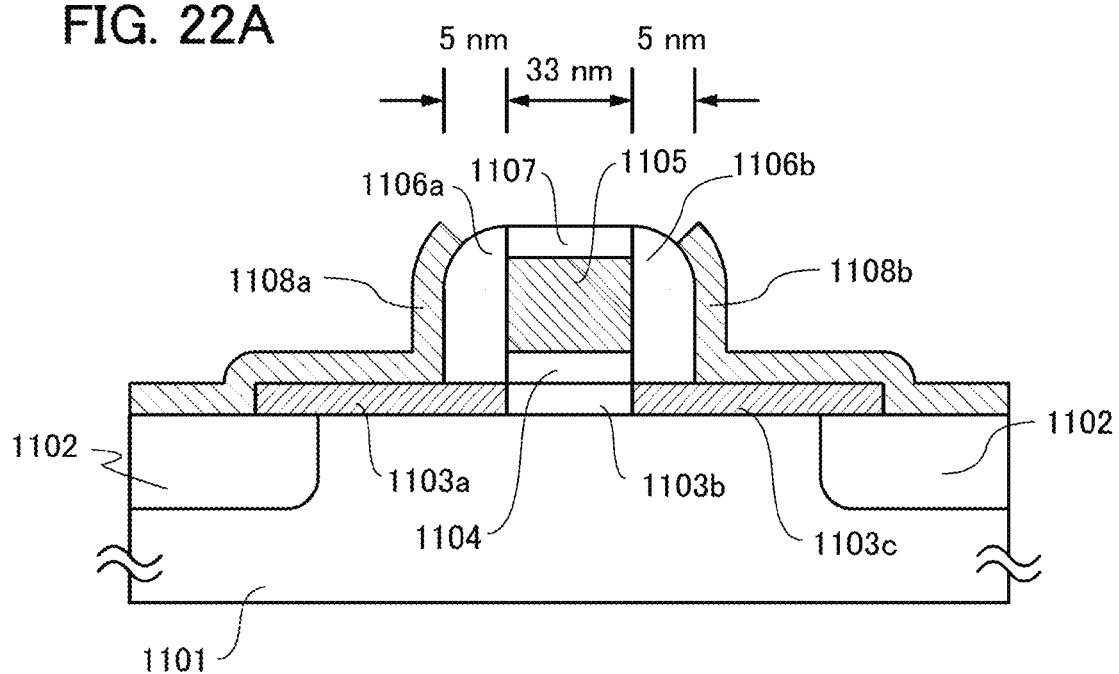
FIGS. 22A and 22B illustrate cross-sectional structures of transistors used for calculation.
Figure 22B:
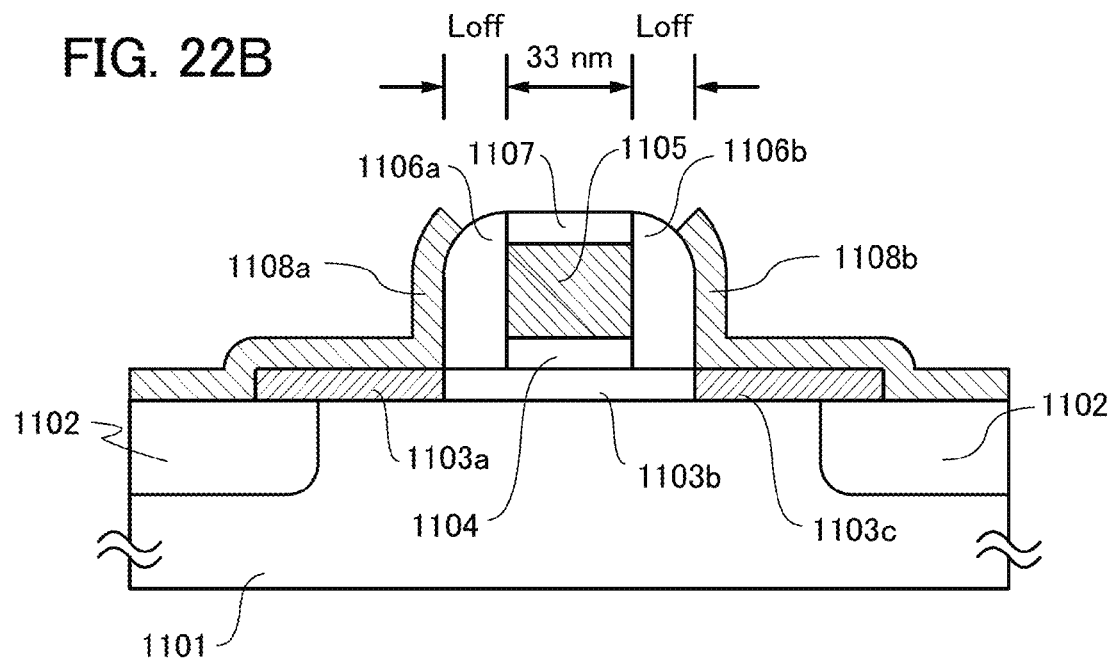

FIGS. 21A to 21C show the gate voltage dependence of the drain current $I_d$ (a solid line) and the mobility μ (a dotted line) of the transistor having the structure in FIG. 22B and an offset length $L_{off}$ of 15 nm. The drain current $I_d$ is obtained by calculation under the assumption that the drain voltage $V_d$ is +1 V, and the mobility μ is obtained by calculation under the assumption that the drain voltage $V_d$ is +0.1 V. FIG. 21A shows the gate voltage dependence of the transistor in the case where the thickness of the gate insulating film is 15 nm, FIG. 21B shows that of the transistor in the case where the thickness of the gate insulating film is 10 nm, and FIG. 21C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 $cm^2/Vs$ in FIGS. 19A to 19C, approximately 60 $cm^2/Vs$ in FIGS. 20A to 20C, and approximately 40 $cm^2/Vs$ in FIGS. 21A to 21C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Embodiment 8

In this embodiment, a transistor in which an oxide semiconductor containing In, Sn, and Zn as main components is used for a channel formation region will be described.

A transistor in which an oxide semiconductor film containing In, Sn, and Zn as main components is used for a channel formation region can have favorable characteristics by depositing the oxide semiconductor film while heating a substrate or by performing heat treatment after the oxide semiconductor film is formed. Note that a main component refers to an element included in a composition at 5 atomic % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 23A:
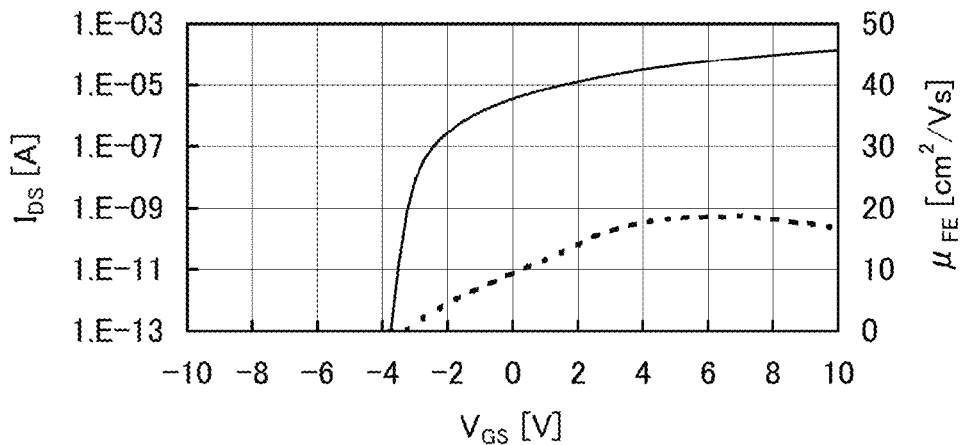
FIGS. 23A to 23C are graphs showing characteristics of transistors each including an oxide semiconductor film.
Figure 23B:
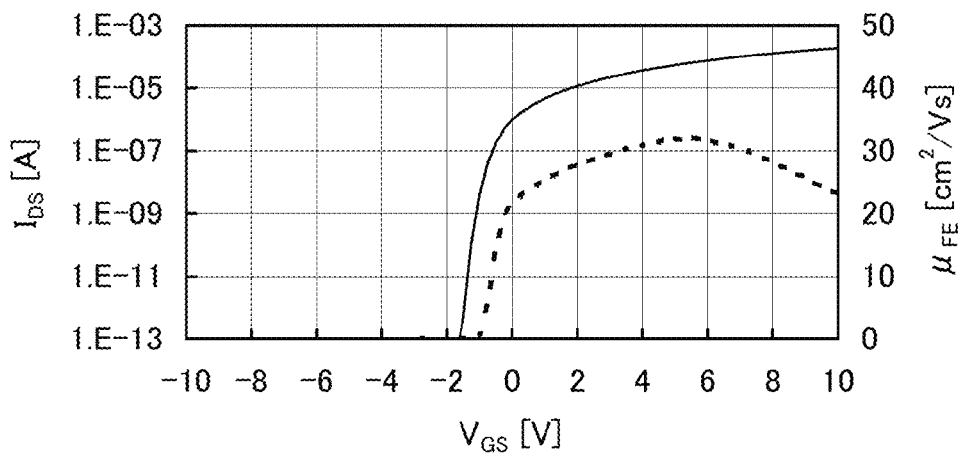
Figure 23C:
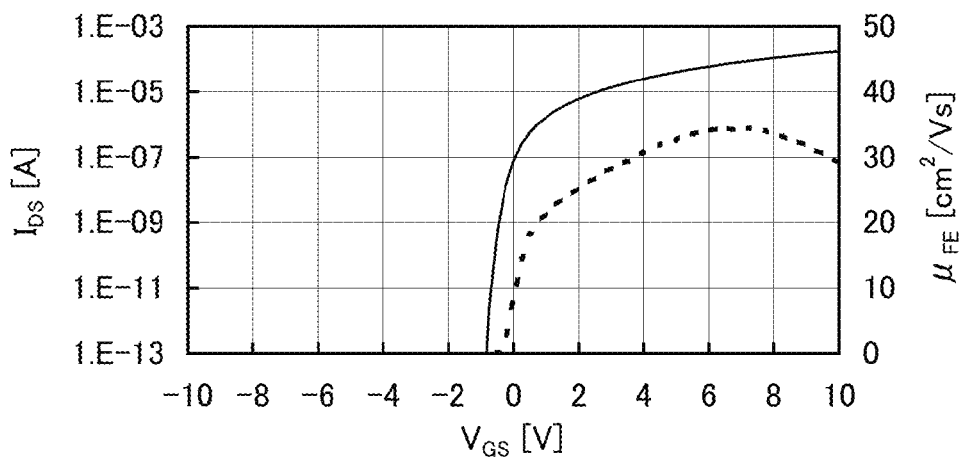

As an example, FIGS. 23A to 23C are graphs each showing characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 23A is a graph showing characteristics of a transistor whose oxide semiconductor film containing In, Sn, and Zn as main components was formed by a sputtering method without heating a substrate intentionally. The field-effect mobility t of the transistor was 18.8 $cm^2/Vsec$. On the other hand, when the oxide semiconductor film containing In, Sn, and Zn as main components is formed while heating the substrate intentionally, the field-effect mobility can be improved.

FIG. 23B shows characteristics of a transistor whose oxide semiconductor film containing In, Sn, and Zn as main components was formed while heating a substrate at 200° C. The field-effect mobility of the transistor was 32.2 $cm^2/Vsec$.

The field-effect mobility can be further improved by performing heat treatment after formation of the oxide semiconductor film containing In, Sn, and Zn as main components.

FIG. 23C shows characteristics of a transistor whose oxide semiconductor film containing In, Sn, and Zn as main components was formed by sputtering at 200° C. and then subjected to heat treatment at 650° C. The field-effect mobility of the transistor was 34.5 $cm^2/Vsec$.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 $cm^2/Vsec$ is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film which contains In, Sn, and Zn as main components and is formed without heating a substrate intentionally is used as a channel formation region, the threshold voltage tends to be shifted negatively.

However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 23A and 23B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be achieved by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, $V_{gs}$ of 20 V was applied so that the intensity of an electric field applied to the gate insulating film was 2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a positive BT test.

In a similar manner, first, $V_{gs}$-$I_{ds}$ characteristics of the transistors were measured at a substrate temperature of 25° C. and $V_{ds}$ of 10 V. Then, the substrate temperature was set to 150° C. and $V_{ds}$ was set to 0.1 V. After that, $V_{gs}$ of −20 V was applied so that the intensity of an electric field applied to the gate insulating film was −2 MV/cm, and the condition was kept for one hour. Next, $V_{gs}$ was set to 0 V. Then, $V_{gs}$-$I_{ds}$ characteristics of the transistors were measured at a substrate temperature of 25° C. and $V_{ds}$ of 10 V. This process is called a negative BT test.

Figure 24A:
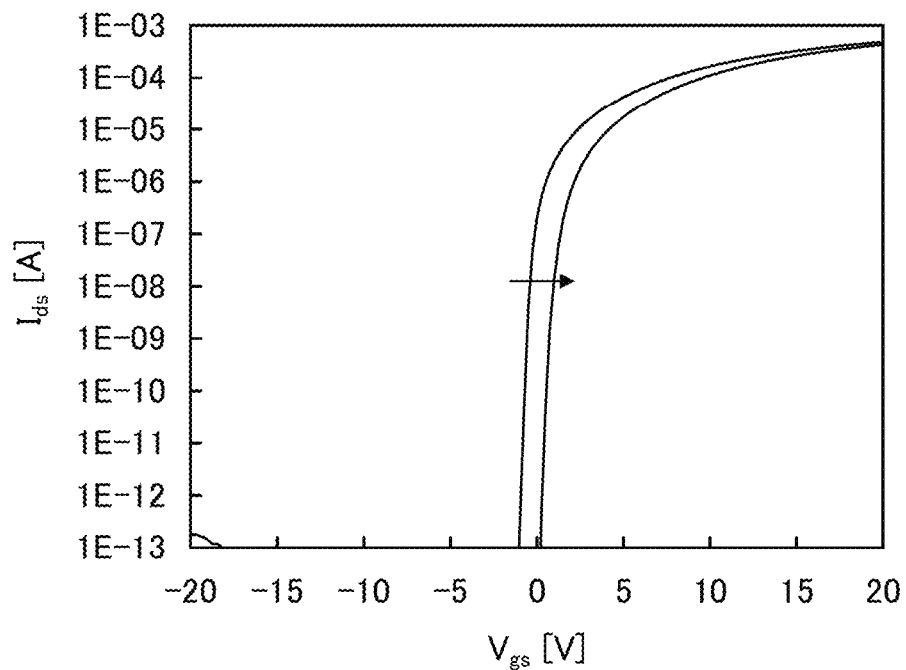
FIGS. 24A and 24B are graphs showing $V_{gs}$-$I_{ds}$ characteristics after a BT test of a transistor of Sample 1.
Figure 24B:
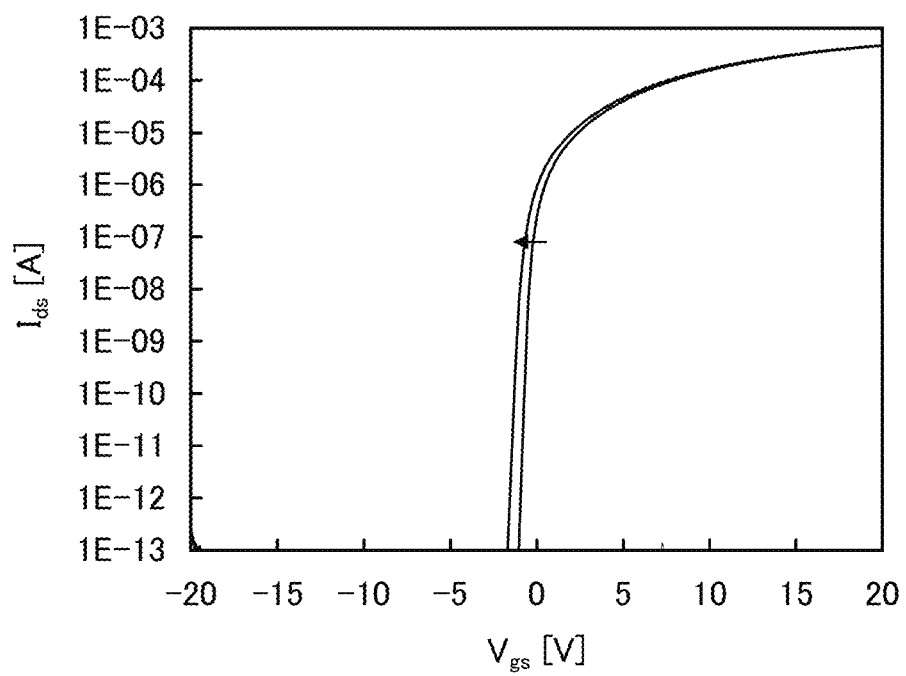
Figure 25A:
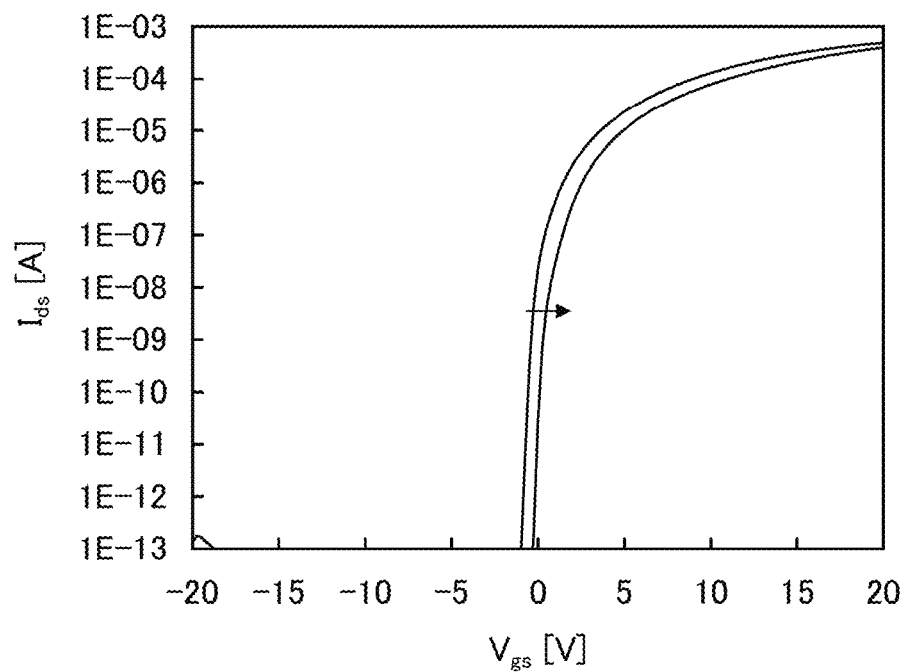
FIGS. 25A and 25B are graphs showing $V_{gs}$-$I_{ds}$ characteristics after a BT test of a transistor of Sample 2.
Figure 25B:
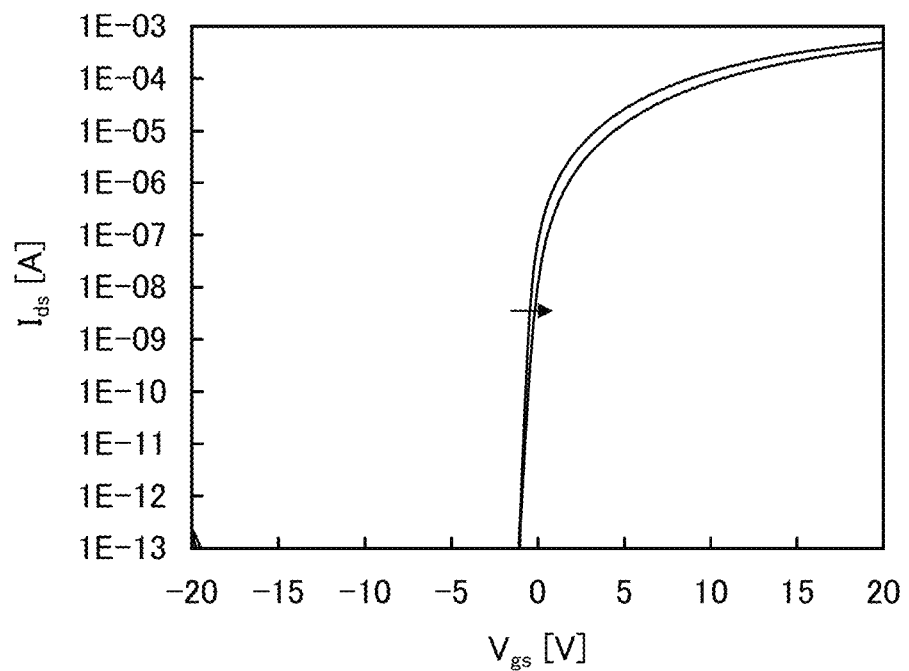

FIGS. 24A and 24B show results of the positive BT test and the negative BT test, respectively, of Sample 1. FIGS. 25A and 25B show results of the positive BT test and the negative BT test, respectively, of Sample 2.

The amount of shift in threshold voltage of Sample 1 due to the positive BT test and that due to the negative BT test were 1.80 V and −0.42 V, respectively. The amount of shift in threshold voltage of Sample 2 due to the positive BT test and that due to the negative BT test were 0.79 V and 0.76 V, respectively. It is found that, in each of Sample 1 and Sample 2, the amount of shift in threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a stacked film; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1\times10^{16}$/cm$^3$ to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 26:
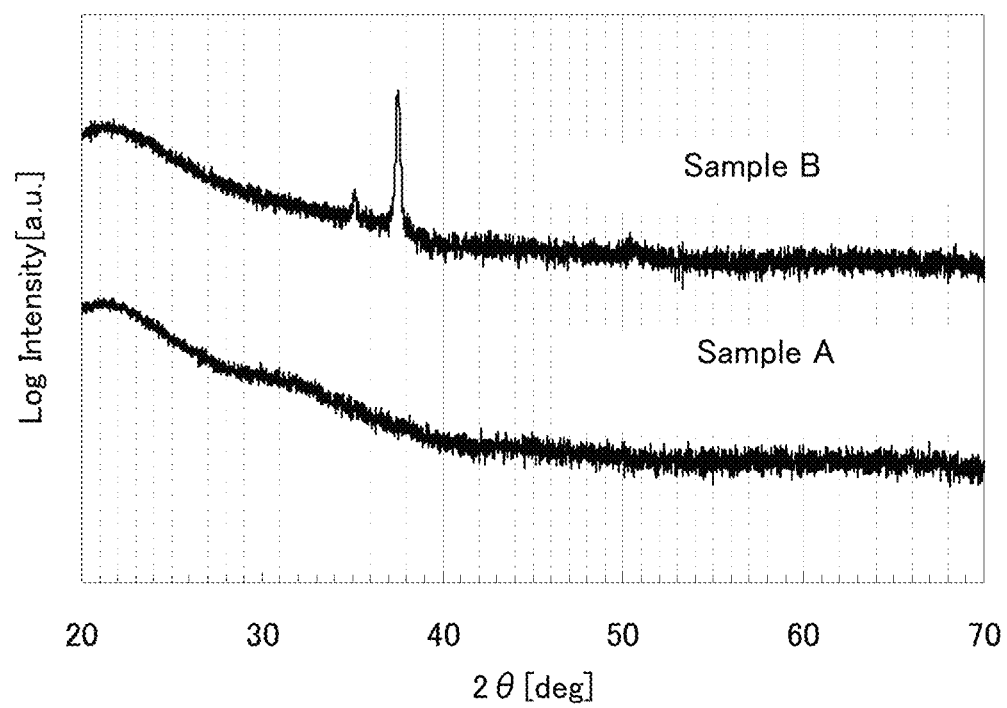
FIG. 26 shows XRD spectra of Sample A and Sample B.

FIG. 26 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 27:
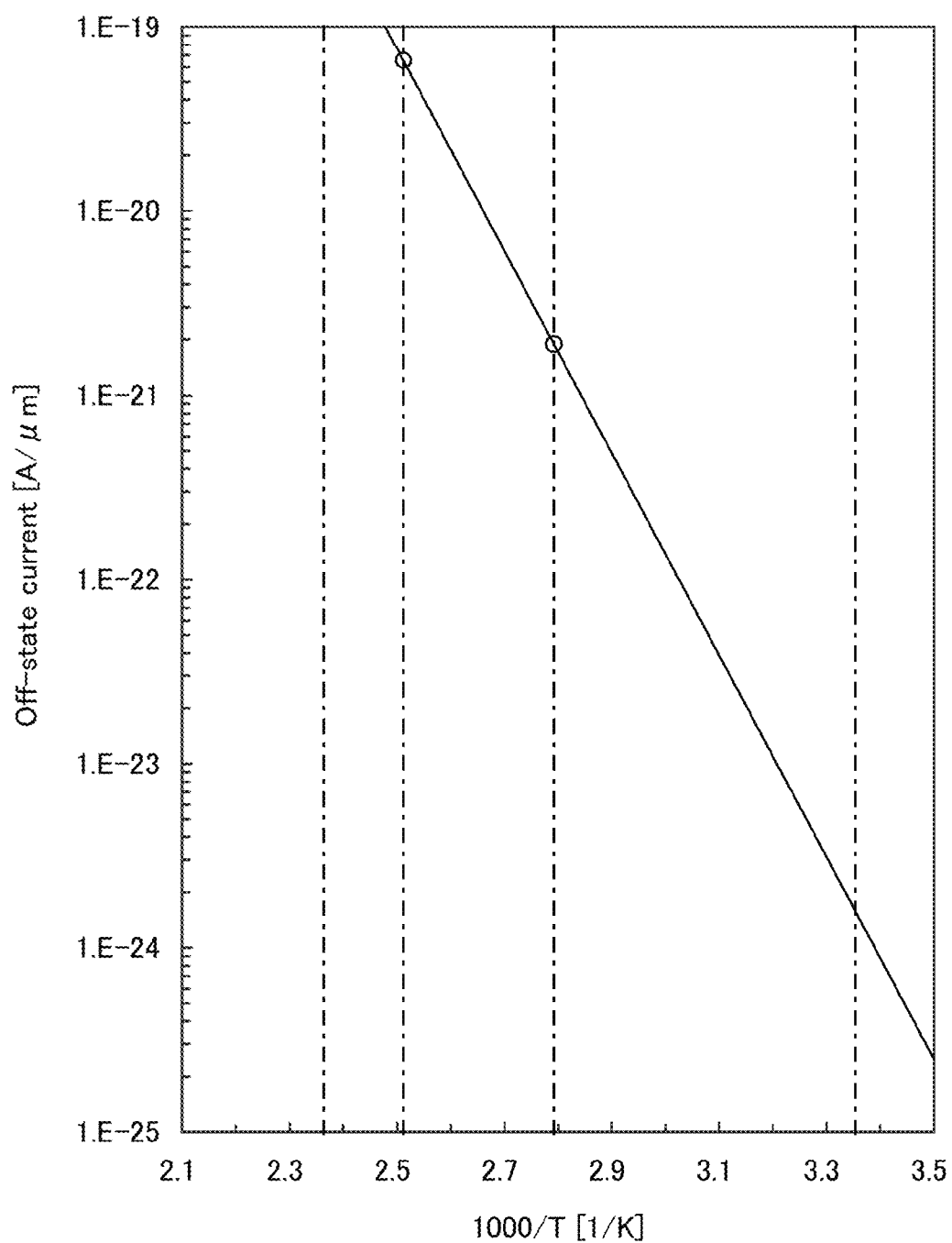
FIG. 27 is a graph showing a relation between off-state current and substrate temperature in measurement of a transistor.

FIG. 27 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 27, the off-state current can be 1 aA/μm ($1\times10^{-18}$ A/μm) or lower, 100 zA/μm ($1\times10^{-19}$ A/μm) or lower, and 1 zA/μm ($1\times10^{-21}$ A/μm) or lower when the substrate temperature is 125° C., 85° C., and room temperature (27° C.), respectively. Preferably, the off-state current can be 0.1 aA/μm ($1\times10^{-19}$ A/μm) or lower, 10 zA/μm ($1\times10^{-20}$ A/μm) or lower, and 0.1 zA/μm ($1\times10^{-22}$ A/μm) or lower at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as main components by heat treatment, a film which does not include moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electrical characteristics of a transistor using Sample B, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_{ds}$ was set to 10 V. Note that the substrate temperature was −40° C., −25° C., 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 28:
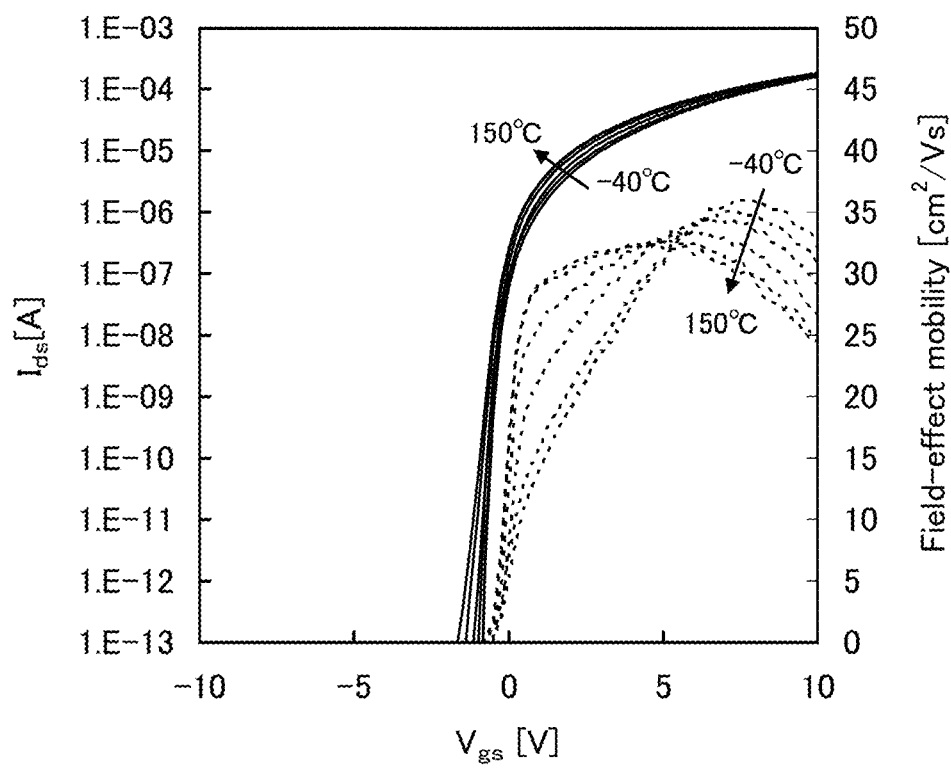
FIG. 28 is a graph showing $V_{gs}$ dependence of $I_{ds}$ and field-effect mobility.
Figure 29A:
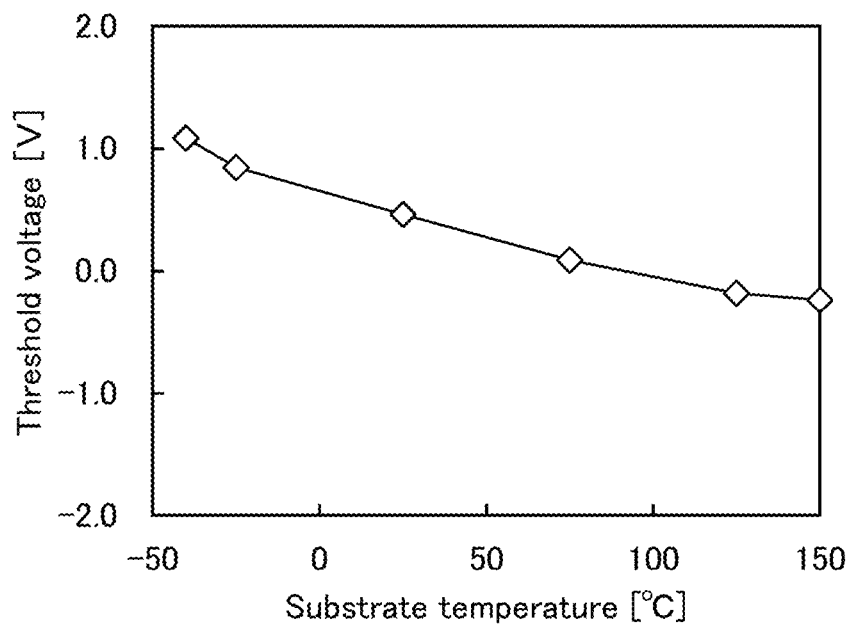
FIG. 29A is a graph showing a relation between substrate temperature and threshold voltage.

FIG. 28 shows the $V_{gs}$ dependence of $I_{ds}$ (a solid line) and field-effect mobility (a dotted line). FIG. 29A shows a relation between the substrate temperature and the threshold voltage, and FIG. 29B shows a relation between the substrate temperature and the field-effect mobility.

From FIG. 29A, it is found that the threshold voltage gets lower as the substrate temperature increases. Note that the threshold voltage is decreased from 1.09 V to −0.23 V in the range from −40° C. to 150° C.

Figure 29B:
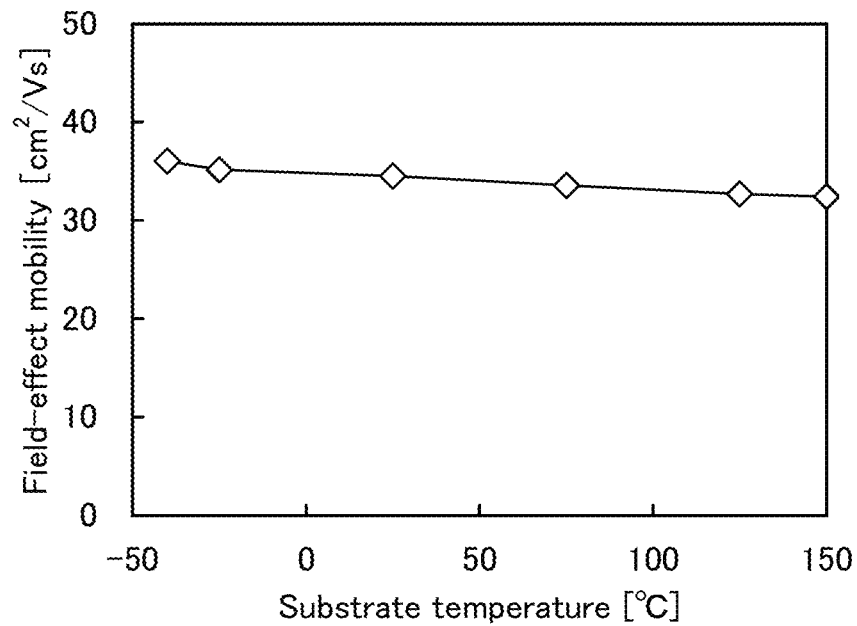
FIG. 29B is a graph showing a relation between substrate temperature and field-effect mobility.

From FIG. 29B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electrical characteristics is small in the above temperature range.

In a transistor in which such an oxide semiconductor containing In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/mm or lower, which can achieve on-state current needed for an LSI.

For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor. With such characteristics, an integrated circuit having a novel function can be realized without decreasing the operation speed even when a transistor including an oxide semiconductor is provided in an integrated circuit formed using a Si semiconductor.

Example

In this example, a photograph of a signal processing unit described in the above embodiment, a waveform diagram in which actually measured values were obtained at the time of stopping and restarting the supply of the power supply voltage, and specs of elements and signals will be described.

Figure 30:
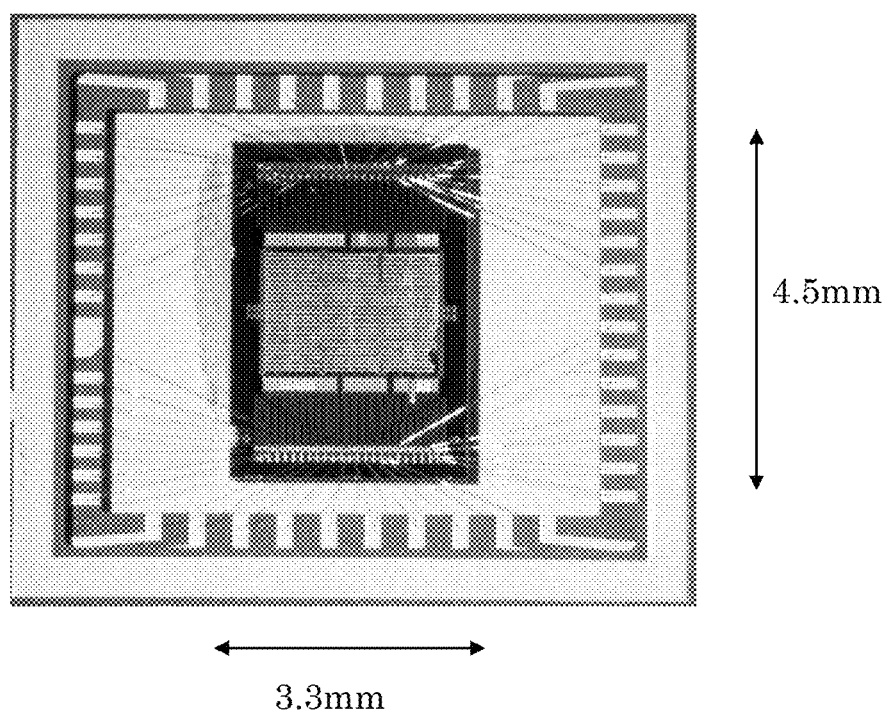
FIG. 30 is a photograph of a manufactured signal processing unit.

FIG. 30 is a photograph of a signal processing unit actually manufactured. The signal processing unit has a size of 4.5 mm long and 3.3 mm wide.

Figure 31:
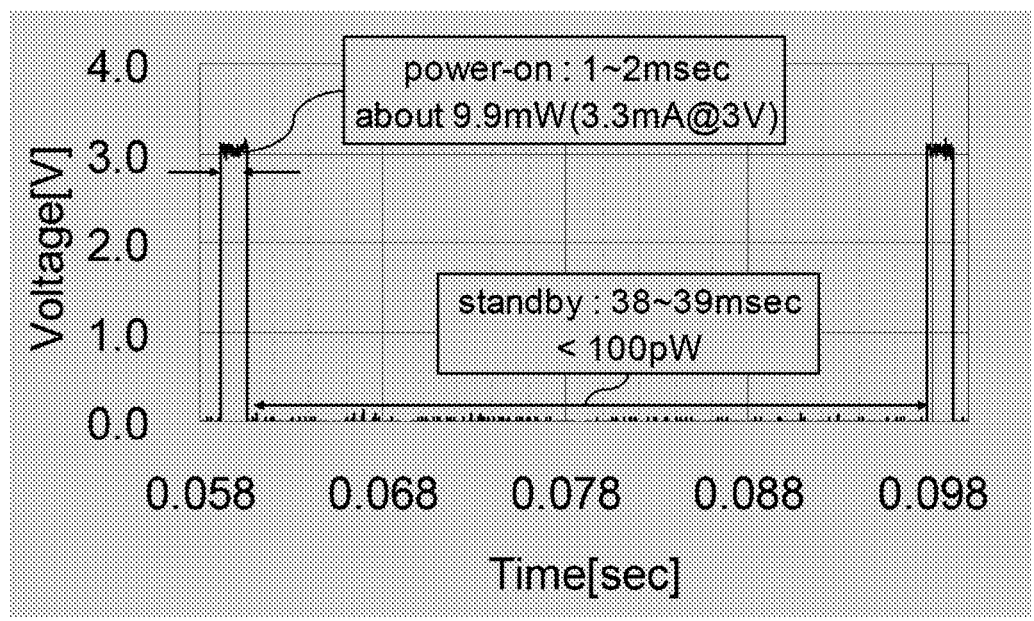
FIG. 31 shows a waveform at the time of supply and stop of supply of power supply voltage to a signal processing unit.

FIG. 31 is a graph where the horizontal axis represents a power supply period and a standby period of power supply voltage accompanied by stop and restart of the supply of the power supply voltage and the vertical axis represents voltage. As shown in FIG. 31, the consumed power was 9.9 mW in the case where a power supply voltage of 3 V was supplied for 1 microsecond to 2 microseconds; and the consumed power was lower than 100 pW in the case where a power supply voltage of 3 V was stopped for 38 microseconds to 39 microseconds.

Table 1 shows specs of elements and signals of the actually manufactured signal processing unit which includes a transistor (FET) in which a channel is formed in a silicon layer or a silicon substrate and a transistor (OS) including an oxide semiconductor layer.

TABLE 1

| Technology | FET | 0.8 μm |
| --- | --- | --- |
| | OS | 3.0 μm |
| Core size (W × H) | | 4.5 mm × 3.3 mm |
| Transister count | | 26k |
| Clk freq. | | 2.5 MHz |
| Architecture | | 8b CISC |
| Active | Voltage | 3.3 V |
| | Power | 9.9 mW |
| standby | Power | 100 pW |

As described above, in the actually manufactured signal processing unit, stop and restart of the supply of the power supply voltage are performed; thus, power consumption of the signal processing unit can be reduced.

This application is based on Japanese Patent Application serial no. 2011-053654 filed with Japan Patent Office on Mar. 11, 2011, and Japanese Patent Application serial no. 2011-108906 filed with Japan Patent Office on May 14, 2011, the entire contents of which are hereby incorporated by reference.

What is claimed is:

1. A signal processing unit comprising:
a volatile storage portion;
a first transistor;
a second transistor;
a first protective circuit;
a first wiring supplied with a first voltage;
a second wiring supplied with a second voltage;
a third wiring supplied with a clock signal; and
a fourth wiring supplied with a data signal,
wherein the volatile storage portion is electrically connected to the first wiring, the third wiring and the fourth wiring,
wherein the first protective circuit is electrically connected to the second wiring and the third wiring,
wherein one of a source and a drain of the first transistor is electrically connected to the volatile storage portion,
wherein the other of the source and the drain of the first transistor is electrically connected to a gate of the second transistor,
wherein one of a source and a drain of the second transistor is electrically connected to the volatile storage portion,
wherein a supply of the first voltage to the first wiring is stopped after a supply of the data signal to the fourth wiring is stopped,
wherein a supply of the clock signal to the third wiring is stopped after the supply of the first voltage to the first wiring is stopped, and
wherein a supply of the second voltage to the second wiring is stopped after the supply of the clock signal to the third wiring is stopped.

2. The signal processing unit according to claim 1, wherein the first transistor comprises a channel formation region comprising an oxide semiconductor.

3. The signal processing unit according to claim 1, wherein the second transistor comprises a channel formation region comprising silicon.

4. The signal processing unit according to claim 1, further comprising a capacitor,
wherein a first electrode of the capacitor is electrically connected to the gate of the second transistor.

5. The signal processing unit according to claim 1, wherein the first protective circuit comprises a diode-connected transistor.

6. The signal processing unit according to claim 1, further comprising a second protective circuit electrically connected to the second wiring and a gate of the first transistor.

7. The signal processing unit according to claim 1, further comprising a third protective circuit electrically connected to the second wiring and the fourth wiring.

8. The signal processing unit according to claim 1,
wherein the volatile storage portion comprises an analog switch, an inverter circuit, a selector circuit and a clocked inverter circuit,
wherein the fourth wiring is electrically connected to an input terminal of the inverter circuit through the analog switch,
wherein an output terminal of the inverter circuit is electrically connected to a first input terminal of the selector circuit,
wherein an output terminal of the selector circuit is electrically connected to an input terminal of the clocked inverter circuit,
wherein an output terminal of the clocked inverter circuit is electrically connected to the input terminal of the inverter circuit,
wherein a second input terminal of the selector circuit is electrically connected to the one of the source and the drain of the second transistor, and
wherein the other of the source and the drain of the first transistor is electrically connected to the output terminal of the selector circuit.

9. A method for driving a signal processing unit comprising a volatile storage portion, a first transistor, a second transistor, a protective circuit, a first wiring supplied with a first voltage, a second wiring supplied with a second voltage, a third wiring supplied with a clock signal and a fourth wiring supplied with a data signal, wherein the volatile storage portion is electrically connected to the first wiring, the third wiring and the fourth wiring, wherein the protective circuit is electrically connected to the second wiring and the third wiring, wherein one of a source and a drain of the first transistor is electrically connected to the volatile storage portion, wherein the other of the source and the drain of the first transistor is electrically connected to a gate of the second transistor, and wherein one of a source and a drain of the second transistor is electrically connected to the volatile storage portion, the method comprising the steps of:
stopping a supply of the data signal to the fourth wiring;
stopping a supply of the first voltage to the first wiring after the supply of the data signal to the fourth wiring is stopped;
stopping a supply of the clock signal to the third wiring after the supply of the first voltage to the first wiring is stopped; and
stopping a supply of the second voltage to the second wiring after the supply of the clock signal to the third wiring is stopped.

* * * * *